(12) United States Patent
Garmong

(10) Patent No.: US 7,688,595 B2
(45) Date of Patent: Mar. 30, 2010

(54) SHIELDED CABLE ENTRY PORTS AND ASSEMBLIES

(75) Inventor: Victor H. Garmong, Kennerdell, PA (US)

(73) Assignee: Pioneer Energy Products, LLC, Franklin, PA (US)

( * ) Notice: Subject to any disclaimer, the term of this patent is extended or adjusted under 35 U.S.C. 154(b) by 1045 days.

(21) Appl. No.: 11/238,429

(22) Filed: Sep. 29, 2005

(65) Prior Publication Data

US 2006/0021784 A1 Feb. 2, 2006

Related U.S. Application Data

(63) Continuation-in-part of application No. 10/098,006, filed on Mar. 13, 2002, now Pat. No. 7,046,521.

(51) Int. Cl.
*H05K 7/14* (2006.01)
*H05K 7/18* (2006.01)

(52) U.S. Cl. .................................. 361/752; 361/799

(58) Field of Classification Search ............... 361/825, 361/826; 174/35 R, 51; 439/589, 607.41, 439/607.44, 607.28, DIG. 939
See application file for complete search history.

(56) References Cited

U.S. PATENT DOCUMENTS

| | | | |
|---|---|---|---|
| 3,440,659 A | | 4/1969 | Kreitzberg |
| 3,873,135 A | | 3/1975 | Kreitzberg |
| 4,135,776 A | * | 1/1979 | Ailawadhi et al. .......... 439/583 |
| 4,173,385 A | * | 11/1979 | Fenn et al. ................. 439/277 |
| 4,460,895 A | | 7/1984 | Bert et al. |
| 4,651,099 A | | 3/1987 | Vinegar et al. |
| 4,709,120 A | | 11/1987 | Pearson |
| 4,755,630 A | | 7/1988 | Smith et al. |
| 4,806,703 A | | 2/1989 | Sims |
| 5,137,471 A | * | 8/1992 | Verespej et al. ............ 439/585 |
| 5,235,133 A | | 8/1993 | Roth et al. |
| 5,315,794 A | | 5/1994 | Pearson |
| 5,401,901 A | | 3/1995 | Gerry et al. |
| 5,442,140 A | * | 8/1995 | McGrane .................... 174/151 |
| 5,452,550 A | | 9/1995 | Vanesky et al. |

(Continued)

FOREIGN PATENT DOCUMENTS

WO   WO 01/77538 A1   10/2001

OTHER PUBLICATIONS

Testing results prepared for Pioneer Energy Products, LLC for the "Testing of Cable Entrance Glands," test date Jun. 13, 2005, document No. LT-05-2526A, Revision A dated Sep. 23, 2005 (27 pages).

(Continued)

*Primary Examiner*—Hung S Bui
(74) *Attorney, Agent, or Firm*—K&L Gates LLP

(57) ABSTRACT

Various cable entry port assemblies are disclosed. One embodiment includes a single boot assembly for supporting one power cable. Another embodiment includes two or more boot assemblies supported along a horizontal axis. Other embodiments include at least two boot assemblies supported along a vertically extending axis to form a column of boot assemblies. Another embodiment includes at least one column of boot assemblies and at least one row of boot assemblies. Methods for reducing an amount of interference traveling on a cable from one component located outside of a structure to another component located within the structure are also disclosed.

17 Claims, 41 Drawing Sheets

U.S. PATENT DOCUMENTS

| | | | |
|---|---|---|---|
| 5,487,247 | A | 1/1996 | Pigg |
| 5,522,194 | A | 6/1996 | Graulich |
| 5,545,844 | A | 8/1996 | Plummer, III et al. |
| 5,560,150 | A | 10/1996 | Pearson |
| 5,603,196 | A | 2/1997 | Sohlstrom |
| 5,749,178 | A | 5/1998 | Garmong |
| 5,966,104 | A | 10/1999 | Massey et al. |
| 6,204,824 | B1 | 3/2001 | Davi et al. |
| 6,236,551 | B1 * | 5/2001 | Jones et al. ............. 361/119 |
| 6,320,123 | B1 | 11/2001 | Reimers |
| 6,331,123 | B1 * | 12/2001 | Rodrigues ............. 439/584 |
| 6,692,299 | B1 * | 2/2004 | Stockmaster ............. 439/578 |
| 6,695,158 | B2 | 2/2004 | Taylor et al. |
| 6,887,105 | B2 * | 5/2005 | Knighten et al. ....... 439/607.24 |
| 7,046,521 | B2 | 5/2006 | Garmong |
| 7,207,838 | B2 * | 4/2007 | Andreescu ............. 439/583 |
| 7,299,550 | B2 * | 11/2007 | Montena ............. 29/857 |
| 2007/0002547 | A1 | 1/2007 | Garmong |

OTHER PUBLICATIONS

Restriction Requirement issued on Jan. 6, 2004 in U.S. Appl. No. 10/098,006.
Restriction Requirement issued on May 5, 2004 in U.S. Appl. No. 10/098,006.
Non-Final Rejection issued on Aug. 2, 2004 in U.S. Appl. No. 10/098,006.
Non-Final Rejection issued on Apr. 22, 2005 in U.S. Appl. No. 10/098,006.
Final Rejection issued on Oct. 6, 2005 in U.S. Appl. No. 10/098,006.
Notice of Allowance issued on Mar. 1, 2006 in U.S. Appl. No. 10/098,006.
Restriction Requirement issued on Dec. 14, 2005 in U.S. Appl. No. 10/699,998.
Non-Final Rejection issued on Apr. 5, 2006 in U.S. Appl. No. 10/699,998.
Non-Final Rejection issued on Sep. 25, 2006 in U.S. Appl. No. 10/699,998.
Final Rejection issued on Jan. 23, 2007 in U.S. Appl. No. 10/699,998.
Advisory Action issued on Mar. 27, 2007 in U.S. Appl. No. 10/699,998.
Non-Final Rejection issued on Jul. 13, 2007 in U.S. Appl. No. 10/699,998.
Final Rejection issued on Nov. 28, 2007 in U.S. Appl. No. 10/699,998.
Notice of Allowance issued on Apr. 2, 2008 in U.S. Appl. No. 10/699,998.
Supplemental Notice of Allowability issued on Apr. 22, 2008 in U.S. Appl. No. 10/699,998.
U.S. Appl. No. 11/699,998, filed Nov. 3, 2003, Garmong.
"Lightning/EMP", Catalog, PolyPhaser Corp., Oct. 20, 1995.
"Striking News", Newsletter, PolyPhaser Corp.,Nov. 1995.
"Structoglas", brochure, sequentia inc., Feb. 1995.
"N Connectors", Installaton Instructions, Andrew Corp., 2000.
Alloy Data- Hypernom Alloy, Carpenter Technology Corporation, at least as early as Mar. 26, 1996.
5 pages of Uni-screw Brochure, published by BRTW5 British Technology Worldwide, Berkshire, United Kingdom, Publication date believed to be before Mar. 13, 2002.

* cited by examiner

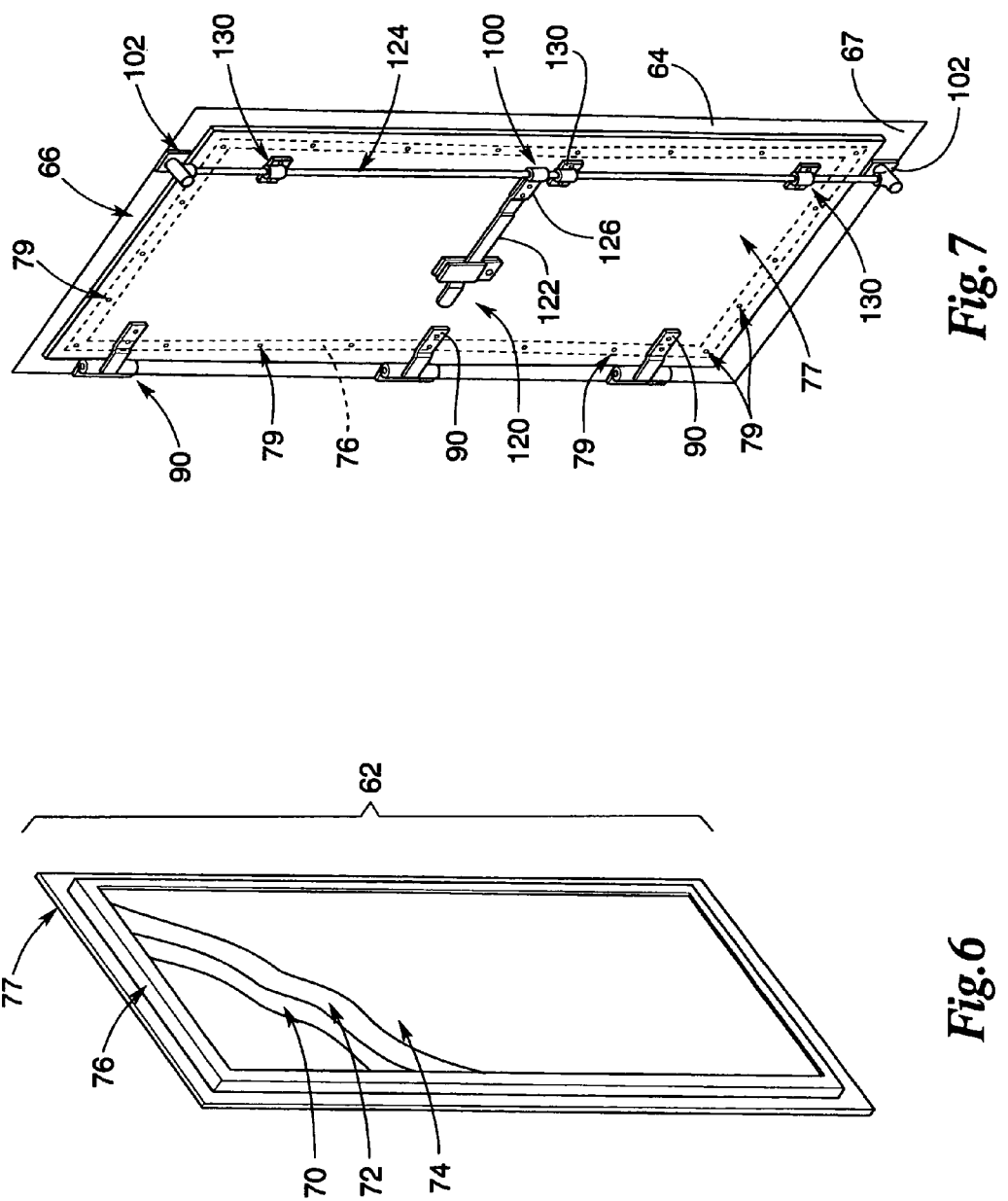

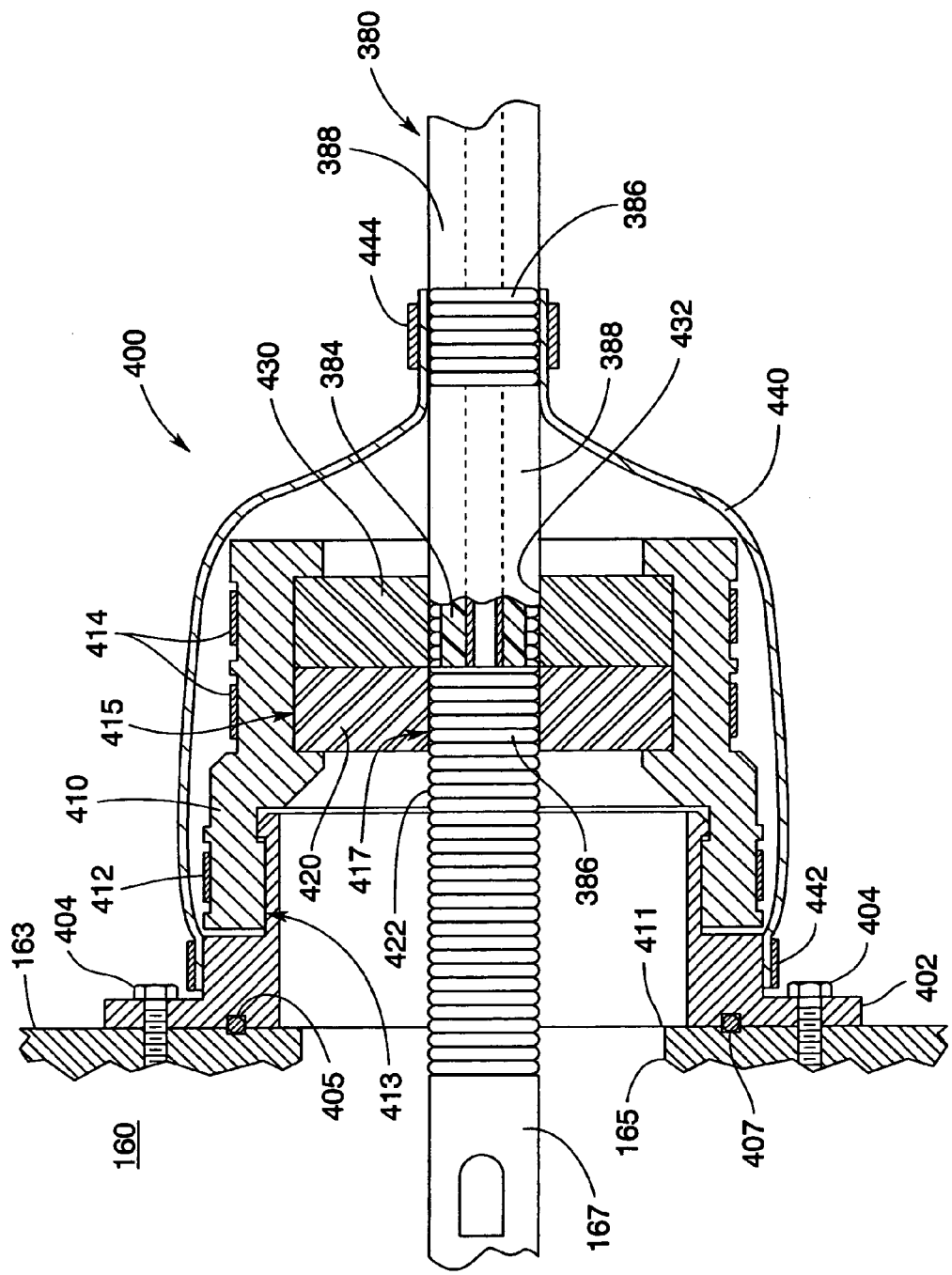

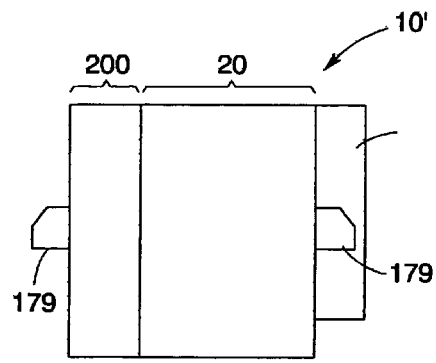
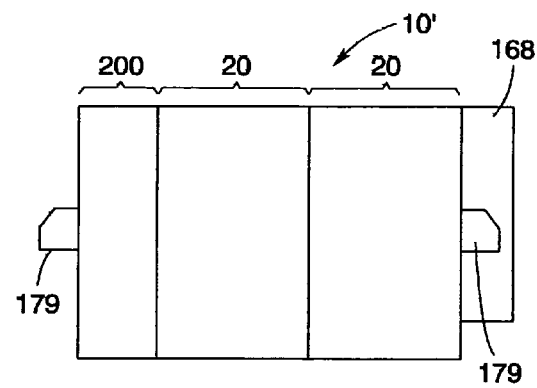
Fig.27A       Fig.27B
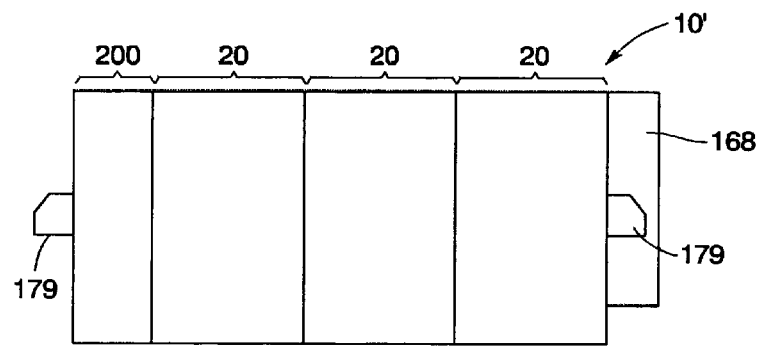
Fig.27C
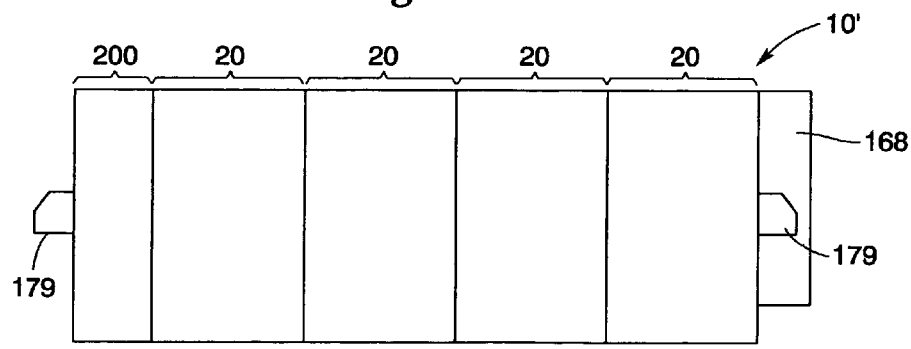
Fig.27D

SHIELDED CABLE ENTRY PORTS AND ASSEMBLIES

CROSS-REFERENCE TO RELATED APPLICATION

This application is a continuation-in-part application of U.S. patent application Ser. No. 10/098,006, filed on Mar. 13, 2002, entitled "Enclosure With Shielded Power Compartment and Methods of Shielding Enclosures", now U.S. Pat. No. 7,046,521, issued May 16, 2006, the disclosure of which is herein incorporated by reference in its entirety.

BACKGROUND OF THE INVENTION

1. Field of the Invention

The invention relates to shielded enclosures and, more particularly, is directed to enclosures, cable entry ports and assemblies and methods for protecting electrical and electronic equipment from damage caused by electromagnetic fields created by lightning strikes and other electrical or electronic equipment or sabotage.

2. Description of the Invention Background

Perhaps when one thinks of the discovery of electricity, various depictions of Benjamin Franklin flying his infamous kite in a lightning storm come to mind. While history is somewhat ambiguous as to exactly what role Franklin's observation of lightning played in the discovery of electricity and the subsequent invention of the myriad of electronic devices that we use in our every day life, man still struggles to harness and control its power.

A lightning strike starts with a "local" electrical breakdown of the atmosphere. Typically, the lightning "steps down" toward the earth about 150 feet in one micro-second time increments every 49 micro-seconds. During each of the 49 micro-second dormant stages, an imaginary hemisphere having a radius of 150 feet can be used to determine the next jumping distance. Any object such as a tower, building, tree, etc. which penetrates this hemisphere, can be chosen as the point of attachment for the return stroke (i.e., the lightning strike).

When lightning strikes an object, it generally takes the path of least resistance to the ground and, if that path happens to pass through a circuit that includes electrical/electronic components incapable of accommodating such a surge of electrical current, those components may be damaged or destroyed. For example, many people have had electrical devices such as televisions, VCRs, computers, etc. damaged by a lightning strike or probably know someone that has experienced such damage.

Over the years, a variety of different devices and methods have been developed to prevent electrical component damage caused by a lightning strike. Examples of such devices are fuses, circuit breakers, surge protectors, etc. Another device commonly used to protect electronic equipment from lightning strike damage is known as a lightning arrester which reduces excessive voltage resulting from lightning to a safe level by "grounding" the discharge.

"Ground" is the term used to describe the common connection in an electrical or electronic circuit. The common connection for electronic circuits is almost always ultimately routed to the earth. The earth is a fair to good conductor of electricity depending upon the characteristics of the soil. A ground connection is the electrical contact between the common point of an electrical or electronic system and the earth. Effective grounding systems typically include one or more ground rods driven into the soil to a depth of 6 to 8 feet. Other common grounding methods involve establishing a ground connection with a structure's cold water pipe. Thus, some circuit protection apparatuses and methods serve to provide a deliberate and controlled path for the electrical energy resulting from a lightning strike to return to ground.

While the above-mentioned apparatuses and practices serve to protect electrical components from surges of electrical energy caused by lightning strikes, lightning can cause other problems which require different solutions. For example, as the electromagnetic field, created by a "nearby" lightning strike passes through electrical/electronic components, voltages and/or currents are generated that may cause permanent damage to the components. In the past, to protect electrical/electronic components from such damage, each individual component was housed within its own enclosure fabricated from a material that is capable of attenuating electromagnetic effects by providing a low-reluctance path for magnetic lines of force and a closed conductive shell for electric lines of force. Because such material can be relatively expensive, the ability to protect numerous components with their own individual enclosures can be cost prohibitive. Also, in some cases, a single shield will reach saturation magnetization because of high-flux density magnetic fields, which reduces the effectiveness of the shield. That problem has been addressed by increasing the thickness of the shield material or by nesting a number of thinner shields together. Either method, however, can be very expensive when numerous electrical/electronic components must be shielded.

Perhaps the industry that has been most plagued with problems associated with lightning strikes is the natural gas industry. Today, the natural gas industry typically utilizes very sophisticated electronic equipment for monitoring and recording the output of gas wells and the purchase and resale of natural gas in the transmission and distribution systems. Usually such equipment is housed within an enclosure or building at the well site or pipeline. In remote locations, such equipment may communicate, via satellite, with computers and other equipment located at the gas company's offices.

In the past, gas companies have enclosed their gas well and pipeline equipment in makeshift buildings fabricated from various materials such as, for example, fiberglass, plastic, cement blocks, corrugated steel, etc. All of those materials generally have poor grounding capabilities in addition to various other shortcomings. For example, while buildings and enclosures fabricated from plastic and/or fiberglass do not experience corrosion problems and are generally easy to erect and transport, they are susceptible to pest and vermin damage. Such enclosures also fail to shield equipment from electromagnetic fields. Likewise, while enclosures fabricated from concrete blocks are generally impervious to vermin and pests, they are difficult to transport and usually must be constructed on site. Such buildings also offer little protection from electromagnetic fields. Enclosures and buildings fabricated from corrugated steel are generally easy to erect, but are susceptible to corrosion and vermin damage while providing little protection from electromagnetic fields.

The problems associated with lightning strikes and the electrical/electronic component damage caused by the electrical and magnetic energy created thereby are not unique to the natural gas industry, however. These problems are encountered in a variety of other industries and applications where electrical/electronic components are susceptible to lightning damage. U.S. Pat. No. 5,749,178 discloses a shielded enclosure that solves many of such problems.

Also, electronic equipment that is vital to an area's telecommunication and utility services may be susceptible to radio frequency and electromagnetic interference caused by adjacent equipment or even caused by sabotage if it is unshielded.

In addition, microprocessor based equipment such as variable frequency drives and computer controlled equipment used within manufacturing plants may be susceptible to such electromagnetic interference.

All of the problems discussed above resulting from electrical or electromagnetic interference may, at one time or another, potentially detrimentally affect electronic equipment regardless of whether the equipment is housed in a building or other structure. If the structure has power cables entering it, those power cables provide convenient avenues for electronic or electromagnetic interference caused by lightening strikes or other external sources to enter the building or structure to detrimentally affect the electronic equipment therein. While some power cable entry port arrangements have been developed in an effort to transport unwanted electricity flowing on entry cables to ground, such prior ports still permit large amounts of such unwanted electricity to enter the structure on the cables. For example, some prior attempts to prevent electrical current resulting from a lightning strike from entering an enclosure on the power cable involved clamping or otherwise attaching a groundwire to the conductor within the cable. However, such approaches still permit significant amounts of current to enter the building or enclosure on the cable.

Thus, there is a need for shielded enclosures that are economical to manufacture and use to prevent equipment from damage caused by electromagnetic fields be it naturally or artificially generated.

There are further needs for cable entry ports and assemblies that are more effective than prior cable entry port arrangements for preventing unwanted electricity caused by lightening strikes and other external sources from entering a building, structure, enclosure, etc. on the cables that enter such buildings, structures and enclosures.

SUMMARY

One embodiment of the invention comprises apparatus for housing electrically powered components. The apparatus may include a grounded shell that has a plurality of exterior wall portions and that houses the electrically powered components therein. The shell may be fabricated from electrically conductive material. The apparatus may further include an enclosure that has a common exterior wall portion with the shell. The common exterior wall portion may be lined with a magnetic shield material. In addition, at least one power supply cable may enter the enclosure through the common exterior wall portion and the magnetic shield material.

Another embodiment of the present invention may comprise an enclosure for housing electrically powered components that includes a grounded shell for housing the electrically powered components therein. The shell may have a plurality of walls fabricated from an electrically conductive material and wherein at least one, but less than all, of the walls have a magnetic shield material supported in a coplanar orientation adjacent to at least a portion thereof. This embodiment may also include at least one power supply cable that enters the shell through one of the walls and the magnetic shield material oriented adjacent thereto.

Another embodiment of the present invention may comprise apparatus for housing electrically powered components that includes a shell formed from a plurality of exterior electrically conductive wall portions and that houses the electrically powered components therein. The shell may have at least one door opening and a corresponding door attached thereto. Each door may be fabricated from electrically conductive material and be selectively pivotable between a closed position wherein the door achieves a RFI/EMI seal with the shell and open positions. The door may be provided with electromagnetic shielding material if desired and include an adjustable door latch assembly for retaining the door in sealing engagement with the shell when the door is in the closed position. In addition, an enclosure that has a common exterior wall portion with the shell may also be included. The enclosure may be lined with magnetic shield material and have at least one door opening therein. A door corresponds to each door opening in the enclosure and may be fabricated from electrically conductive material. The door may be selectively pivotable between a closed position wherein the door achieves a RFI/EMI seal with the enclosure and open positions. The door may have a door latch assembly attached thereto for retaining the door in sealing engagement with the enclosure when the door is in the closed position. This embodiment may further include at least one cable entry port through a portion of the enclosure and at least one power cable that extends through the cable entry port into the enclosure and in communication with at least one power filter in the enclosure. At least one of the power filters communicates with at least one of the electrical powered components within the shell.

Yet another embodiment of the present invention may comprise apparatus for housing electrically powered components and include an equipment module that is fabricated from electrically conductive material and that houses the electrically powered components therein. This embodiment may also include a power module that is fabricated from electrically conductive material and that is attached to the equipment module. The power module may have a plurality of walls wherein at least one wall is lined with magnetic shield material. At least one power supply cable may enter the power module and be coupled to at least one power terminal block in one of the walls lined with magnetic shield material. At least one other cable may be attached to the terminal block and at least one of the electrically powered components supported within the equipment module.

Still another embodiment of the present invention may comprise apparatus for housing electrically powered components that includes an electrically grounded equipment module that houses the electrically powered components therein. The equipment module may comprise an equipment module frame assembly fabricated from a plurality of first cornerblocks that are attached to a plurality of first side members. The first side members may be hollow and be sized to be slidably inserted onto first attachment posts protruding from corresponding first cornerblocks. A plurality of equipment module walls may be attached to the equipment module frame assembly, wherein at least one of the equipment module walls has a door entry therein. An equipment module roof and an equipment module floor may also be attached to the equipment module frame assembly. This embodiment of the present invention may also have a power module that is attached to the equipment module housing. The equipment module may comprise a power module frame assembly that is fabricated from a plurality of second cornerblocks that are attached to a plurality of second side members. The second side members may comprise hollow tubing members that are sized to be slidably inserted onto second attachment posts protruding from corresponding second cornerblocks. At least some of the side members that form an end of the power module frame assembly may be clamped to corresponding first side members that form an end of the equipment frame assembly. In addition, a plurality of power module walls may be attached to the power module frame assembly, wherein at least one of the walls is lined with magnetic shield material and wherein at least one wall has a power module door entry therein. A power module roof and a power module floor may be attached to the power module frame assembly. At least one power supply cable may enter the power module and be coupled to at least one terminal block in one of the walls that are lined with magnetic shield material. At least one other cable may be attached to the terminal block and at least one of the electrically powered components.

Another embodiment of the present invention may comprise an entry port for supporting a cable that has an outer shield conductor that is covered by a sheath. The entry port may include an attachment flange that has a boot assembly coupled thereto. A first shield member may be supported within the boot assembly to contact an exposed portion of the outer shield conductor of the cable. A second shield member may be supported within the boot assembly to contact a portion of the sheath of the cable.

Still another embodiment of the present invention may comprise a conduit coupling attached to a shielded enclosure for permitting a conduit to enter therein. The conduit may be welded clamped or bolted onto the enclosure and may be fabricated from aluminum.

Another embodiment of the present invention comprises a cable entry port assembly for attachment to the wall of a structure. One embodiment comprises an entry plate that has at least one cable entry hole therethrough and at least one mounting flange wherein each mounting flange corresponds to one of the cable entry holes. The cable entry port assembly further includes a boot assembly that corresponds to each of the mounting flanges and is attached thereto. A first retainer shield is support by the boot assembly and has a first cable receiving hole therethrough. A grounding assembly is attached to the entry plate.

Another embodiment of the present invention comprises a cable entry port assembly that includes an entry plate that is manufactured from a first metal material. The cable entry plate has at least two cable entry holes therethrough that are aligned along a horizontal axis. A boot assembly corresponds to each cable entry hole and is attached to the cable entry plate. A first retainer shield corresponds to each of the boot assemblies and is supported therein. Each first retainer shield has a cable receiving hole therethrough and is manufactured from a non-metal material with portions of the first metal material therein. A second retainer shield corresponds to each of the boot assemblies and is supported thereby. Each of the second retainer shields is manufactured from a non-metal material. A cable corresponds to each boot assembly and extends therethrough. Each of the cables have an outer shield conductor that is manufactured from an electrically conductive material and extends through the cable-receiving holes in the first and second retainer shields located in the corresponding boot assembly. At least one shield strap that corresponds to each boot assembly is attached to the outer shield conductor of the corresponding cable and entry plate. The cable entry port assembly further includes at least one grounding rod assembly and at least one grounding strap that corresponds to each boot assembly. Each grounding strap is attached to at least one of the grounding rod assemblies.

Another embodiment of the present invention comprises a cable entry port assembly that includes an entry plate that is manufactured from a first metal material and that has at least two cable entry holes therethrough that are aligned along a vertical axis to form a column of entry holes. A boot assembly corresponds to each cable entry hole and is attached to the entry plate. A first retainer shield corresponds to each of the boot assemblies and is supported therein. Each first retainer shield has a cable receiving hole therethrough and is manufactured from a non-metal material with portions of the first metal material therein. A second retainer shield corresponds to each boot assembly and is supported thereby. Each second retainer shield is manufactured from a non-metal material. A cable corresponds to each boot assembly and extends therethrough. Each cable has an outer shield conductor manufactured from an electrically conductive material. Each core portion has a circumference. Each cable extends through the cable-receiving holes in the first and second retainer shields in the corresponding boot assembly. At least one shield strap corresponds to each cable. The shield straps are attached to the outer shield conductor of the corresponding cable and the entry plate. The cable entry port assembly of this embodiment further includes at least one grounding rod assembly and at least one grounding strap that corresponds to each column of cable entry holes and boot assemblies corresponding thereto. Each grounding strap has a width such that the sum of the widths of the grounding straps that correspond to the column of boot assemblies is substantially greater than or equal to a sum of the circumferences of the outer shield conductors of the cables extending through the boot assemblies in the corresponding column of boot assemblies. Each grounding strap is attached to at least one of the grounding rod assemblies.

Another embodiment of the present invention comprises a method for reducing an amount of interference traveling on a cable extending from one component located outside of a structure to another component located within the structure, wherein the cable has an outer shield conductor covered by a sheath. One version of the method includes forming a cable-receiving opening in an exterior wall of the structure and affixing an attachment flange to the exterior wall portion in registration with the cable-receiving opening. The method also includes affixing a conductive boot assembly to the attachment flange wherein the conductive boot assembly contains an electrically conductive first shield retainer therein. The method also includes removing a portion of the cable sheath to expose a portion of the outer shield conductor of the cable and passing the cable through the conductive boot assembly, attachment flange and cable receiving opening, such that the first retainer shield contacts exposed portion of the outer shield conductor of the cable. The method further includes grounding the attachment flange.

BRIEF DESCRIPTION OF THE DRAWINGS

In the accompanying Figures, there are shown present embodiments of the invention wherein like reference numerals are employed to designate like parts and wherein:

FIG. 6 is a perspective interior view of one door embodiment of the present invention;

FIG. 7 is a perspective exterior view of the door of FIG. 6;

FIG. 25A is a cross-sectional view of another cable port embodiment of the subject invention;

FIG. 27A is a diagrammatic side elevational view of another enclosure embodiment of the present invention;

FIG. 27B is a diagrammatic side elevational view of another enclosure embodiment of the present invention;

FIG. 27C is a diagrammatic side elevational view of another enclosure embodiment of the present invention;

FIG. 27D is a diagrammatic side elevational view of another enclosure embodiment of the present invention;

DETAILED DESCRIPTION OF THE INVENTION

Figure 1:
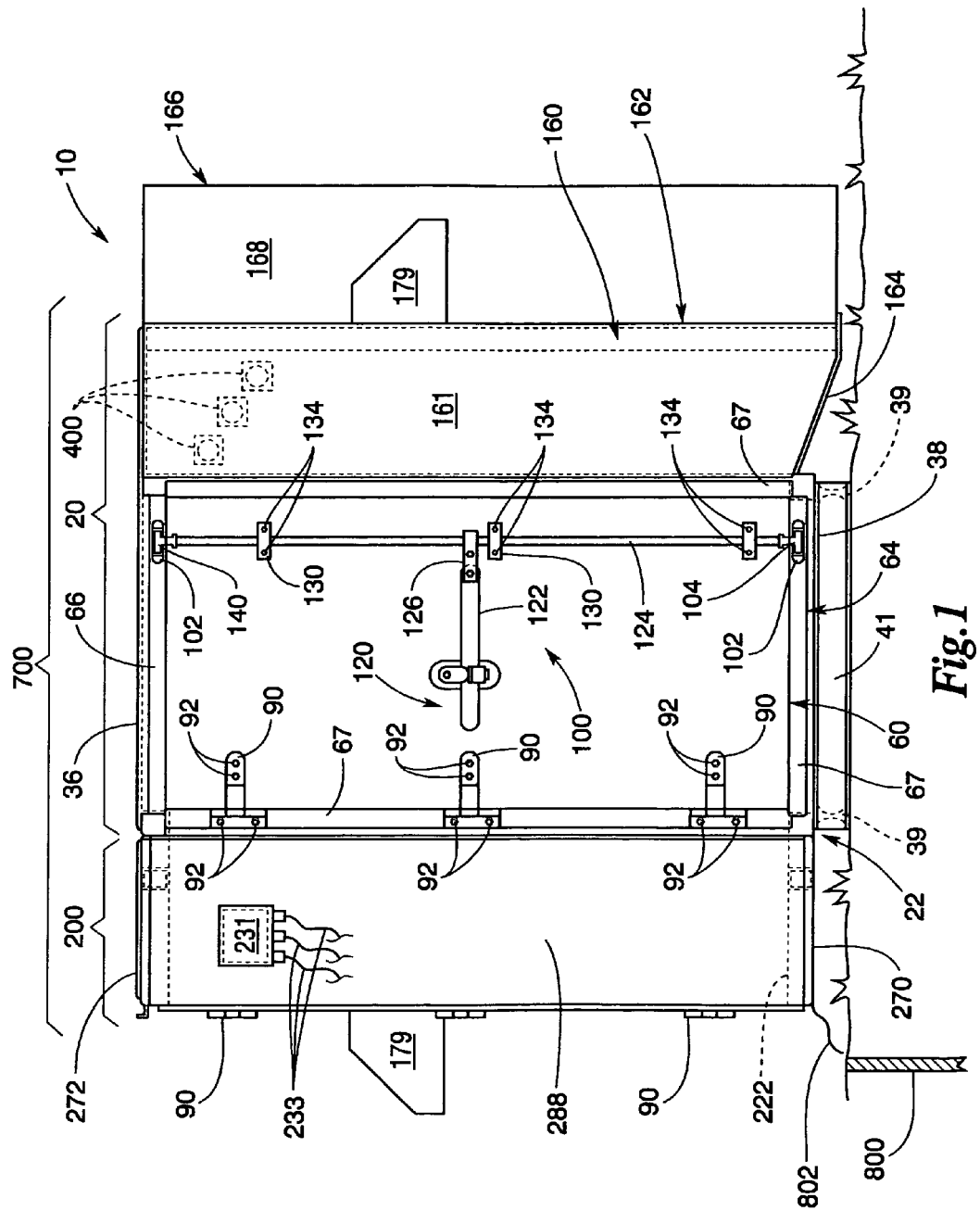
FIG. 1 is a side elevational view of one embodiment of an enclosure of the present invention.
Figure 2:
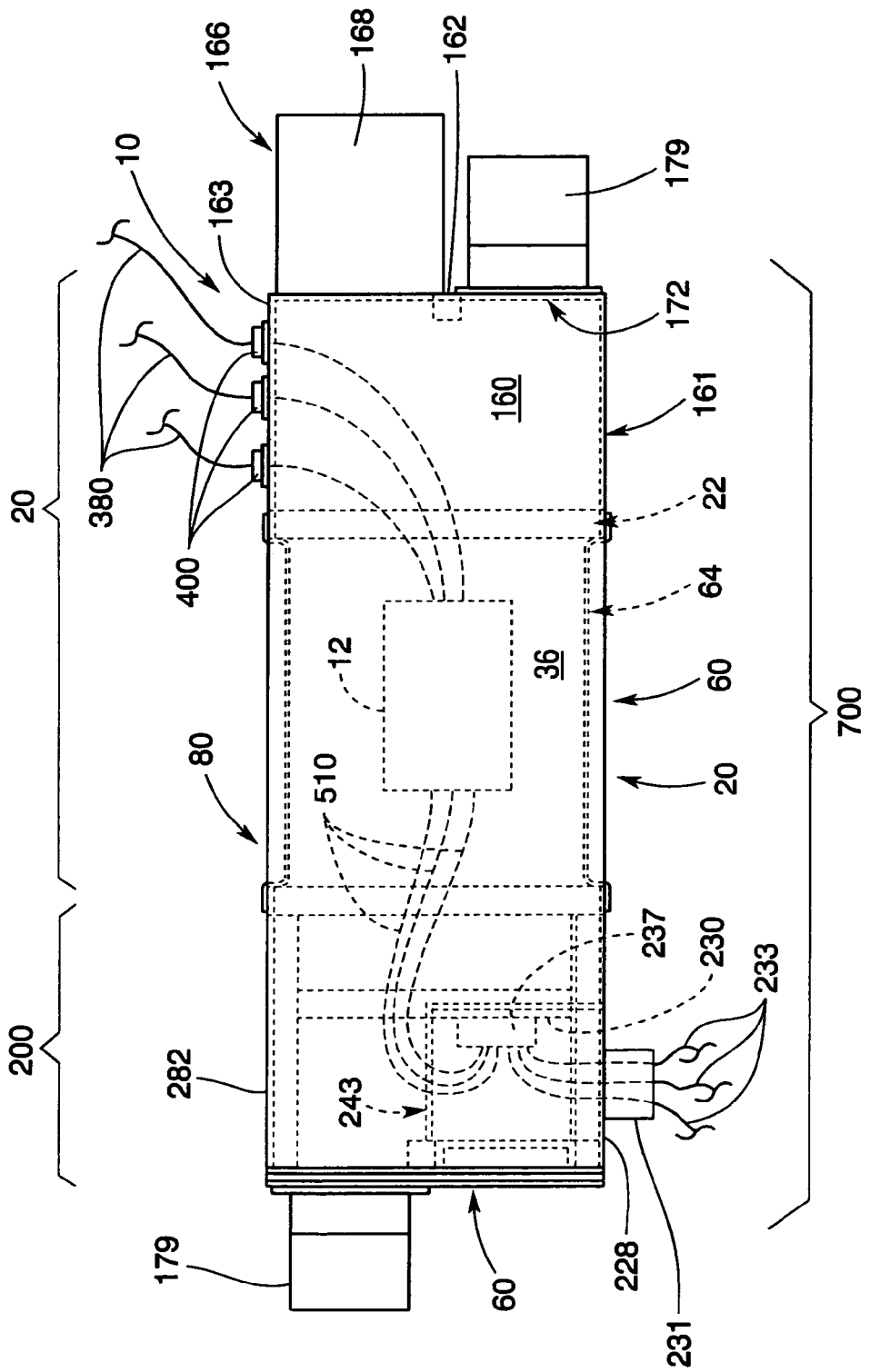
FIG. 2 is a top view of the enclosure depicted in FIG. 1.

Referring now to the drawings for the purposes of illustrating embodiments of the invention only and not for purposes of limiting the same, FIGS. 1 and 2 show one embodiment of a building enclosure generally designated as 10 that is adapted to house various types of electrical and other equipment 12 therein. Such equipment could comprise, for example, computers, transmitters, electronic meters, recorders, receivers, cellular telephone equipment, junction boxes, etc. While this embodiment may be well adapted for housing electrical equipment located at remote locations such as natural gas wells, the skilled artisan will readily appreciate that the novel features of this embodiment can be employed to protect/shield a variety of different electrical components regardless of their location and application. Thus, the scope of protection afforded to the subject invention should not be limited to enclosures for protecting/housing electrical equipment located at natural gas wells and pipelines.

More particularly and with reference to FIGS. 1 and 2, there is shown an embodiment of an enclosure 10 that has an equipment module 20 and a power module 200. As the present Detailed Description proceeds, the reader will appreciate that the novel apparatuses, arrangements, and manufacturing methods of the present invention may be successfully employed to construct a variety of different enclosure configurations without departing from the spirit and scope of the present invention.

Figure 3:
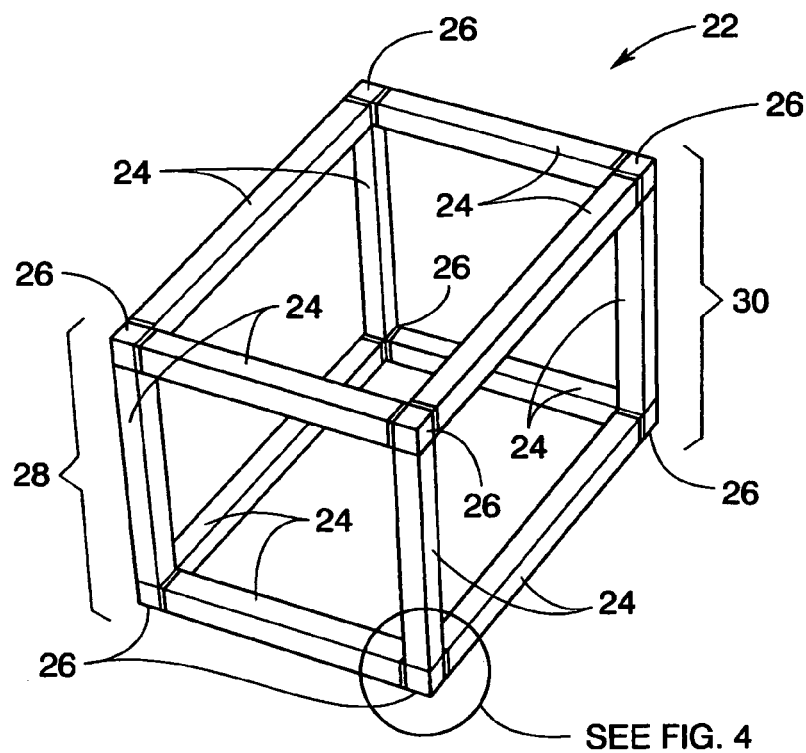
FIG. 3 is a perspective view of one embodiment of a frame assembly for an equipment module of one embodiment of the present invention.
Figure 4:
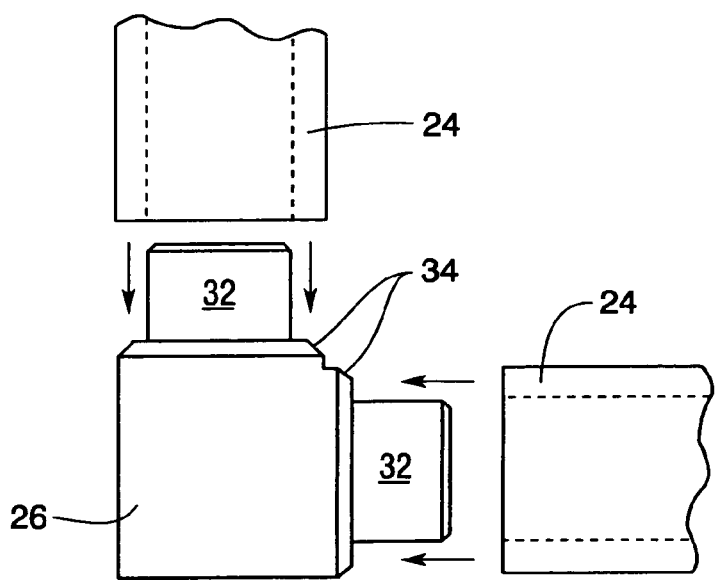
FIG. 4 is a partial top exploded assembly view of a portion of the frame assembly of FIG. 3.

In one embodiment, the equipment module 20 may house the electrical and other equipment, 12 therein and be fabricated utilizing unique modular construction techniques and methods. In particular, the equipment module 20 may have a frame assembly 22 that is fabricated from hollow tubular braces 24 that are interconnected to cornerblocks 26. As can be seen in FIG. 3, the frame assembly may include two end assemblies 28 and 30 that are interconnected by tubular braces 24. FIG. 4 illustrates one type of corner block 26 that may be cast or machined from an electrically conductive material such as aluminum or the like. Each corner block 26 may have one or more attachment posts 32 protruding therefrom which are each sized to be inserted into the hollow end of a corresponding hollow tubular brace 24. The hollow tubular braces 24 may also be fabricated from electrically conductive material such as aluminum or a similar material and they may be welded to the corresponding cornerblocks 26 to form an overall frame assembly generally designated as 22. It is conceivable, however, that the tubular braces 24 may be attached to the cornerblocks 26 by other suitable means. However, in this embodiment, to facilitate attachment of the tubular members 24 to the cornerblocks 26 by welding, a chamfered surface 34 may be provided adjacent each post 32 for receiving weld material therein. See FIG. 4.

This embodiment of the equipment module 20 also has a roof 36, a floor 38 and at least one door entry 60. The roof 36 and the floor 38 of the equipment module may be formed from electrically conductive material such as 3/16" aluminum plate or other suitable material that is welded to the frame assembly 22 as shown in FIGS. 1 and 2. Those of ordinary skill in the art will appreciate that such construction arrangement results in a shell 700 that has no fastener holes therethrough which may detrimentally affect the shielding properties of the enclosure 10. The frame assembly 22 may be supported on the ground or other surface by I-beams 39 and or channels that are welded or otherwise attached to the bottom portions of the frame assembly 22 and/or the floor 38 as shown in FIG. 1. A face channel 41 may be attached to the front ends of the I-beams 39 by welding or other suitable means and a second face channel 41 may be attached to the rear ends of the I-beams 39. The I-beams 39 and face channels 41 may be fabricated from electrically conductive material such as, for example, aluminum material.

Figure 5:
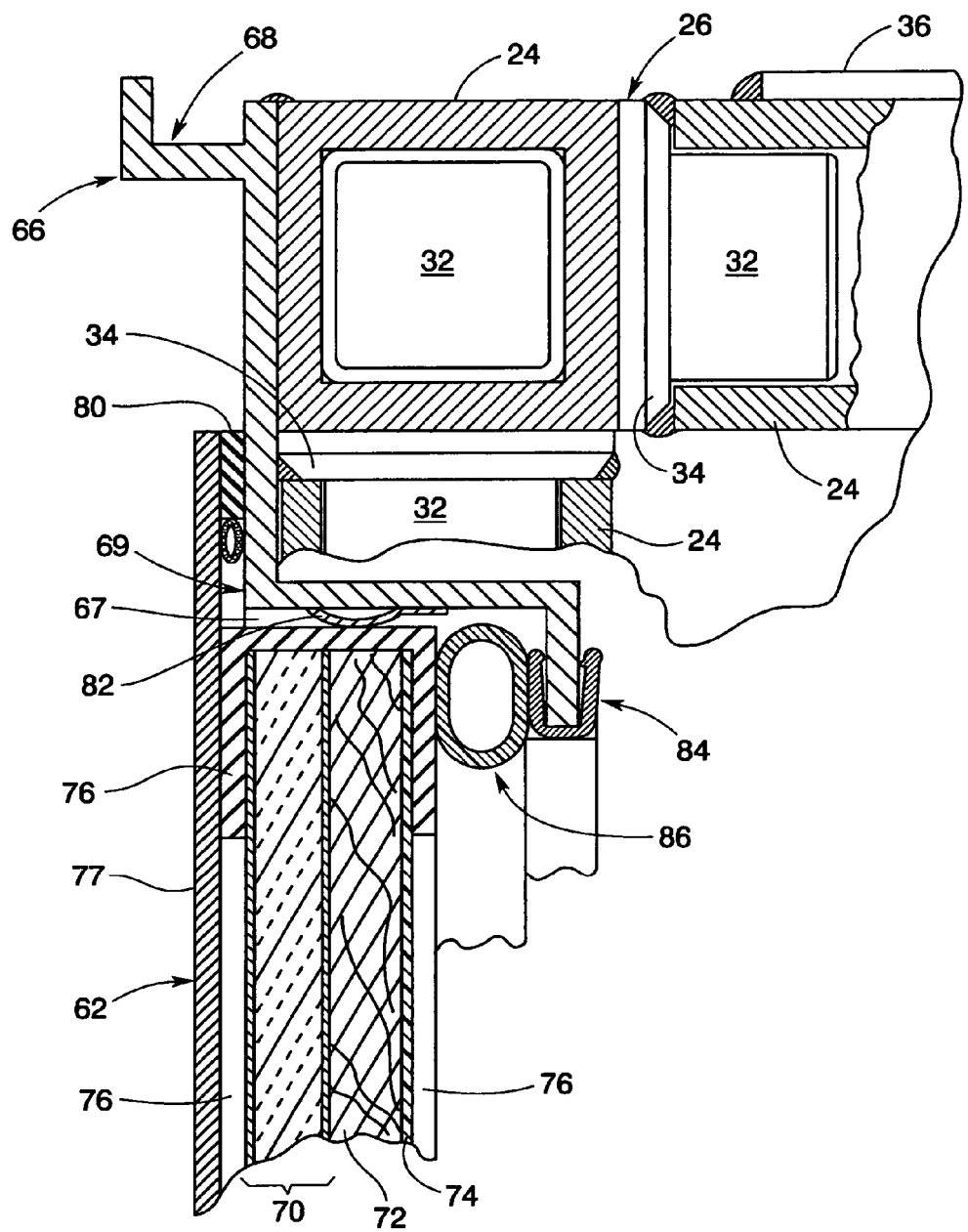
FIG. 5 is a partial cross-sectional view of a top of a door entry of one embodiment of the present invention.

To provide access into the equipment module 20, one or more door entries 60 may be provided. For example, in the embodiment depicted in FIG. 2, a front door entry 60 and a rear door entry 60' is shown. In this embodiment, the rear door entry 60' may be identical in construction and operation as the front door entry 60. A door entry 60 may comprise a door 62 that is supported by a doorframe arrangement, generally designated as 64. See FIG. 1. The upper portion of the doorframe 64 may be formed from electrically conductive material such as aluminum and be configured as shown in FIG. 5. As can be seen in FIG. 5, one embodiment of the present invention may include an upper frame member 66 that has a drip edge 68 formed thereon to channel water away from the door entry 60 in the equipment module 20. The upper frame member 66 and the side and bottom frame members 67 may form a planar sealing surface 69 for the door 62 to abut when it is closed. In one embodiment, the door 62 may be of layered construction and include a piece of commercially available material 70 sold under the trademark Celotex, plywood or other similar filler material 72 and, if desired, material 74 sold by Sequentia Incorporated of Strongsville, Ohio 44136 under the trademark Structoglas® which are all supported in an interior frame 76 that extends around the perimeter of those materials. See FIGS. 5 and 6. The interior frame 76 may be fabricated from electrically conductive material such as aluminum C-shaped channel members that are fastened together (welded) at their respective ends. In one embodiment, the exterior of the door 62 may comprise a piece of aluminum plate 77 that may be attached to the interior frame 76 by mechanical fasteners 79, such as, for example, those fasteners manufactured and sold by Celus Fasteners Mfg., Inc. of 2 Connector Road, Andover, Mass. 01810 under the trademark Tigerbolt™. However, other fasteners and fastening methods could be employed to fasten the doorplate 77 to the interior frame 76. The aluminum door plate 77 may be sized relative to the interior frame 76 such that it extends past the interior frame 76 on all sides to be brought into confronting relationship with the planar sealing surfaces 69 of the doorframe 64 when the door 62 is in a closed position as shown in FIG. 5. In one embodiment, a first seal material 80 may be attached around the perimeter of the aluminum doorplate 77 as shown in FIG. 5. The first seal 80 may comprise an RFI/EMI and environmental seal Model No. 3000 Twinseal™ fabricated by Tech-Etch, Inc. of 45 Aldrin Road, Plymouth, Mass. 02360, USA and be attached to the aluminum door plate 77 by pressure sensitive adhesive. However, other RFI/EMI and environmental seal arrangements could conceivably be used.

Also in this embodiment, a second RFI/EMI seal 82 may be employed as shown in FIG. 5. The second seal 82 may comprise, for example, the seal manufactured by Tech-Etch, Inc. under Model No. 375XXX. Such second seal 82 may be attached around an interior portion of the doorframe 64 by, for example, pressure sensitive adhesive such that the second seal 82 sealingly engages the approximate entire perimeter of the interior doorframe 76 when the door 62 is in the closed position as shown in FIG. 5. Other RFI/EMI seal arrangements could also conceivably be used. Their selection, however, may depend upon the types of materials from which the door 62 and doorframes 64 are made to achieve a desired sealing effect, while employing known techniques to minimize any deleterious effects caused by galvanic action between dissimilar materials.

This embodiment may also include a third RFI/EMI seal member 84 which may comprise a seal/shield known as the Bulb Shield™ Series, also manufactured by Tech-Etch. As can be seen in FIG. 5, the third seal 84 may be clipped onto the inwardly projecting portion of the doorframe 64 such that the bulb portion 86 of the seal 84 is in sealing contact with the interior-facing perimeter of the interior doorframe 76. If desired, commercially available adhesive may also be used to further attach the third seal 84 to the doorframe. However, it will be understood that other forms of seals and methods of attachment may also be employed. As was discussed immediately above, this embodiment employs three RFI/EMI seals between the portion of the door 62 and the doorframe 64. Those of ordinary skill in the art will appreciate that a variety of other types and quantities of seals/shields could also be successfully employed without departing from the spirit and scope of the present invention.

In one embodiment, the door 62 may be pivotably attached to the doorframe 64 by hinges 90 that may be fabricated from electrically conductive material such as, for example, aluminum. Hinges 90 may be attached to the doorframe 64 and the door 62 by mechanical fasteners 92 such as the previously mentioned Tigerbolts™. However, hinges 90 may be attached to the doorframe 64 and the door 62 by other types of mechanical fasteners such as bolts, screws, etc. or other methods such as welding. See FIGS. 1 and 7. Hinges 90 are configured to permit the door 62 to be received within the doorframe 64 when the door 62 is closed to achieve a desired amount of sealing contact between the door 62 and the doorframe 64 such that electrical current will pass between the door 62 and the doorframe 64.

To enable a consistent amount of environmental and RFI/EMI sealing to be maintained between the doorframe 64 and the door 62 when the door 62 is closed, an adjustable door latch assembly 100 may be employed. See FIGS. 1, and 7-11.

Figure 12:
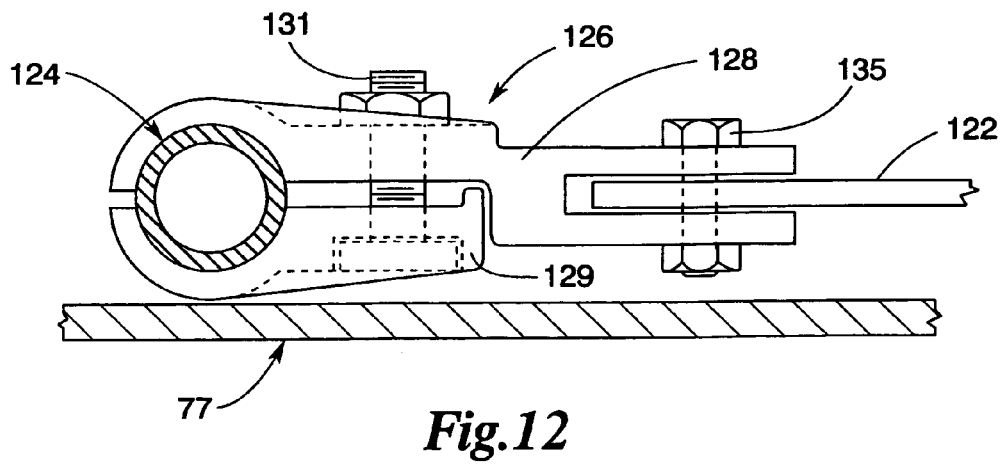
FIG. 12 is a partial view of an adjustable handle attachment member of an embodiment of the present invention.

One form of door latch assembly 100 may include a bottom catch member 102 that may be fabricated from aluminum or material that has shielding properties that are similar to the electrical grounding properties of the material from which the other components (i.e., the frame assembly 22, roof 36, floor 38, etc.) of the equipment module 20 are fabricated. The bottom catch member 102 may be attached to the bottom portion 67 of the doorframe 64 by welding, bolts, Tigerbolts™ or other suitable fasteners. Similarly, a top catch member 102 may be attached to the top portion 66 of the doorframe 64 as shown in FIG. 1. The door latch assembly 100 may also include a handle assembly 120. In one embodiment, the handle assembly 120 includes a handle 122 that is pivotally attached to a latch conduit 124. As can be seen in FIGS. 1, 7, 8, and 12, in this embodiment, the handle 122 is pivotally attached to an adjustable connector 126 that is clamped onto the latch bar or latch conduit 124. Such arrangement permits the handle 122 to be selectively pivoted in the direction represented by arrow 127 in FIG. 8. In this embodiment, the adjustable connector 126 may comprise a first clamp portion 128 that is attached to a second clamp portion 129 by a bolt 131 as shown in FIG. 12. The handle 122 may be pivotally attached to the first clamp portion 128 by another bolt 135. This arrangement permits the position of the handle 122 to be adjusted relative to the latch conduit 124 to establish a desired amount of compression between the door 62 and the various seal members 80 and 84 as will be discussed in further detail below. In this embodiment, the latch conduit 124 is rotatably affixed to the doorplate 77 by a series of door latch retainers 130.

Figure 11:
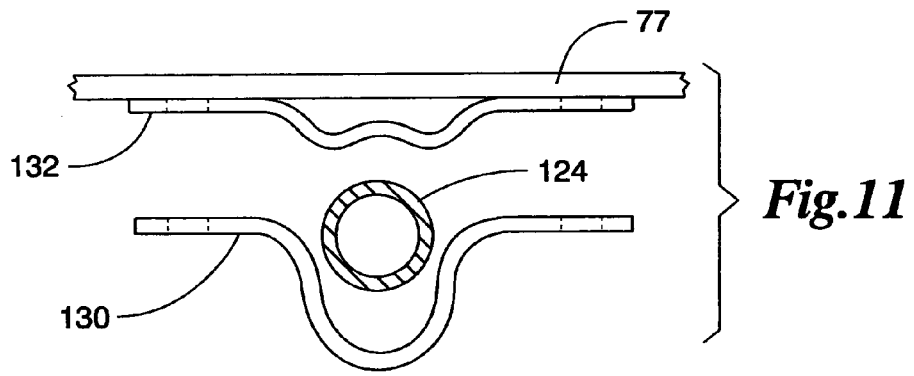
FIG. 11 is a partial exploded view of one embodiment of a door latch retainer embodiment of the present invention.

As can be seen in FIG. 11, in this embodiment, the door latch retainers 130 may include an interior gasket member 132 that may be fabricated from, for example, a plastic or other polymer material and serve to prevent the latch conduit 124 from binding with the doorplate 77 as it is rotated. The gasket members 132 and door latch retainers 130 may be attached to the doorplate 77 by bolts or other mechanical fasteners 134 such as the above-mentioned Tigerbolts™ which may be fabricated from stainless steel or material having similar properties thereto. The reader will appreciate that the door latch retainers 130 permit the latch conduit 124 to be rotated relative to the doorplate 77.

Also in this embodiment, cam locks 140 may be attached to the top end and the bottom end of the latch conduit 124. In this embodiment, each cam lock 140 may be fabricated from electrically conductive material such as aluminum or other material that has similar properties to the properties of the other door components and equipment module structure and may include a hook portion 142 that is shaped to engage a corresponding T-shaped portion 106 formed on the corresponding cam latch 102. Each cam lock 140 may also have a boss 144 formed thereon that is sized to be inserted into the hollow interior of the latch conduit. See FIGS. 9 and 10. The cam locks 140 may then be attached to the latch conduit 124 by welding or other suitable fastening techniques.

Figure 8:
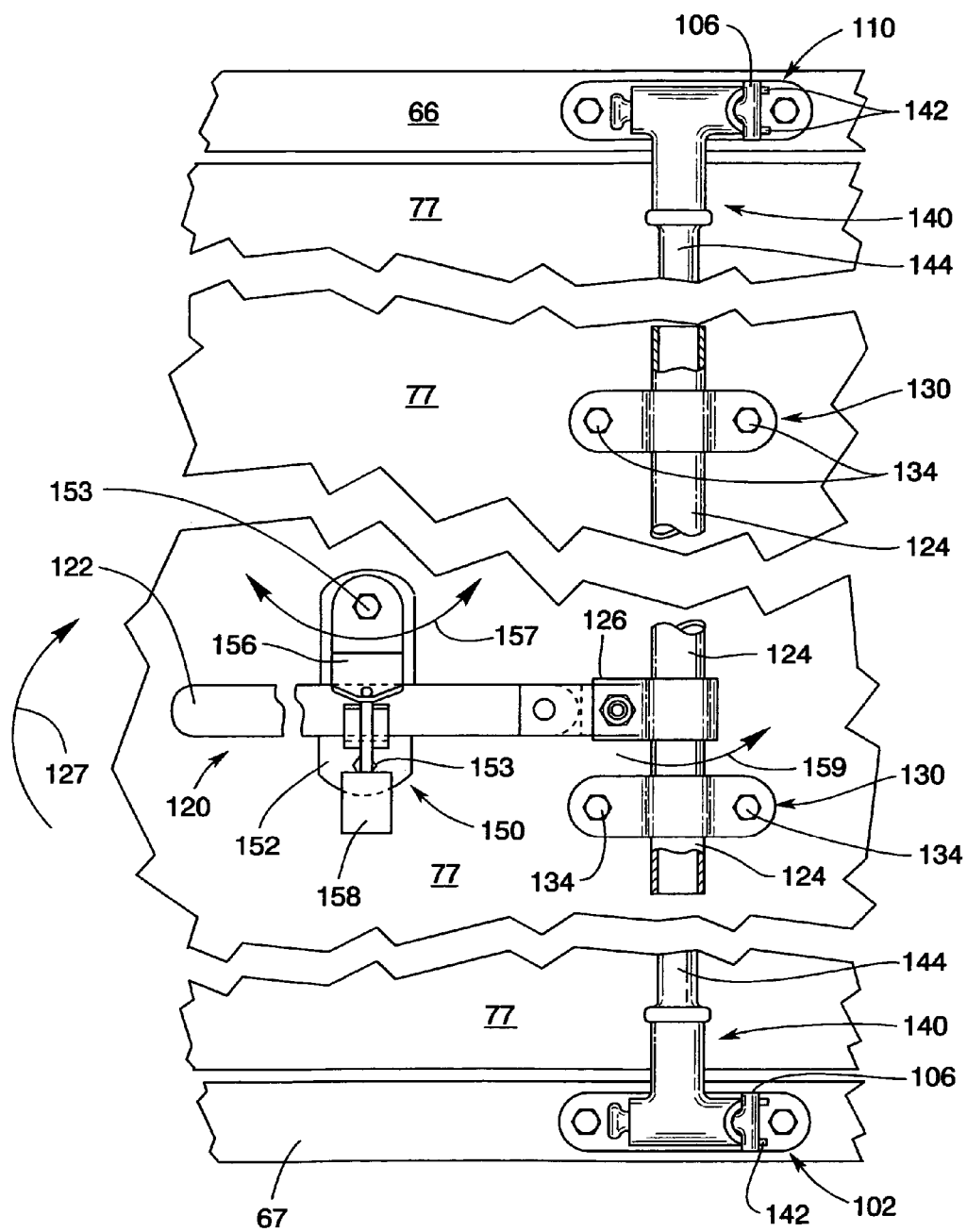
FIG. 8 is an exploded view of one embodiment of a door latch assembly of the present invention.
Figure 9:
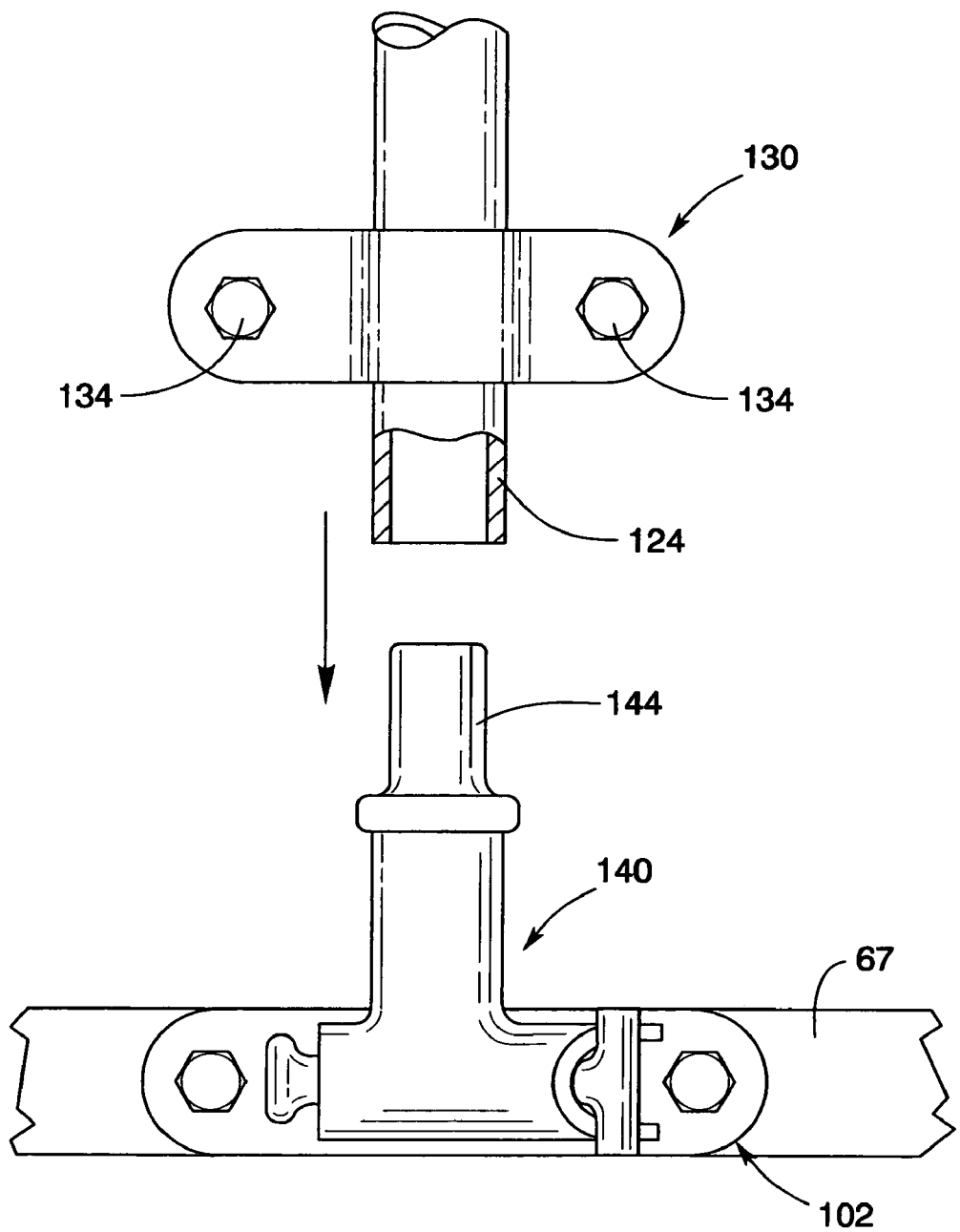
FIG. 9 is a partial exploded view of a portion of the door latch assembly of FIG. 8.
Figure 10:
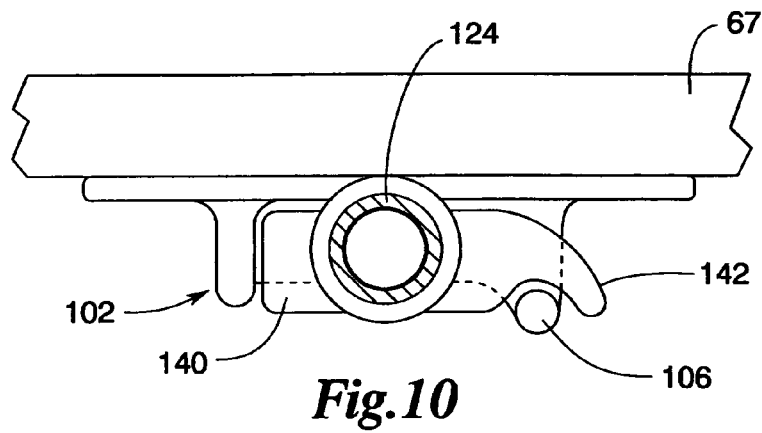
FIG. 10 is a top view of a portion of the door latch assembly of FIGS. 7 and 8.

A lock cradle assembly 150 of this embodiment may be provided to facilitate locking the door 62 in the closed position. As can be seen in FIG. 8, one form of the lock cradle assembly 150 may comprise a lower cradle member 152 for receiving and supporting a portion of the door handle therein. The lower cradle member 152 may be fabricated from, for example, stainless steel, aluminum, etc. and be attached to the doorplate 77 by, for example, bolts 153. An upper retainer member 156 may be pivotally supported on the lower cradle 152 by a pivot boss (not shown) formed on the lower cradle member 152 and be pivotally fastened thereto by one of the bolts 153. Such arrangement permits the upper retainer 156 to be pivoted in the directions represented by arrow 157 relative to the lower cradle member 152. To lock the handle 122 in position, the upper retainer 156 is pivoted to the position shown in FIG. 8, and a lock 158 is inserted through aligned holes in the upper and lower retainers 152, 156, respectively. To open the door 62, the lock 158 is removed and the upper retainer 156 is pivoted to a position whereby the door handle 122 may be pivoted out of the lower retainer 152 in the direction represented by arrow 127. The door handle 122 may then be rotated in the direction represented by arrow 159 to cause the latch conduit 124 to rotate the cam locks 140 and their hook portions 142 out of engagement with a T-shaped retainer portion 106 of the cam latches 102. After the cam locks 140 disengage the cam latches 102, the door 62 may be opened. To latch the door 62, the door 62 is moved to the closed position and the handle 122 is pivoted to bring the hook portions 142 of the cam locks 140 into engagement with the T-shaped portions 106 of the cam latches 102. Further rotation of the handle 122 results in a camming action between the cam locks 140 and the cam latches 102 which forces the door 62 into sealing contact with the seals 80, 82, and 84. Those of ordinary skill in the art will appreciate that the door 62 and door latch assembly 120 described above, are examples of closures that may be successfully used in connection with various embodiments of the present invention. It is conceivable, however, that other forms of door arrangements and latches may be employed without departing from the spirit and scope of the present invention. Regardless of the type and construction of the door latch arrangement, it may be desirable for the door to achieve an environmental seal and a seal such that electrical current will pass between the door and the frame when the door is closed and a metal to metal contact for RFI shielding capability.

In the above-described embodiment, the amount of compression achieved between the door and the seals 80 and 84 may be adjusted by adjusting the position of the latch conduit 124 (and the cam locks 140 attached thereto) relative to the handle portion 122, such that when the handle 120 is in the closed position (shown in FIG. 8), the cam locks 140, in engagement with the corresponding cam latches 102, cooperate to force the door 62 inward to compress the seals 80 and 84. To adjust the position of the latch conduit and the handle 120, the user simply loosens the bolt 131 and rotates the adjustable connector 126 until the handle 120 is in a desired position relative to the latch conduit 124 and the bolt 131 is then tightened. In one embodiment, it is desirable for the seal 80 and/or the seal 84 to be compressed by approximately 25 percent. However, such degree of compression may vary depending upon the construction and composition of the particular door seals employed. Those of ordinary skill in the art will appreciate that the novel method of adjusting the amount of compression applied to the seals enables the user to make the necessary adjustments to compensate for door component wear.

Also in this embodiment, end 28 of the frame assembly 22 of the equipment module 20 is attached to a frame assembly 210 of the power module 200 as will be discussed in further detail below. The other end 30 of the frame assembly 22 of the equipment module 20 may have a cable entry portion 160 attached thereto which has a front wall portion 161, an end wall portion 162 and a rear wall portion 163 that are fabricated from material that is electrically conductive such as aluminum. See FIGS. 2 and 15. For example, the walls 161, 162, 163 may be fabricated from aluminum plate or similar material and be welded together at their sides. Roof plate 36 may also be welded to the walls 161, 162, and 163 as shown in FIG. 1 and comprise electrically conductive material such as aluminum plate. The bottom of the cable entry portion 160 may be formed with another floor plate 164 that is welded to the bottom of the end 30 of frame assembly 22 and the bottom ends of the walls 161, 162, 163 to enclose the cable entry portion 160. If desired, an air conditioner assembly 166 may be coupled to the end wall 162 an end of the cable entry portion 160 as shown in FIG. 1. The air conditioner assembly 166 may include a housing 168 that is constructed from the same materials that forms the frame assembly 22, the roof 36, the floor 38, the walls 161, 162, 163, and floor plate 164 of the cable entry portion 160 and may be attached to the end wall 162 of the cable entry portion 160 by stainless steel bolts or screws.

Figure 14:
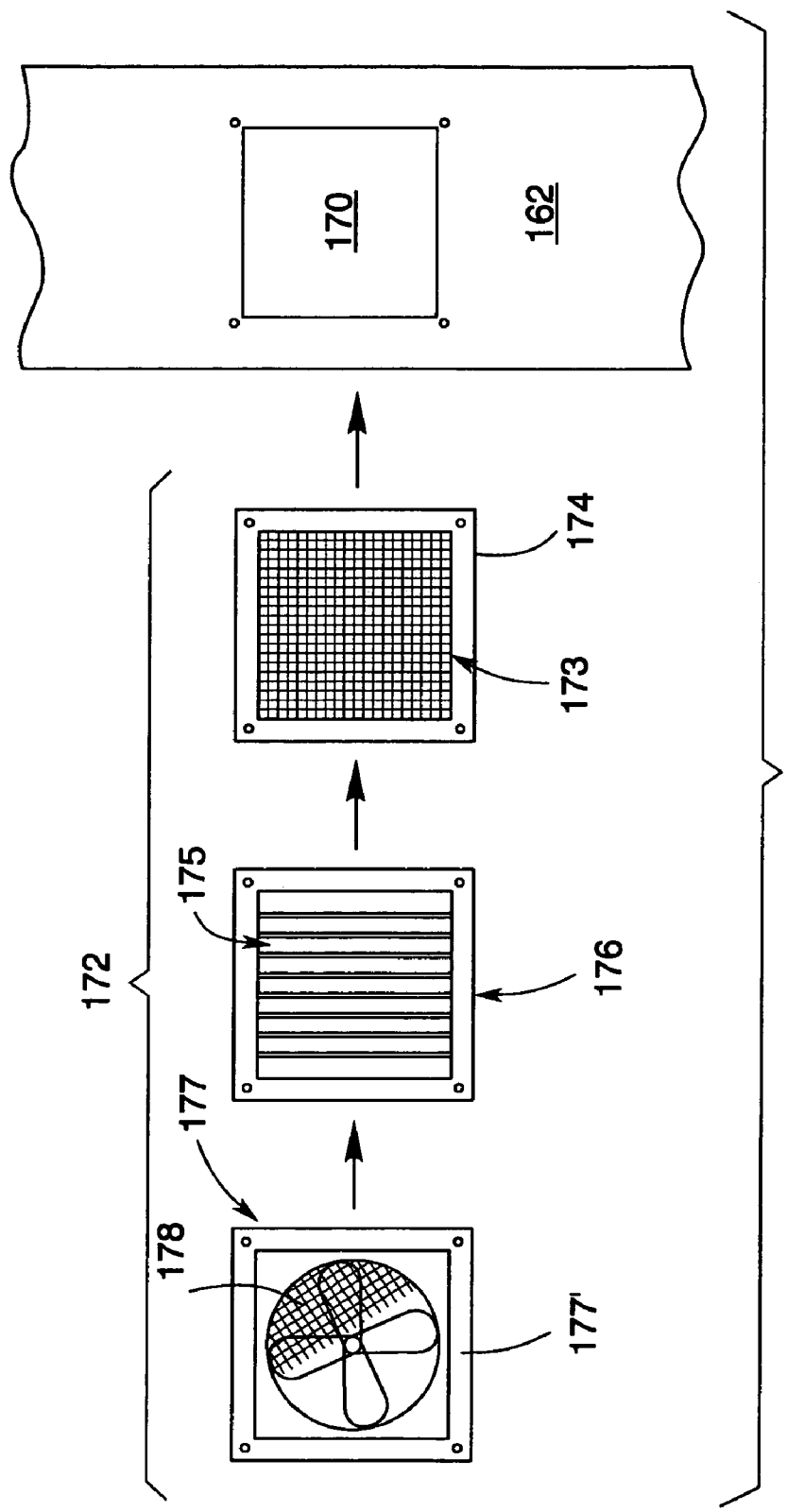
FIG. 14 is an exploded assembly view of on embodiment of a shutter and fan assembly of the present invention.

The cable entry portion 160 of this embodiment may be provided with a shutter and fan assembly 172 positioned over a vent opening 170 through the end wall 162. See FIG. 14. The shutter and fan assembly 172 may include a first EMI/RFI filter assembly 173 for example, of the type manufactured by Tech-Etch, Inc. under Series 8000, Style 6 or similar filter assembly that has a frame 174 adapted to be bolted to the end wall 162. The shutter and fan assembly 172 may further include a shutter assembly 175 that may be fabricated from electrically conductive material such as aluminum and be equipped with louvers and an attachment frame 176. The shutter assembly 175 may be of the adjustable type and be operated by a thermostat-controlled motor (not shown) which serves to open and close the louvers based on the temperature within the enclosure 10. To establish airflow through the enclosure 10, a fan 177 may also be employed. In one embodiment, the fan motor may be controlled by a thermostat-equipped switch (not shown). Fan 177 may also be provided with a frame member 177' and a guard 178 that may be fabricated from expanded metal. Those of ordinary skill in the art will appreciate that the frame members of the above components may be attached to the end wall 162 with bolts or similar fasteners (not shown). In addition, a deflector 179 fabricated from aluminum may be attached to the end of the cable entry portion 160 to prevent rain, snow, etc. from entering the enclosure through the shutter and fan assembly 172. See FIGS. 1 and 2. As can also be seen in those Figures, the cable entry portion 160 may have one or more cable entry ports 400 therein for facilitating entry of cables 380 into the enclosure 10. An exemplary construction of cable entry ports 400 is provided below.

Figure 15:
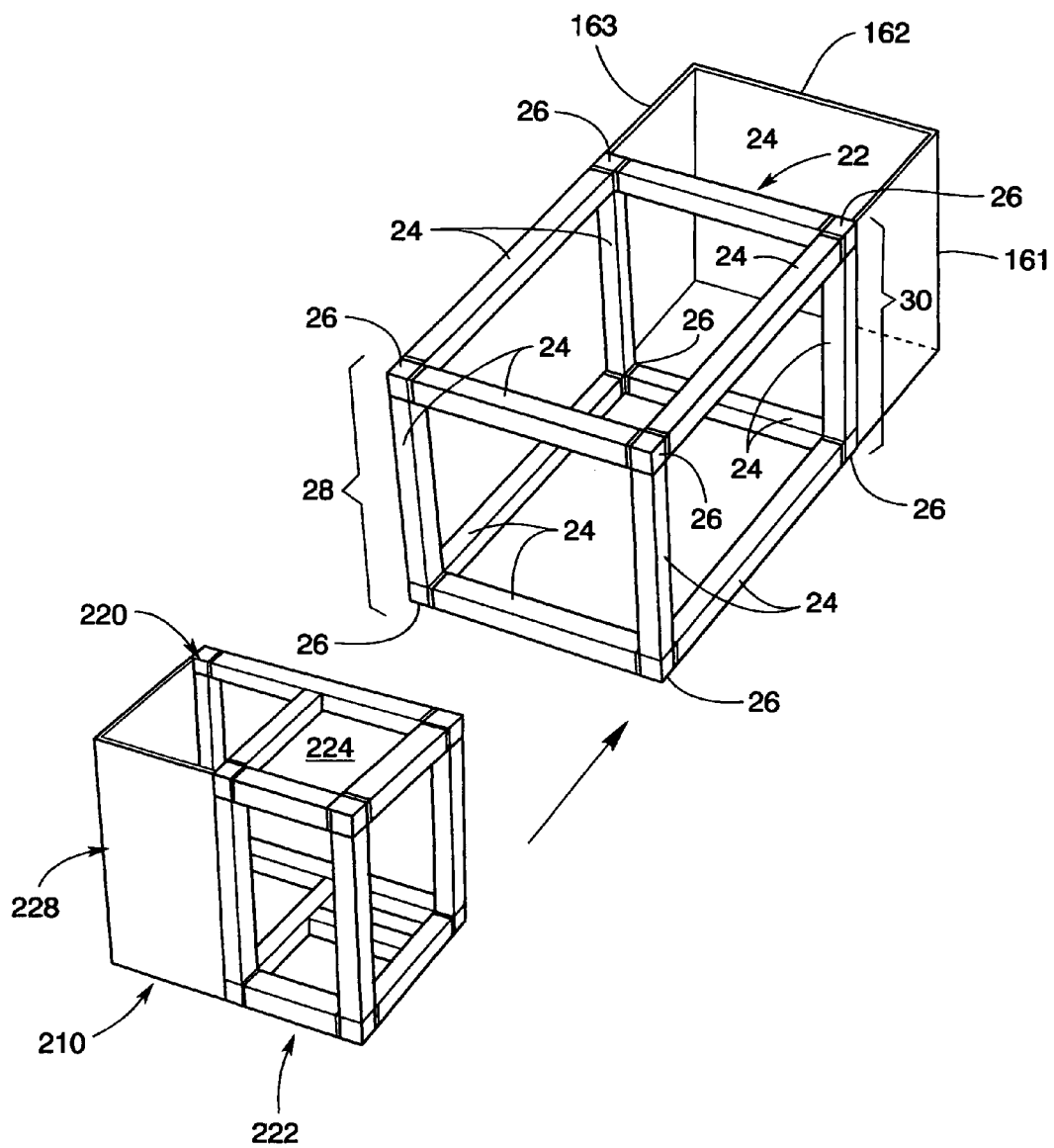
FIG. 15 is an exploded assembly view of a frame assembly of a power module embodiment and the frame assembly of an equipment module embodiment of the present invention.
Figure 16:
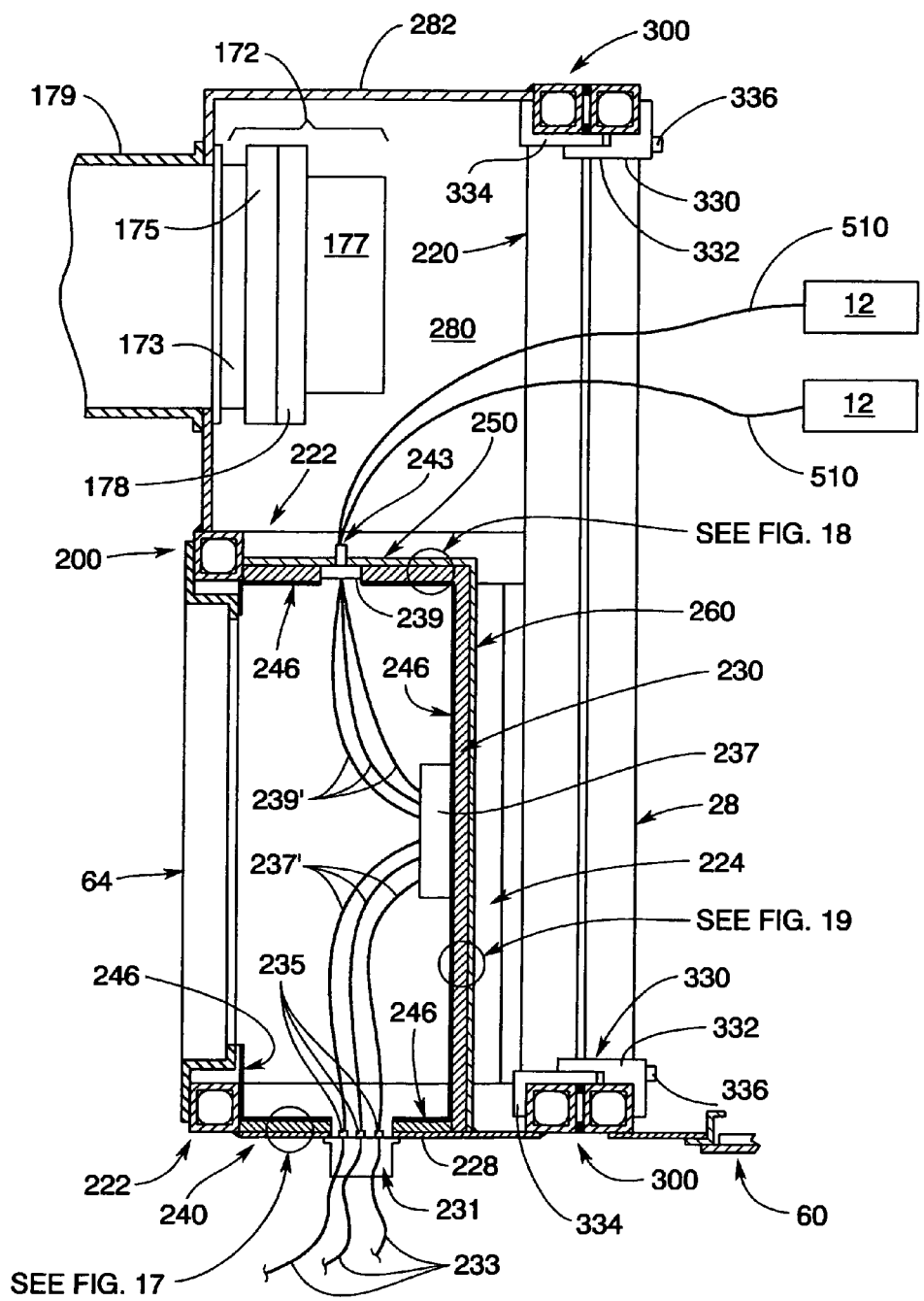
FIG. 16 is a partial top cross-sectional view of a power module embodiment of the present invention.

As was mentioned above, in this embodiment, the enclosure 10 also includes a power module 200. The power module 200 may be fabricated out of electrically conductive material such as aluminum and serve as the portion of the enclosure wherein power is brought into the enclosure 10 to power the equipment 12 supported in the equipment module 20. The power module 200 may include a frame assembly 210 that has an end frame member 220 that corresponds to end 28 of the equipment module frame assembly 22. See FIG. 15. In addition, attached to the end frame assembly 220 is another frame portion 222 that serves to define a power entry area 224 for supporting a magnetic field enclosure 230 therein. See FIGS. 16 and 16A. To provide access into the power entry area 224 and the magnetic field enclosure 230 therein, a doorframe 64 and door 62 of the types and constructions described above may also be provided in the power module 200. As can be seen in FIGS. 1 and 16, a front exterior wall plate 228 is attached to the front end of the frame portion 222. In one embodiment, the wall plate 228 is fabricated from electrically conductive material such as aluminum plate that may be welded to the frame portion 222 and the end frame portion 220.

Figure 17:
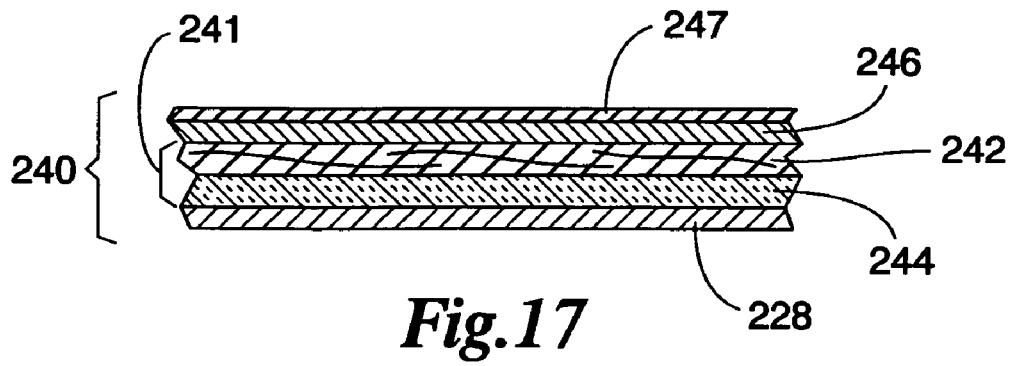
FIG. 17 is a partial cross-sectional view of a front wall of the shielded enclosure depicted in FIG. 16.
Figure 18:
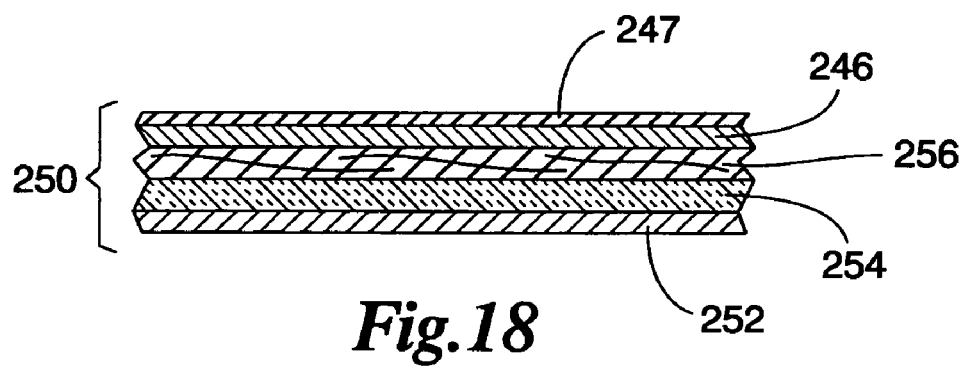
FIG. 18 is a partial cross-sectional view of a rear wall portion of the shielded enclosure depicted in FIG. 16.
Figure 19:
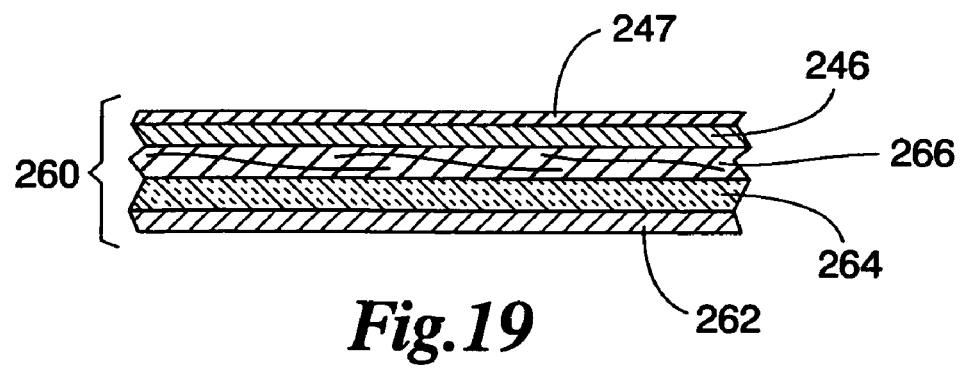
FIG. 19 is a partial cross-sectional view of a side wall of the shielded enclosure depicted in FIG. 16.

As can be seen in FIG. 16, the magnetic field enclosure 230 may be attached to the power module frame portion 222 within the power entry area 224 such that the magnetic field enclosure 230 shares at least one common wall with the remaining portion of the power module 220 and the equipment module 20 when the power module 220 is attached to the equipment module 20. More particularly and with reference to FIG. 16, the magnetic field enclosure 230 may comprise a rectangular shaped enclosure which is supported within the power entry area 224. Those of ordinary skill in the art will appreciate, however, that the magnetic field enclosure 230 may also be provided in other shapes and sizes. In this embodiment, the shielded enclosure has front wall 240, a rear wall 250 and a sidewall 260. As can be seen in FIG. 16, in this embodiment, the front wall 240 is supported such that it is substantially coplanar with the front wall plate 228 of the power module 220. Also in this embodiment, the front wall portion 240 may have a filler material 241 which may comprise a layer of plywood 242 and commercial insulation material 244 glued thereto. See FIG. 17. The inside of the front wall portion 240 is lined with magnetic shield material 246 which may comprise, for example, the AD-MU-80 material manufactured by Advance Magnetics of Rochester, Ind. or similar magnetic shield material. The AD-MU-80 material or similar material may comprise is a soft magnetic alloy containing approximately 80% nickel, 4.20% molybdenum, and 15% iron which develops extremely high permeabilities with minimum hysteresis loss. While one acceptable alloy may contain about eighty percent nickel, other alloys comprising about forty to about eighty percent nickel can also be successfully used. The magnetic shield material 246 may be glued to the plywood 242 or affixed thereto with double-sided adhesive tape. In addition, the exposed surface of the magnetic shield material 246 may be covered with a layer of material 247 such as that material fabricated by Sequentia Incorporated under the trademark Structoglas®. The material 247 may be attached to the magnetic shield material 246 by glue or double-sided tape. The rear wall 250 of this embodiment may also have a cross-sectional construction that is similar to the construction of the front wall 240. In particular, the rear wall 250 may comprise aluminum plate 252 that has insulation 254 glued or otherwise attached thereto. Plywood 256 or other filler member may be attached to the insulation 254 with glue or double-sided tape and a corresponding rear portion of the magnetic shield material 246 may be attached to the plywood with glue or double-sided adhesive tape. Structoglas® material 247 may be attached to the exposed surface of the magnetic shield material 246 in the manners described above. See FIG. 18. Likewise, the side wall portion 260 of this embodiment may comprise a piece of aluminum plate 262 that is welded to the front plate 228 and the rear plate 252 such that the plates 228, 252, 262 form a continuous 3-sided shell portion of the magnetic field enclosure 230. Those of ordinary skill in the art will also appreciate that the rear plate 252 and the side plate 262 may actually comprise a single plate that is bent to define the exterior sidewall and the exterior rear wall of the magnetic shield enclosure. Insulation 264 may be attached to the plate 262 and plywood 266 or other filler material is attached to the insulation 264. The magnetic shield material 246 may be attached to the plywood by glue, double-sided adhesive tape, etc. Structoglas® material 247 may be attached to the exposed surface of the magnetic shield material 246 in the manners described above. See FIG. 19.

Figure 16A:
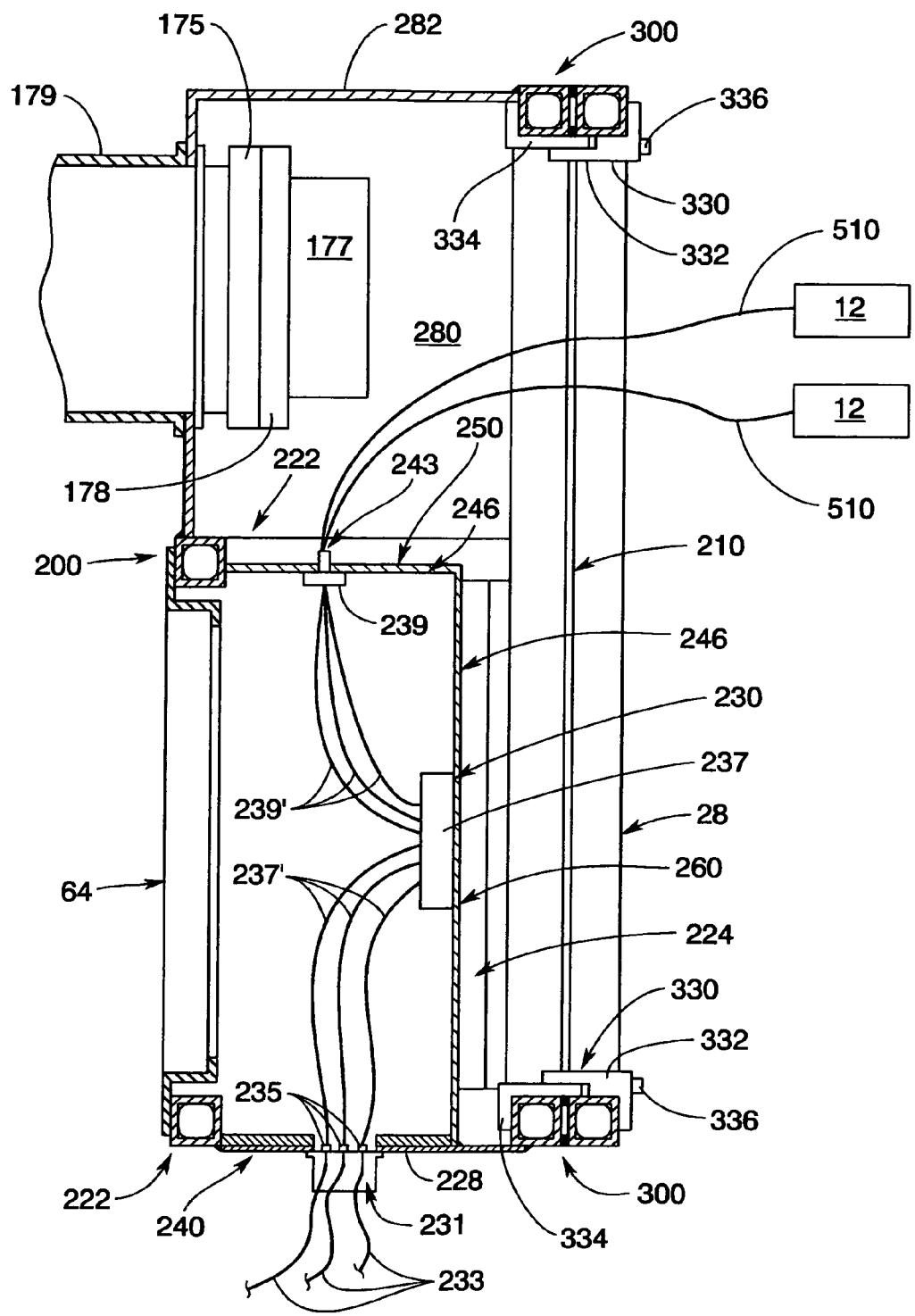
FIG. 16A is a partial top cross-sectional view of another power module embodiment of the present invention.

In an alternative embodiment as shown in FIG. 16A, the magnetic shield material 246 may be supported in a coplanar orientation relative to the front wall 228 of the power module 200 without the insulation and/or the plywood therebetween.

The magnetic shield material 246 may be directly attached to the front wall 228 with a commercially available adhesive which may also serve to prevent the occurrence of galvanic corrosion between the magnetic shield material 246 and the front wall 228. Similarly, magnetic shield material 246 may form the entire rear wall 250 and sidewall 260. In these embodiments, those of ordinary skill in the art will appreciate that the magnetic shield material 246 may extend from a floor plate 270 attached to the frame assembly 210 of the power module 200 and the roof plate 272 that is also attached to the frame assembly 210. See FIG. 1.

Figure 13:
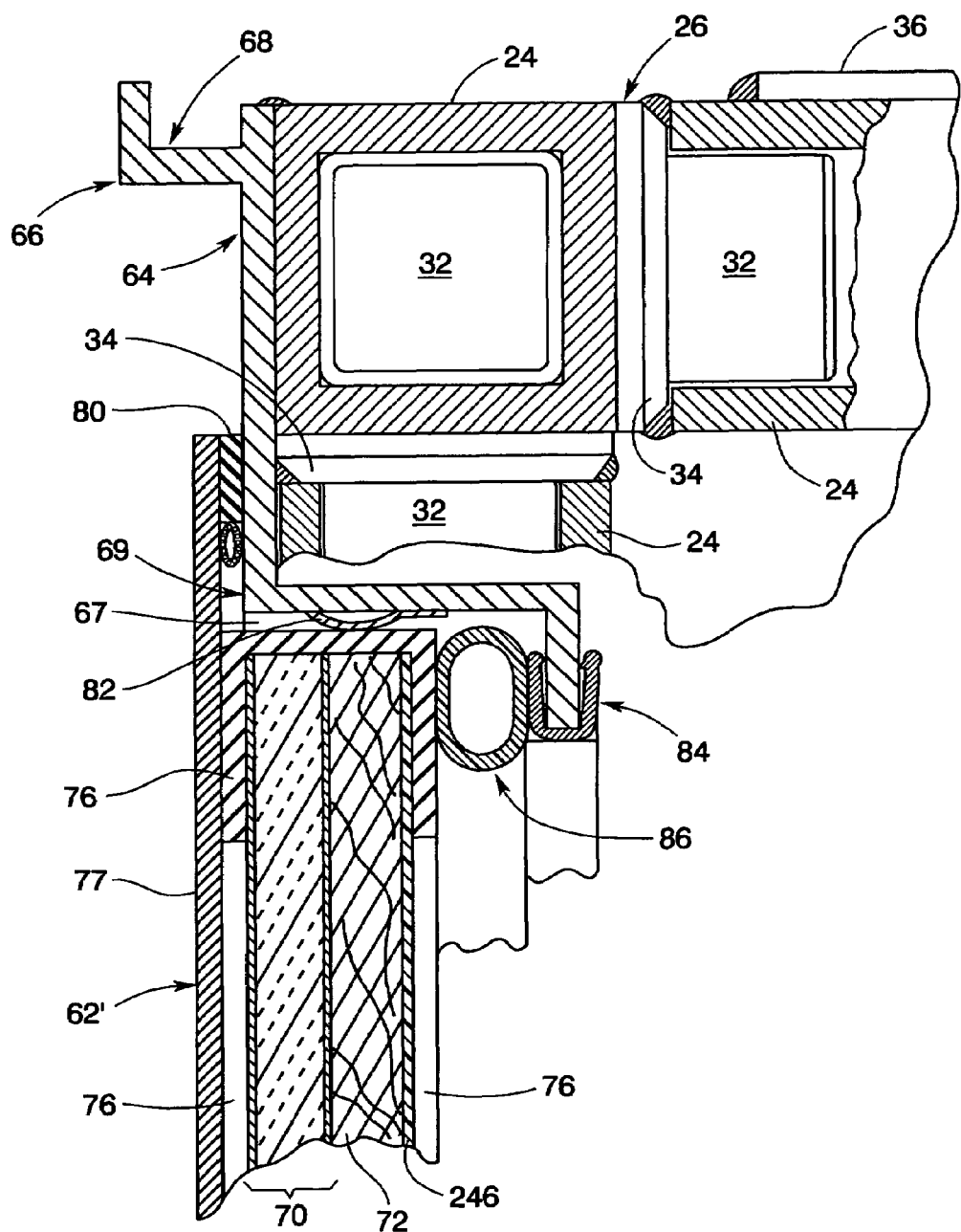
FIG. 13 is a partial cross-sectional view of a top of a door entry that may be employed in one magnetic shield enclosure embodiment of the present invention.
Figure 13A:
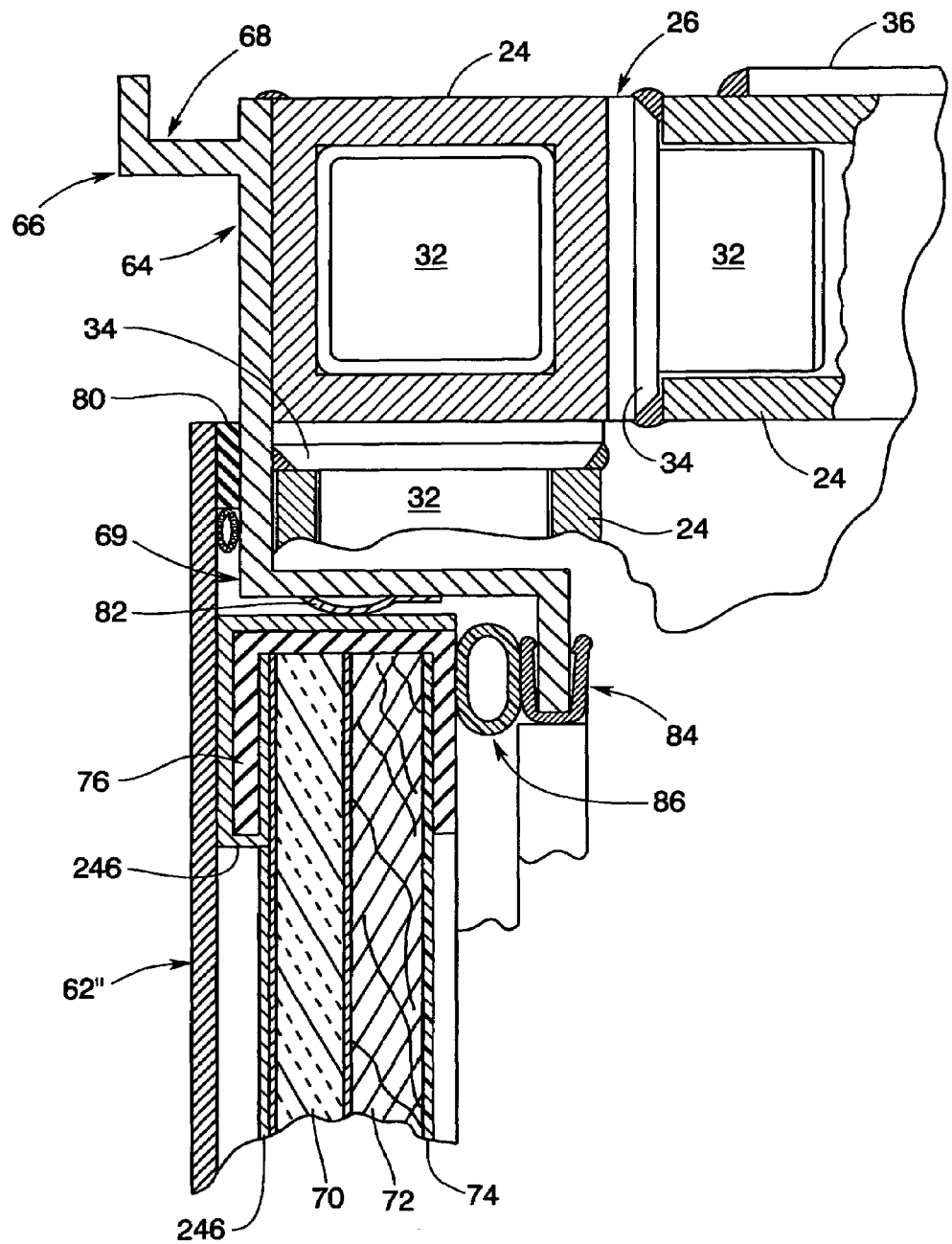
FIG. 13A is a partial cross-sectional view of a top of another door entry that may be employed in another magnetic shield enclosure of one embodiment of the present invention.

As indicated above, one embodiment, the magnetic field enclosure 230 may have a door 60 of the type described above and illustrated in FIG. 5. Other embodiments of the present invention may employ door constructions of the types depicted in FIGS. 13, 13A, and 13B. The embodiment of FIG. 13 may employ a doorframe 64 constructed as described above and a door 62'. However, the door 62' may have a layer of magnetic shield material 246 attached to the inner surface of the door 62'. In the embodiment depicted in FIG. 13A, the doorframe 64 may be constructed as described above. However, in this embodiment, the door 62" may include a piece of Celotex 70 and plywood 72 that are supported in an interior frame 76 that extends around the perimeter of those materials. In this embodiment, magnetic shield material 246 of the type described above may also be supported in the frame 76 and, if desired, attached to the plywood 72 with adhesive or double-sided tape. The interior frame 76 may be fabricated from electrically conductive material such as aluminum C-shaped channel members that are fastened together (welded) at their respective ends. Also in this embodiment, magnetic shield material 246 may be provided on exterior portions of the frame 76 as shown in FIG. 13A. As can also be seen in that Figure, a portion of the magnetic shield material 246' may extend between a portion of the Celotex material 70 and the frame 76. An additional piece of magnetic shield material 246 may also be attached to the exposed portion of the Celotex 70 with adhesive or double-sided tape. The exterior of the door 62" may comprise a piece of aluminum plate 77 that may be attached to the interior frame 76 by mechanical fasteners 79, such as Tigerbolt™ fasteners of the type described above. However, other fasteners and fastening methods could be employed to fasten the doorplate 77 to the interior frame 76. The aluminum door plate 77 may be sized relative to the interior frame 76 such that it extends past the interior frame 76 on all sides to be brought into confronting relationship with the planar sealing surfaces 69 of the doorframe 64 when the door 62" is in a closed position as shown in FIG. 13A. In one embodiment, a first seal material 80 may be attached around the perimeter of the aluminum doorplate 77 and comprise an RFI/EMI and environmental seal Model No. 3000 Twinseal™ fabricated by Tech-Etch, Inc. and be attached to the aluminum door plate 77 by pressure sensitive adhesive. However, other RFI/EMI and environmental seal materials could conceivably be used.

Also in this embodiment, a second RFI/EMI seal 82 may be employed as shown in FIG. 13A. The second seal 82 may comprise, for example, the seal manufactured by Tech-Etch, Inc. under Model No. 375XXX. Such second seal 82 may be attached around an interior portion of the doorframe 64 by, for example, pressure sensitive adhesive such that the second seal 82 sealingly engages the magnetic shield material 246 extending around the perimeter of the interior doorframe 76 when the door 62" is in the closed position as shown in FIG. 13A. Other seal members could also conceivably be used.

This embodiment may also include a third seal member 84 which may comprise a seal/shield known as the Bulb Shield™ Series, also manufactured by Tech-Etch, Inc. As can be seen in FIG. 13A, the third seal 84 may be clipped onto the inwardly projecting portion of the doorframe 64 such that the bulb portion 86 of the seal is in sealing contact with the interior-facing perimeter of the interior doorframe 76. If desired, commercially available adhesive may also be used to further attach the third seal 84 to the doorframe 64. However, it will be understood that other forms of seals and methods of attachment may also be employed. As was discussed immediately above, this embodiment employs three RFI/EMI seals between the portion of the door and the doorframe. Those of ordinary skill in the art will appreciate that a variety of other types and quantities of seals/shields could also be successfully employed without departing from the spirit and scope of the present invention.

Figure 13B:
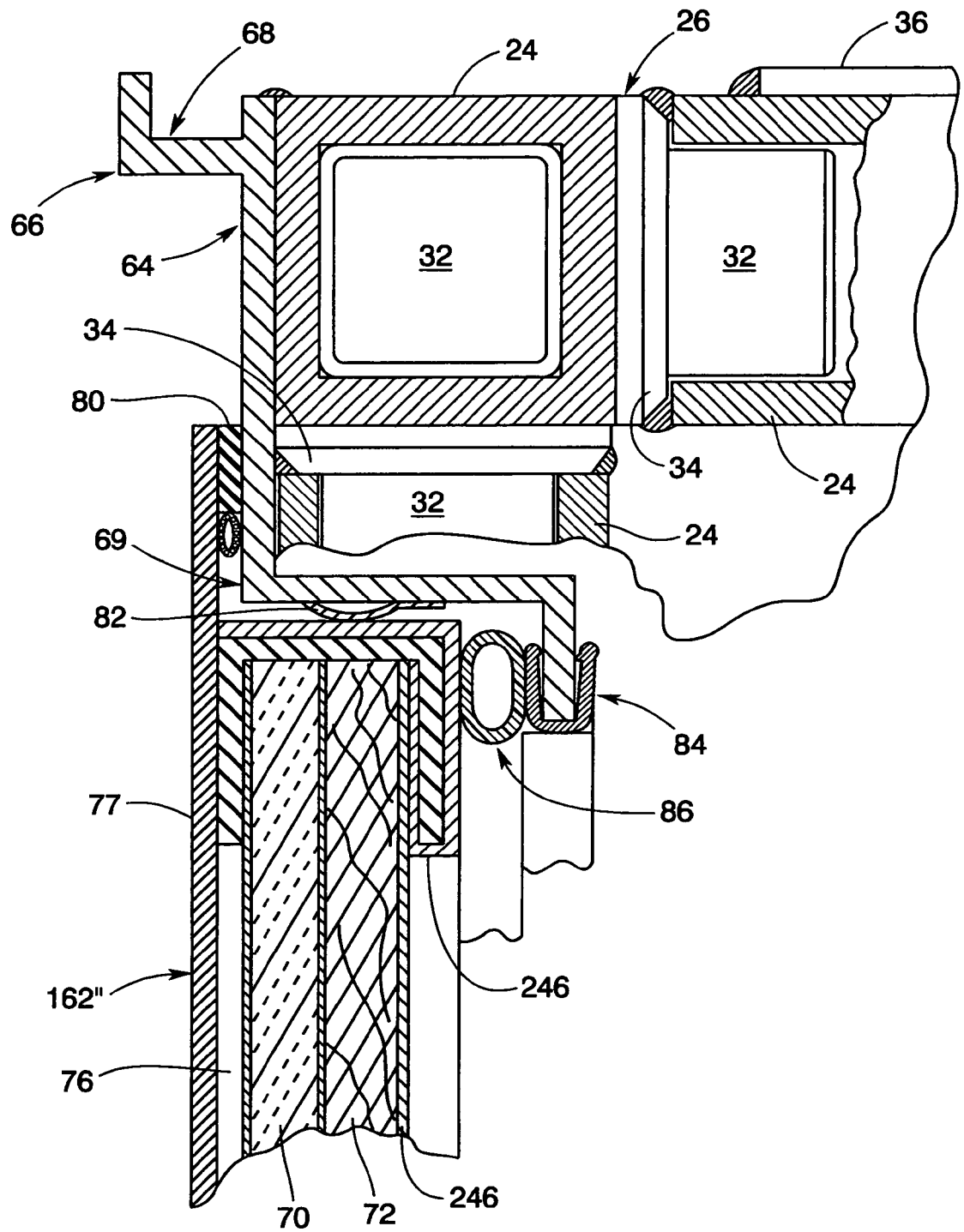
FIG. 13B is a partial cross-sectional view of a top of another door entry that may be employed in another magnetic shield enclosure of one embodiment of the present invention.

Another door embodiment that may be employed in the power module portion is shown in FIG. 13B. This embodiment may employ a door 162" and doorframe 64 constructed as described above. However, the door 62" may include a piece of Celotex 70, plywood 72 and a piece of magnetic shield material 246 that are supported in an interior frame 76 that extends around the perimeter of those materials. The interior frame 76 may be fabricated from electrically conductive material such as aluminum C-shaped channel members that are fastened together (welded) at their respective ends. Also in this embodiment, additional magnetic shield material 246 may be provided on exterior portions of the frame 76 as shown in FIG. 13B. As can be seen in that Figure, a portion of the magnetic shield material 246 extending around the perimeter of the frame 76 may extend between a portion of the magnetic shield material 246 attached to the plywood 72 and the frame 76. The exterior of the door 62 may comprise a piece of aluminum plate 77 that may be attached to the interior frame 76 by mechanical fasteners 79, such as Tigerbolt™ fasteners of the type described above. However, other fasteners and fastening methods could be employed to fasten the doorplate 77 to the interior frame 76. The aluminum door plate 77 is sized relative to the interior frame 76 such that it extends past the interior frame 76 on all sides to be brought into confronting relationship with the planar sealing surfaces 69 of the doorframe 64 when the door 162" is in a closed position as shown in FIG. 13B. In one embodiment, a first seal material 80 may be attached around the perimeter of the aluminum doorplate 77 and comprise an RFI/EMI and environmental seal Model No. 3000 Twinseal™ fabricated by Tech-Etch, Inc. and be attached to the aluminum door plate 77 by pressure sensitive adhesive. However, other RFI/EMI and environmental seal materials could conceivably be used.

Also in this embodiment, a second RFI/EMI seal 82 may be employed as shown in FIG. 13B. The second seal 82 may comprise, for example, the seal manufactured by Tech-Etch, Inc. under Model No. 375XXX. Such second seal 82 may be attached around an interior portion of the doorframe 64 by, for example, pressure sensitive adhesive such that the second seal 82 sealingly engages the magnetic shield material 246 extending around the perimeter of the interior doorframe 76 when the door 162" is in the closed position as shown in FIG. 13B. Other seal members could also conceivably be used.

This embodiment may also include a third RFI/EMI seal member 84 which may comprise a seal/shield known as the Bulb Shield™ Series, also manufactured by Tech-Etch, Inc. As can be seen in FIG. 13B, the third seal 84 may be clipped onto the inwardly projecting portion of the doorframe 64 such that the bulb portion 86 of the seal is in sealing contact with the interior-facing perimeter of the interior doorframe 76. If desired, commercially available adhesive may also be used to further attach the third seal 84 to the doorframe 64. However, it will be understood that other forms of seals and methods of attachment may also be employed.

In one embodiment, the floor plate 270 and the roof plate 272 may be fabricated from electrically conductive material such as aluminum and may be welded to the power module frame assembly 210 as shown in FIG. 1. In other embodiments, a layer of magnetic shield material 246 may also be associated with the floor plate 270 and the roof plate 272, if desired.

In environments wherein the enclosure 10 may encounter warm temperatures that could hamper the functioning of the electronic components therein, in addition to the air conditioner 160 and shutter and fan assembly 172, the power module 200 may be provided with a shutter and fan area 280 for cross-ventilation purposes. In this embodiment, the shutter and fan area 280 may be enclosed by electrically conductive material such as a piece of $3/16$" aluminum plate 282 or similar material that is configured as shown in FIG. 16 and that may be attached to the power module frame assembly 210 by, for example, welding. A shutter and fan assembly 172 of the type described above may be mounted in an end portion of the plate 282 as shown in FIGS. 16 and 16A.

Figure 20:
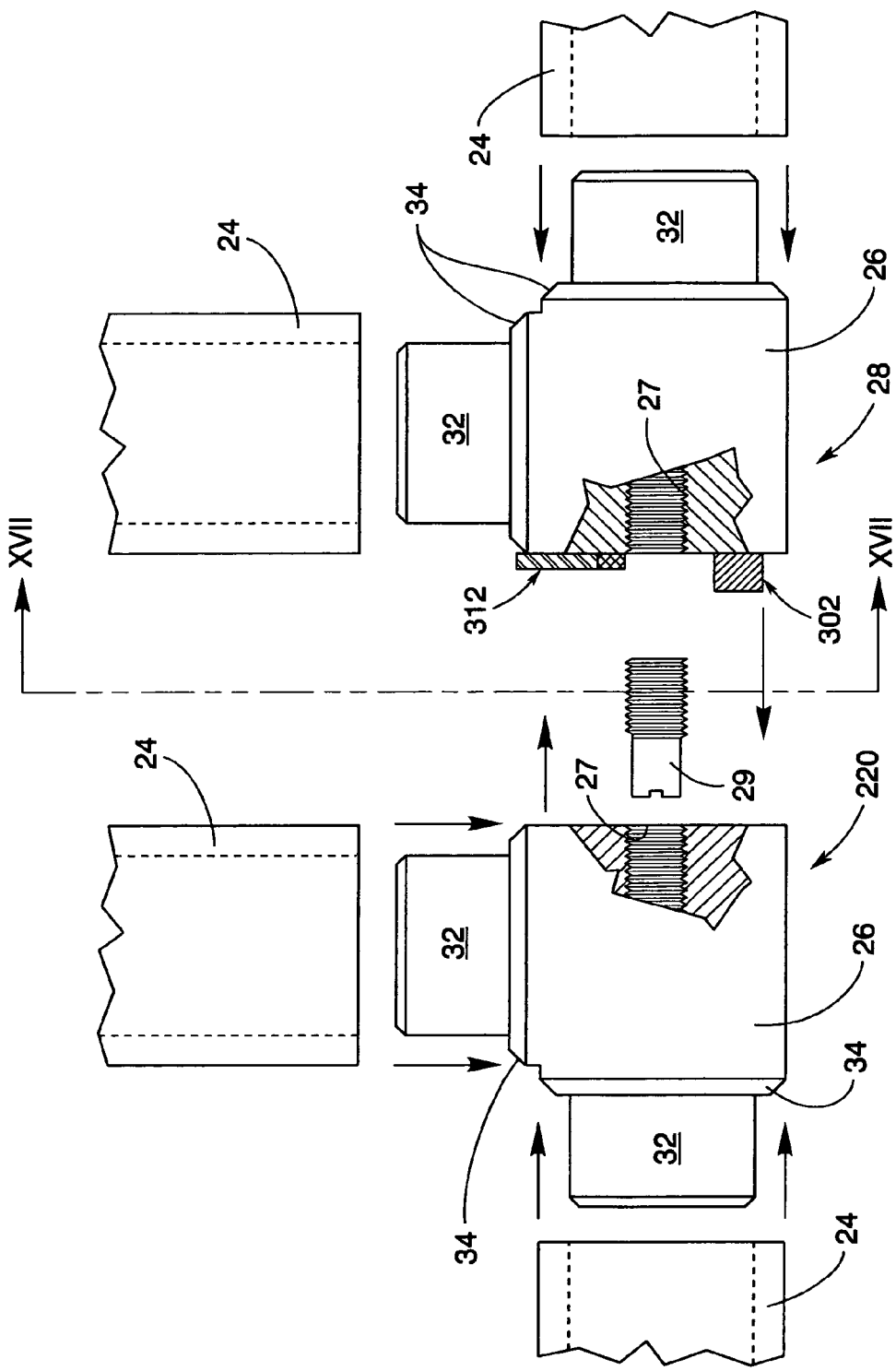
FIG. 20 is a partial exploded assembly view of a portion of an equipment module frame assembly and a power module frame assembly of one embodiment of the present invention.
Figure 21:
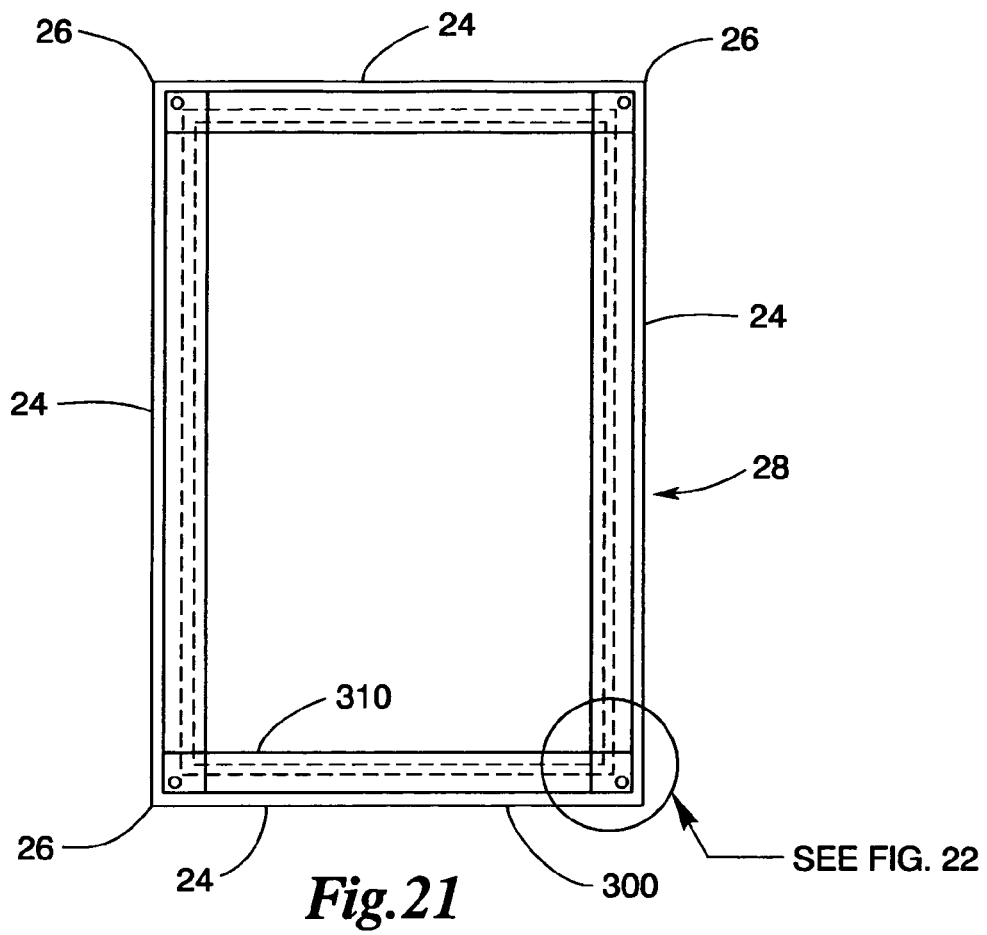
FIG. 21 is an end view of a portion of the equipment module frame assembly of one embodiment of the present invention.
Figure 22:
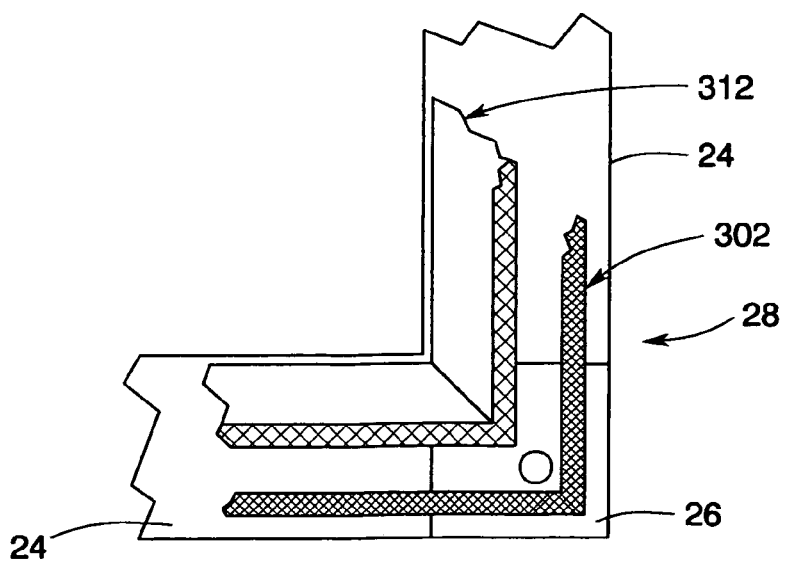
FIG. 22 is a partial enlarged view of a portion of the frame assembly depicted in FIG. 21.
Figure 23:
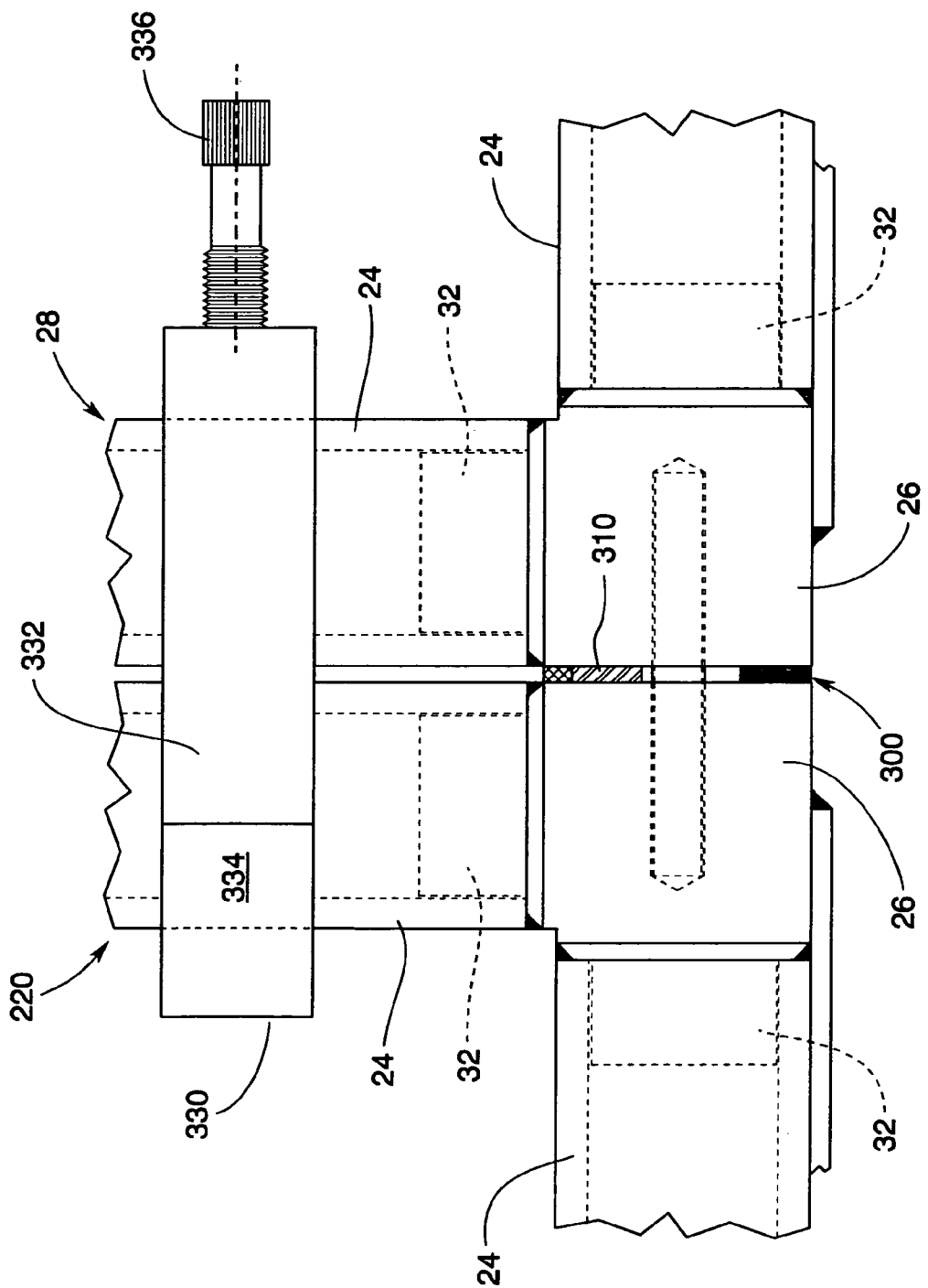
FIG. 23 is a partial assembly view of the equipment module and the power module frame assemblies of FIG. 20 coupled together with a clamp of the present invention.

In one embodiment of the present invention, the power module 200 may be interconnected to the equipment module 20 in the following manner. In the embodiment shown in FIGS. 16 and 20-23, an environmental barrier 300 may be provided between the end frame 28 of the equipment module frame assembly 22 and the end portion 220 of the power module frame assembly 210. For example, a sealant material 302 manufactured by the 3M Company of Minnesota under the trademark Mastik™ may be applied around the side perimeter of either of the end frame assemblies 28 or 220 as shown in FIGS. 22 and 23. However, other commercially available sealant material may be employed. Thus, when the end frames 28 and 220 are brought together as shown in FIGS. 15, 20, and 23, the seal material 302 forms an environmental barrier 300 between the end frames 28 and 220. Also in this embodiment, to form an RFI/EMI barrier 310 between the end frames 28 and 220, a shield member 312 may be attached to one of the end frames 28 and 220 such that it is inboard of the environmental seal 302. Such shield member 312 may comprise the serial 3000 Twin seal™ manufactured by Tech-Etch. Other environmental seal materials and shield materials may also be employed.

In this embodiment, after the environmental seal 302 and the shield member 312 have been attached to the perimeter of one of the side perimeters of one of the end frame sections 28, 220, they are positioned adjacent each other as shown in FIG. 20. To facilitate confronting alignment of the end frames 220 and 28, the corner blocks 26 may be provided with holes 27 such that, when the cornerblocks 26 in the end frames 220 and 28 are aligned with each other, the holes 27 in the confronting cornerblocks are coaxially aligned with each other. The holes 27 may be threaded to receive a threaded portion of a locating pin 29. The locating pins 29 may be screwed into holes 27 in the cornerblocks 26 of either of the end frame sections 28, 220 and left to protrude a distance therefrom such that when the end frame sections are juxtapositioned relative to each other, the protruding ends of the locator pins 29 may be inserted into the holes 27 in the cornerblocks 26. The protruding portions of the locator pins 29 may be smooth and sized to be slidably received in the threaded holes 27 in the cornerblocks 26 as shown in FIG. 20.

After the end frame sections 28, 220 are brought together, a plurality of clamp assemblies 330 may be employed to connect the end frame sections together. In one embodiment, a clamp assembly 330 may comprise a first clamp portion 332 that is interconnected to a second clamp portion 334 by a threaded screw. Turning the threaded screw 336 draws the ends of the first and second clamp sections 332, 334 together or moves them away from each other depending upon the direction of screw rotation. Those of ordinary skill in the art will appreciate that other fasteners and fastening techniques could conceivably be employed to attach the end frame sections 28, 220 together.

Figure 15A:
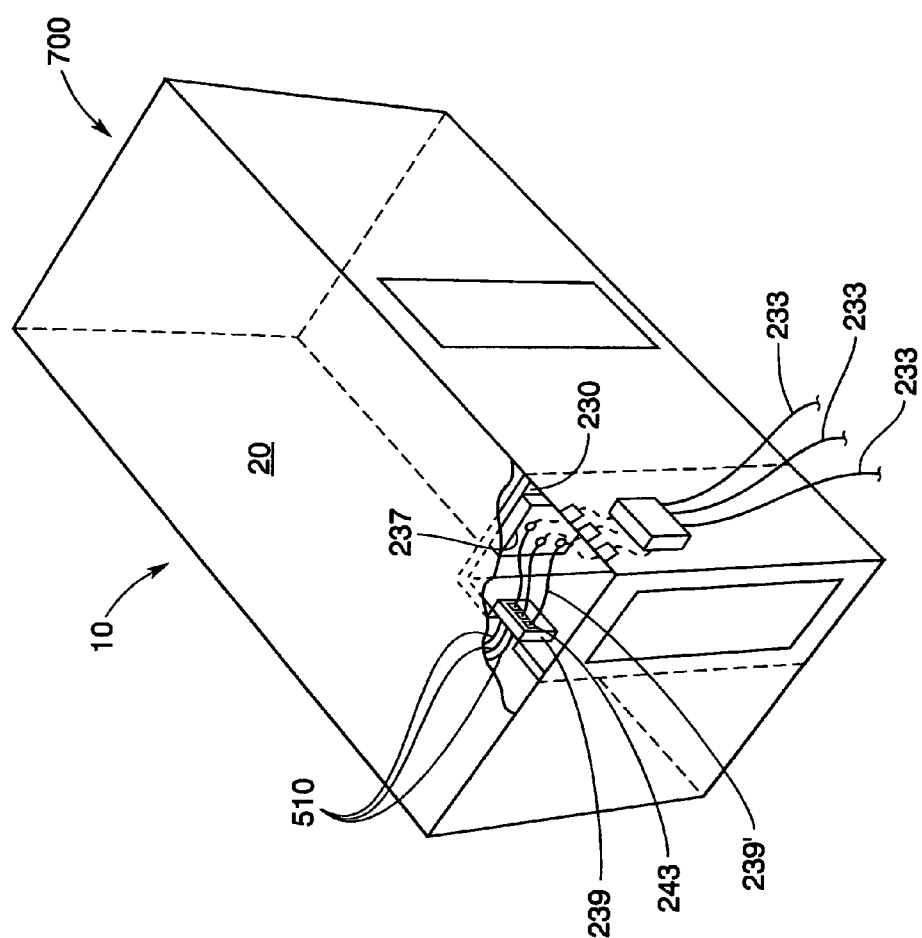
FIG. 15A is a diagrammatic perspective view of an enclosure embodiment of the present invention, with a portion of the roof removed to expose a portion of a magnetic shield enclosure supported therein.

FIG. 15A depicts the enclosure 10 after the end frame sections 28 and 220 have been clamped together in the above-described manner. In the enclosure 10 described above, the external portions of the frame assembly 22, the door assemblies 60, the roof plate 36 and the floor plate 38 of the equipment module, the walls 161, 162, 163 and floor plate 164 of the cable entry portion along with the ends of the frame assembly 210, the walls 228, the door assembly 60, 282, the floor 270 and the roof 272 of the equipment module form the "shell" 700 of the enclosure 10. Thus, in the above-described embodiment, the shell 700 is essentially fabricated from components that are fabricated from electrically conductive material such as aluminum and that are welded or otherwise fastened together. The shell 700 is essentially one common large box for electric field purposes. As will be discussed in further detail below, the power for powering components 12 within the enclosure 10 may be brought into the enclosure 10 through the magnetic field enclosure 230. Thus, the magnetic field is contained in or is otherwise prevented from entering the equipment module section 20 of the shell 700 by virtue of the magnetic shield material 246 arrangement in the power module and the various power filter arrangements which will be discussed in further detail below.

In this embodiment, the power enters the magnetic field enclosure 230 through the front wall portion 240 that shares a common exterior wall 228 with the remaining portion of the enclosure 10. In alternative embodiments, power may be brought into the magnetic field enclosure 230 through an exterior wall that is common and contiguous with an exterior wall of the remaining portions of the enclosure 10. In the embodiments depicted in FIGS. 1, 2, 16 and 16A, a conventional junction box 231, fabricated from material such as aluminum or the like, may be attached to the exterior wall 228 by welding or other fastening methods. Conventional power cables 233 may enter the junction box 231 and be coupled to power filters 235 mounted to the exterior wall 228 and extending into the magnetic shield enclosure 230. Such power filters 235 may comprise those filters manufactured by Spectrum Control, Inc. of Erie, Pa. under Model No. 52-267-026. However, other commercially available power filters may be employed. As can be seen in FIGS. 16 and 16A, in one embodiment, the power filters 235 may be coupled to a conventional breaker box or main load center panel 237 mounted within the magnetic shield enclosure 230 through cables 237'. Exiting the main load center panel 237 are cables 239' that are attached to a terminal block 239 that is attached to the rear wall 250 of the magnetic shield enclosure 230. Filters 243 are attached to the terminal block 239 and may comprise those filters manufactured by Spectrum Control, Inc. under Model No. 52-257-005A or similar commercially available filters. The reader will appreciate that the function of such filters 243 is to filter RF and EMI interference that may be carried into the magnetic shield enclosure 230 by the incoming power cables 233. Of course, other suitable filters may be employed. Appropriately sized cables 510 may then be attached between the filters 243 and the various pieces of equipment 12 contained within the enclosure 10.

Figure 24:
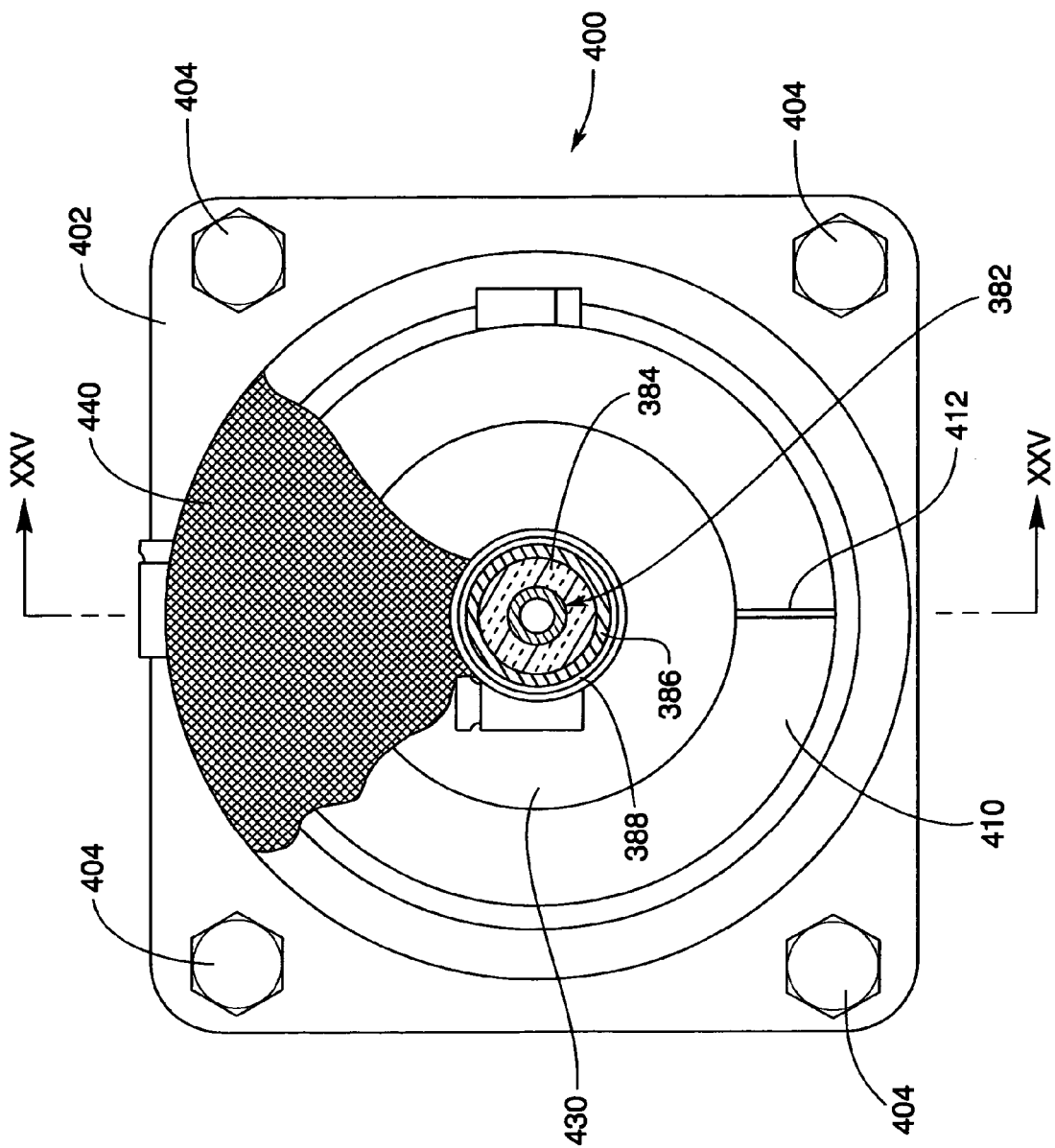
FIG. 24 is a front view of one embodiment of a cable port of the present invention.
Figure 25:
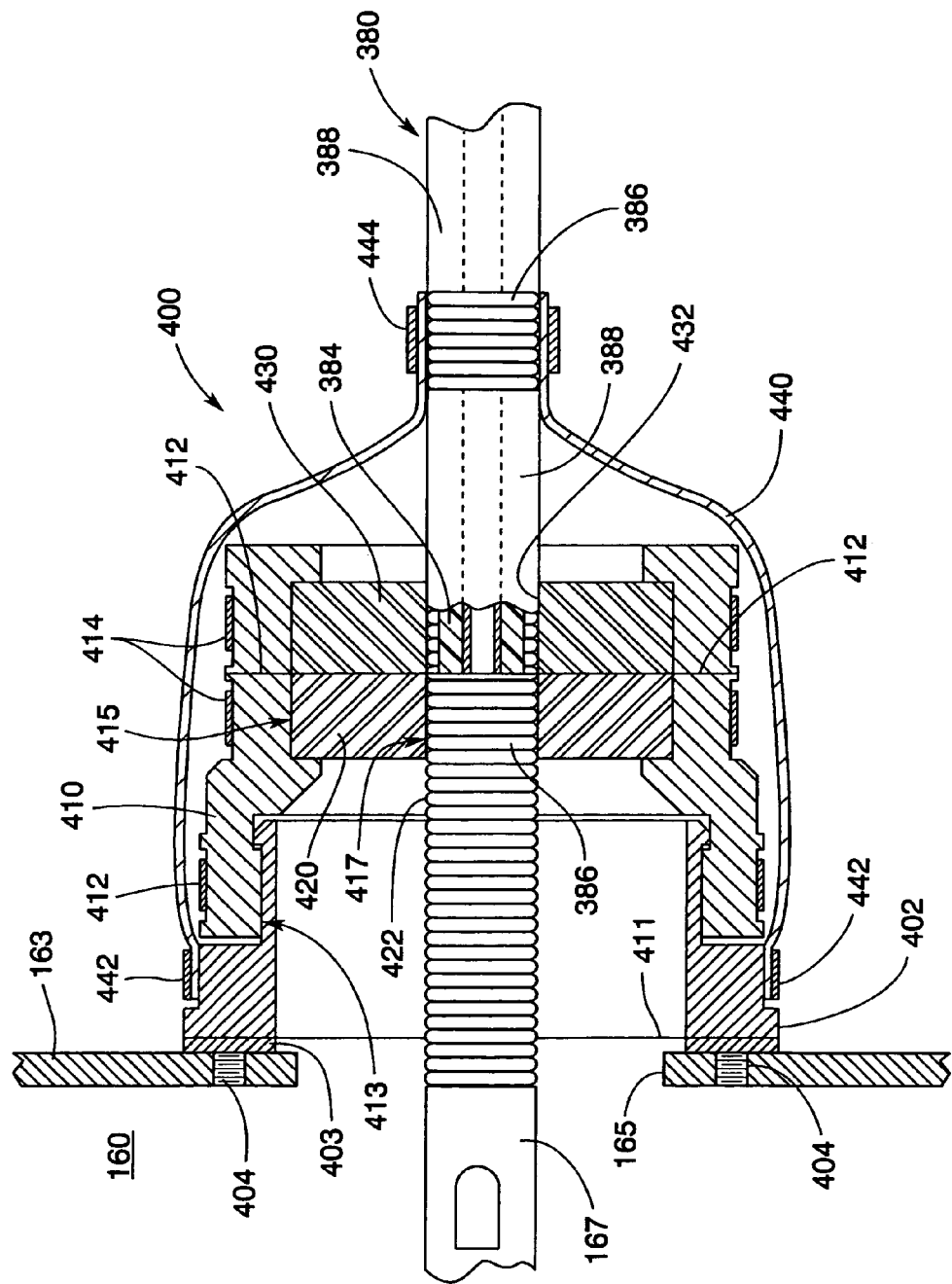
FIG. 25 is a cross-sectional view of the cable port of FIG. 24, taken along line XXV-XXV in FIG. 24.

FIGS. 24 and 25, illustrate one embodiment of an entry port 400 that may be used to supply signals to radio and cellular type equipment housed within the enclosure 10. Such ports 400 may be mounted to the cable entry portion 161 of the equipment module 20 as shown in FIGS. 1 and 2. The cable 380 that is commonly employed to supply antenna signal to such equipment is also shown in those Figures and in FIGS. 24 and 25. It will be understood that the cable 380 may have a hollow inner core conductor 382 that is fabricated from copper or similar material. The inner core conductor 382 is surrounded by an insulation material 384. An outer shield conductor 386 also fabricated from copper or similar material is coaxially aligned on the insulation material 384. The cable 380 also has an insulation sheath 388 that covers the outer shield conductor 386. See FIG. 33.

Although FIG. 1 illustrates the use of three entry ports 400, the skilled artisan will appreciate that any appropriate numbers of entry ports may be employed depending upon the power needs of the equipment housed within the enclosure 10. In the embodiment depicted in FIGS. 24 and 25, the power entry port 400 may include an attachment flange 402 that may be provided with bolt holes to facilitate attachment to the wall 163 of the cable entry portion 160 by fasteners 404. Those of ordinary skill in the art will appreciate, however, that the attachment flange 402 may be attached to the wall 163 utilizing other fastening methods such as, for example, welding. In one embodiment, the attachment flange 402 is cast or machined from the material that has the same electrical grounding properties as the material making up the exterior of the enclosure 10. For example, if the exterior of the enclosure is fabricated from aluminum, then the attachment flange 402 may also be fabricated from aluminum. In such example, the bolts 404 used to attach the attachment flange 402 to the wall 163 may be fabricated from aluminum or stainless steel. In addition, in this embodiment, a commercially available EMI/RFI flange gasket 403 may be provided between the attachment flange 402 and the wall 163. In other embodiments, however, no flange gasket may be employed thereby creating a "metal-to-metal" fit between the attachment flange 402 and the wall 163. Still in other embodiments, an O-ring 407 may be supported in an annular groove 405 provided in the flange 402 to establish a weatherproof seal between the flange 402 and the wall 163. See FIG. 25A.

Those of ordinary skill in the art will appreciate that the attachment flange 402 is attached to the wall 163 such that it covers the entry hole 165 through the wall 163 to permit the cable 380 to pass through the port 400 into the cable entry portion 160 wherein a conventional cable fastener 167 may be attached thereto. The cable 380 would then be attached to the corresponding piece or pieces of equipment 12 housed within the equipment module 20.

As can also be seen in FIG. 25, a boot assembly 410 may be coaxially received on the attachment flange 402 and be coupled thereto by a conventional adjustable strap clamp 412. In one embodiment, the boot assembly 410 is fabricated from material that is electrically compatible with the material from which the attachment flange 402 is fabricated. In one embodiment, for example, the boot assembly 410 may be fabricated from a highly electrically conductive material that is molded or otherwise formed from a flexible material such as silicone, neoprene or other synthetic flexible material with electrically conductive particles dispersed throughout interstices in the material. Such electrically conductive particles are electrically compatible with the material from which the attachment flange 402 or other components mating therewith are fabricated from. Such particles make the boot assembly electrically conductive. One preferred boot assembly is manufactured by Pioneer Energy Products LLC ("PEPRO") having an address of P.O. Box 1061, Franklin, Pa. 16323.

Also in this embodiment, a first retainer shield or donut 420 may be supported within the interior of the boot assembly 410 as shown in FIG. 25. Such first retainer shield 420 has a hole 422 therethrough sized to receive a portion of the cable 380 therethrough. As can be seen in that Figure, a portion of the cable sheath 388 is removed to permit the outer shield conductor 386 to be in contact with the first retainer shield 420. To facilitate easy installation of the first retainer shield 420 onto the outer shield conductor 386 of the cable, a slit (not shown) may be provided through the first retainer shield 420 to enable it to flex open slightly during installation. In one embodiment, the first retainer shield 420 may be fabricated from the same material from which the boot assembly 410 is fabricated from. Those of ordinary skill in the art will appreciate that the first retainer shield 420 may be compatible with copper and with the boot assembly 410 which may be compatible with aluminum. Such elements may be fabricated from appropriate types of metal filings embedded in a silicone core. To prevent the metal filings from possibly deteriorating, it may be desirable for them to be compatible with each other.

As can be seen in FIG. 25, different areas of compatibility may be provided between the various elements of the entry port 400. For example, in those embodiments that employ an attachment flange gasket 403, a first annular area of compatibility 411 may be provided between the end of the attachment flange gasket 403 and the exterior wall portion 163. A second annular compatibility area 413 may be provided between the attachment flange 402 and the boot assembly 410. In addition, a third annular compatibility area 415 may be provided between the exterior of the first retainer shield 420 and a portion of the boot assembly 410. The first retainer shield 420 may also define a fourth annular compatibility area 417 between the first retainer shield 420 and the exposed outer shield conductor 386 of the cable 380.

Also in this embodiment, a second retainer donut or shield 430 may be employed and positioned within the boot assembly 410 adjacent to the first retainer shield 420. The second retainer shield 430 has a hole 432 therethrough that is sized to receive the cable 380 therein such that the exterior sheath 388 of the cable 380 contacts the second retainer shield 430. In one embodiment, the second retainer shield 430 is fabricated from silicone which serves to weatherproof the penetration into the enclosure. To facilitate easy installation of the second retainer shield 430 onto the cable 380, a slit (not shown) may be provided in the second retainer shield 430 to enable it to flex open during installation. In one embodiment to facilitate installation of the first retainer shield or first and second retainer shields 420, 430 into the boot assembly 410, the installer may create one or more small slits 419 in portions of the boot assembly 410 to permit a portion of the outer perimeter of the boot assembly 410 to be peeled apart and flexed to a position wherein the first and second retainer shields 420, 430 are positioned as shown in FIG. 24. Thereafter, a pair of adjustable strap clamps 414 may be used to clamp the boot assembly 410 and the first and second retainer shields 420, 430 to the cable 380.

Figure 25B:
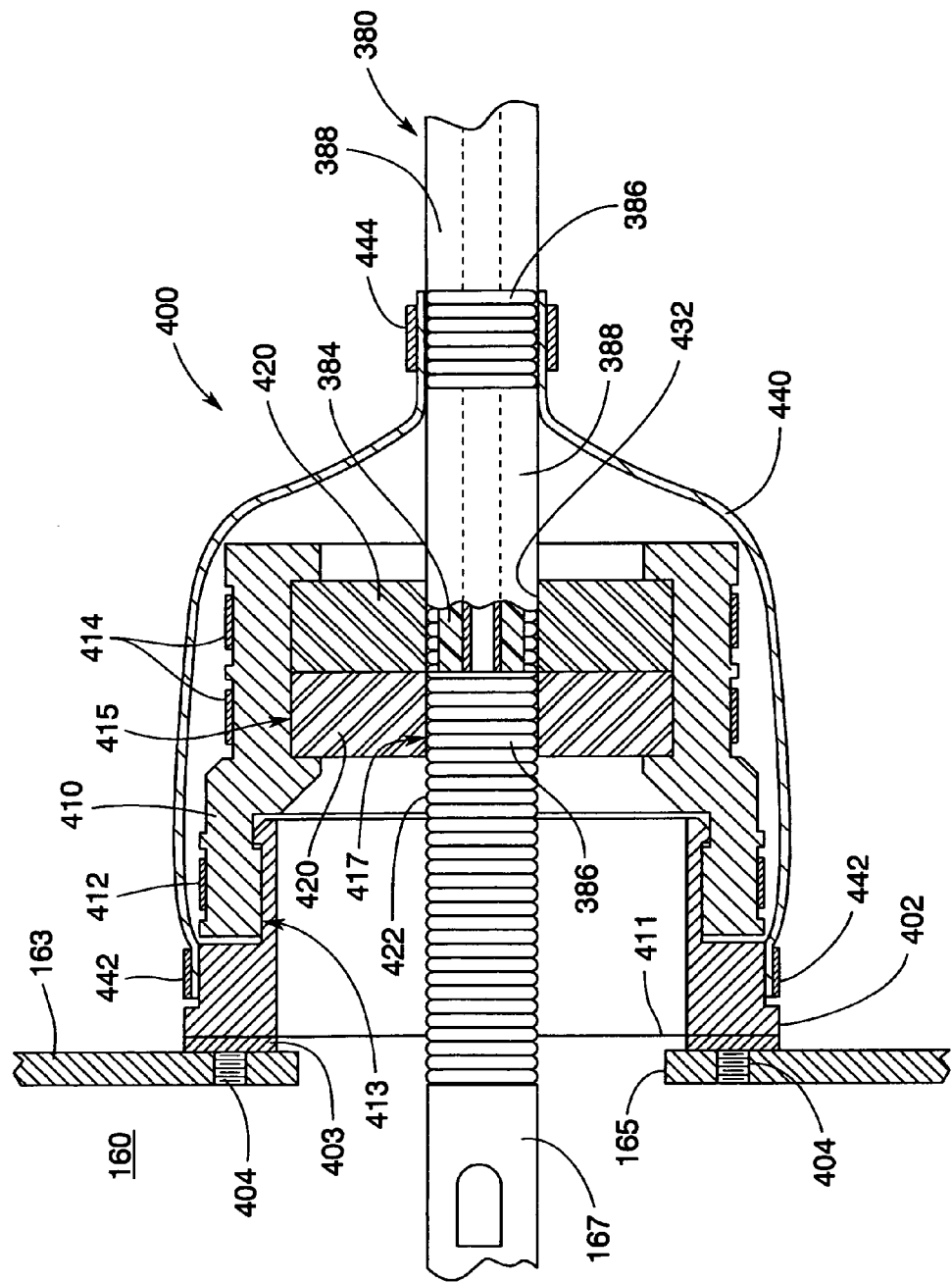
FIG. 25B is a cross-sectional view of another cable port embodiment of the subject invention.

In other embodiments, the second retainer shield 430 may be replaced with another first retainer shield 420 to increase conductivity and EMI & RFI to a higher level or, if desired, one larger (thicker) first retainer shield could be used. The outermost first retainer shield 420 would perform the weatherproofing function of the second retainer shield 430 employed in the embodiment described above. See FIG. 25B.

The skilled artisan will appreciate that the entry port embodiments 400 of the present invention serve to substantially reduce the amount of RFI/EMI entering into the enclosure 10 from the cable 380 by channeling the interference from the outer shield conductor 386 to the first retainer shield 420 to the boot assembly 410 to the attachment flange 402 and through the flange gasket 403 before entering the enclosure 10.

Figure 25C:
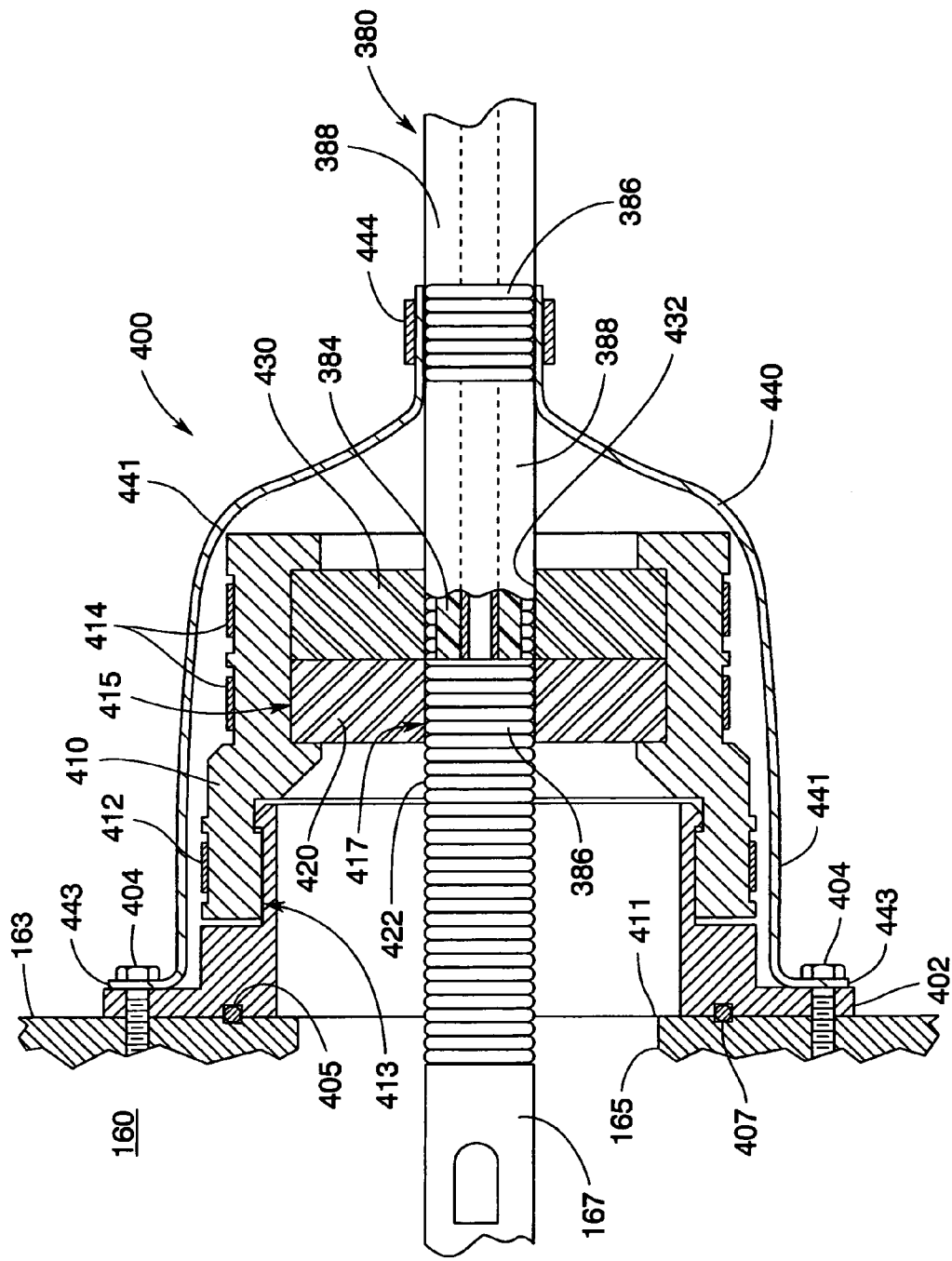
FIG. 25C is a cross-sectional view of another cable port embodiment of the subject invention.

In one embodiment of the present invention, if desired, an auxiliary shield 440 may be affixed to the entry port assembly 400 to enhance its shielding capabilities. As can be seen in FIGS. 24 and 25, the auxiliary shield 440 may be flexible and shaped to be placed around the exterior of the entry port 400. In one embodiment, the shield assembly 440 may be fabricated from electrically conductive silver plated copper mesh or tinned braided copper or similar material. One portion of the shield assembly 440 may be clamped around the perimeter of the attachment flange 402 with a conventional adjustable conduit clamp 442. If necessary to facilitate installation, slits (not shown) may be provided through the shield assembly 440. Another portion of the shield assembly 440 may be clamped to the outer shield conductor 386 of the cable 380 also with a conventional adjustable conduit clamp 444 as shown in FIG. 25. In alternative embodiments, strips 441 of the above-identified shield material 440 may be clamped onto the outer shield conductor 386 with the conduit clamp 444 and the other ends 443 of the straps 441 may be attached to the attachment flange 402 by fasteners 404. See FIG. 25C.

Figure 26:
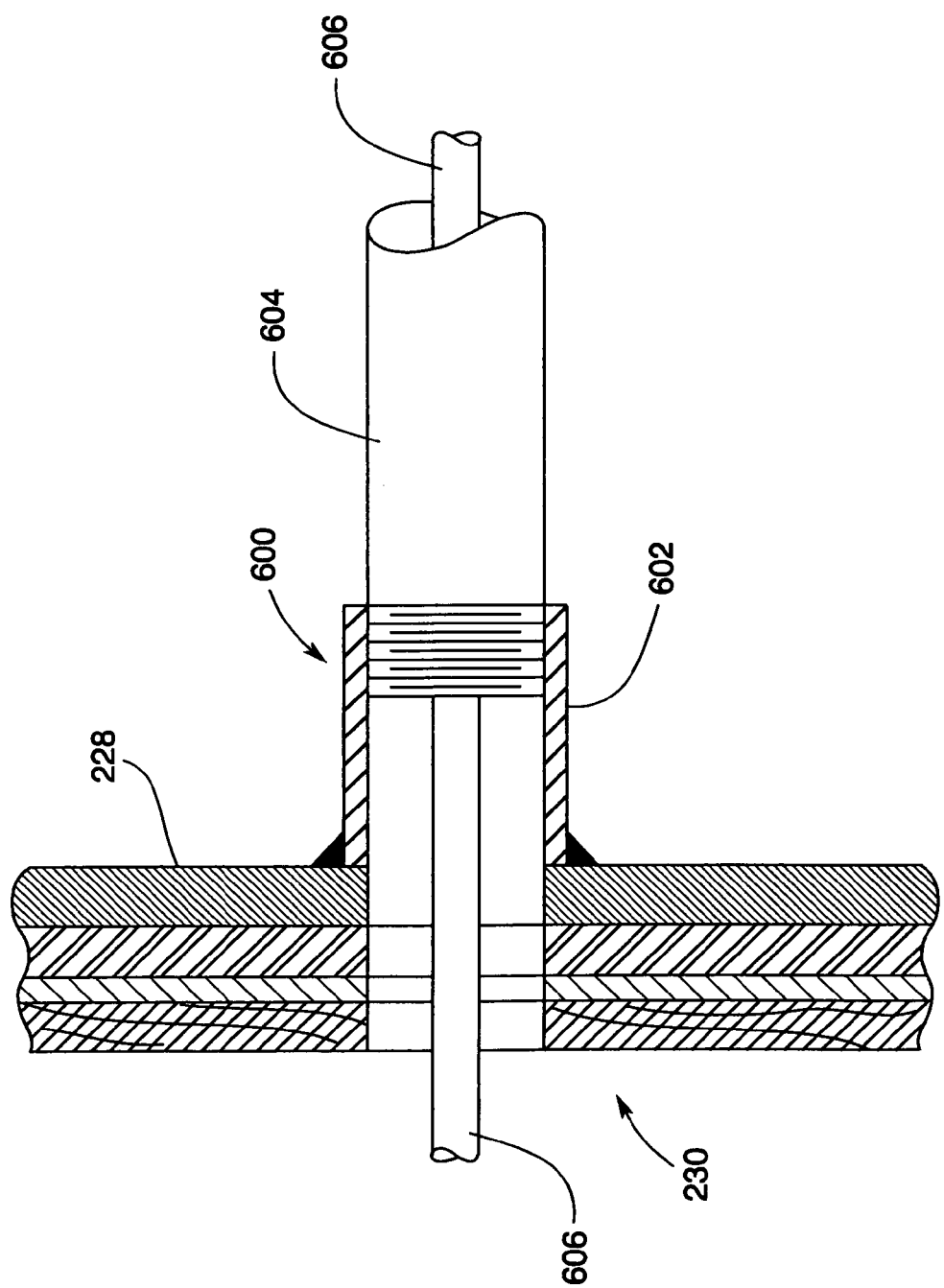
FIG. 26 is a cross-sectional view of another cable port embodiment of the present invention.

FIG. 26 illustrates an alternate cable entry port 600 that may be used in connection with the present invention. The cable entry port 600 comprises a threaded socket 602 that is welded or otherwise attached to the wall 163 of the cable entry portion 160. The socket 602 is adapted to be attached to corresponding threaded conduit 604 that is carrying one or more cables 606 therein. The cable 606 extends through the conduit 604 and socket 602 and into the cable entry portion 160 of the equipment module to be coupled to the corresponding pieces of equipment 12 housed therein. In one embodiment, the threaded socket 602 is fabricated from the same material that comprises the wall 228. For example, the threaded socket may be fabricated from aluminum.

In embodiments wherein the equipment 12 within the enclosure may be connected to instrumentation and other equipment, such as, for example, meters, transducers, etc, that are located outside of the enclosure 10, cable entry ports 400 and/or 600 may be installed in the wall of the cable entry portion 160 to facilitate passage of cables 622 from equipment 12 to the instrumentation.

Thus, in this embodiment, the shell 700 is fabricated from an electrically conductive material such that when a lightning strike hits in the vicinity or otherwise communicates with the enclosure 10, the shell 700 provides a path for the electric current to safely reach ground. In one embodiment, a commercially available grounding rod 800 (preferably 5'-6' long) is inserted into the earth and is connected to the enclosure by a copper wire 802 or other suitable conductor. See FIG. 1. Thus, when the shell 700 conducts electrical current from a lightning strike, the energy passes through the conductor 802 to the grounding rods 800 to the earth to "ground" the enclosure 10. The skilled artisan will, of course, appreciate that the number, size, composition of grounding rods 800 and even the grounding method employed could vary depending upon the type, size, shape, composition, etc. of the enclosure. The skilled artisan will appreciate that electrical current is conducted through the shell 700 to ground. As the current passes through the shell 700 it establishes an eddy current field (magnetic field) in the shell 700 that serves to repel magnetic fields that occur external to the shell 700 to prevent such externally occurring fields from damaging or interfering with the equipment 12 housed within the enclosure 10.

As was discussed above, in this embodiment, the magnetic field enclosure 230 shares a wall portion 228 with the shell 700. The external power is brought into the enclosure 10 through the common wall portion 228 and into the power filters mounted to the magnetic shield enclosure 230. The power entering the enclosure 10 through the common wall 228 also results in the establishment of eddy currents in the shell 700 which also serve to repel magnetic fields established outside of the enclosure 10. Those of ordinary skill in the art will appreciate that the magnetic field enclosure 230 serves to contain the magnetic field entering the shell 700 on the cables 233 that enter the enclosure 10. The power cables 233 are attached to filters 235 which are connected to a main load center panel 237. The main load center panel 237 is then attached to filters 243 which enable the power to be distributed to the components 12 within the enclosure while substantially preventing magnetic fields contained within the shielded enclosure from entering the equipment module 20. Thus, the magnetic field enclosure 230 is effectively grounded at the cable entry point and at the terminal block.

Figure 27:
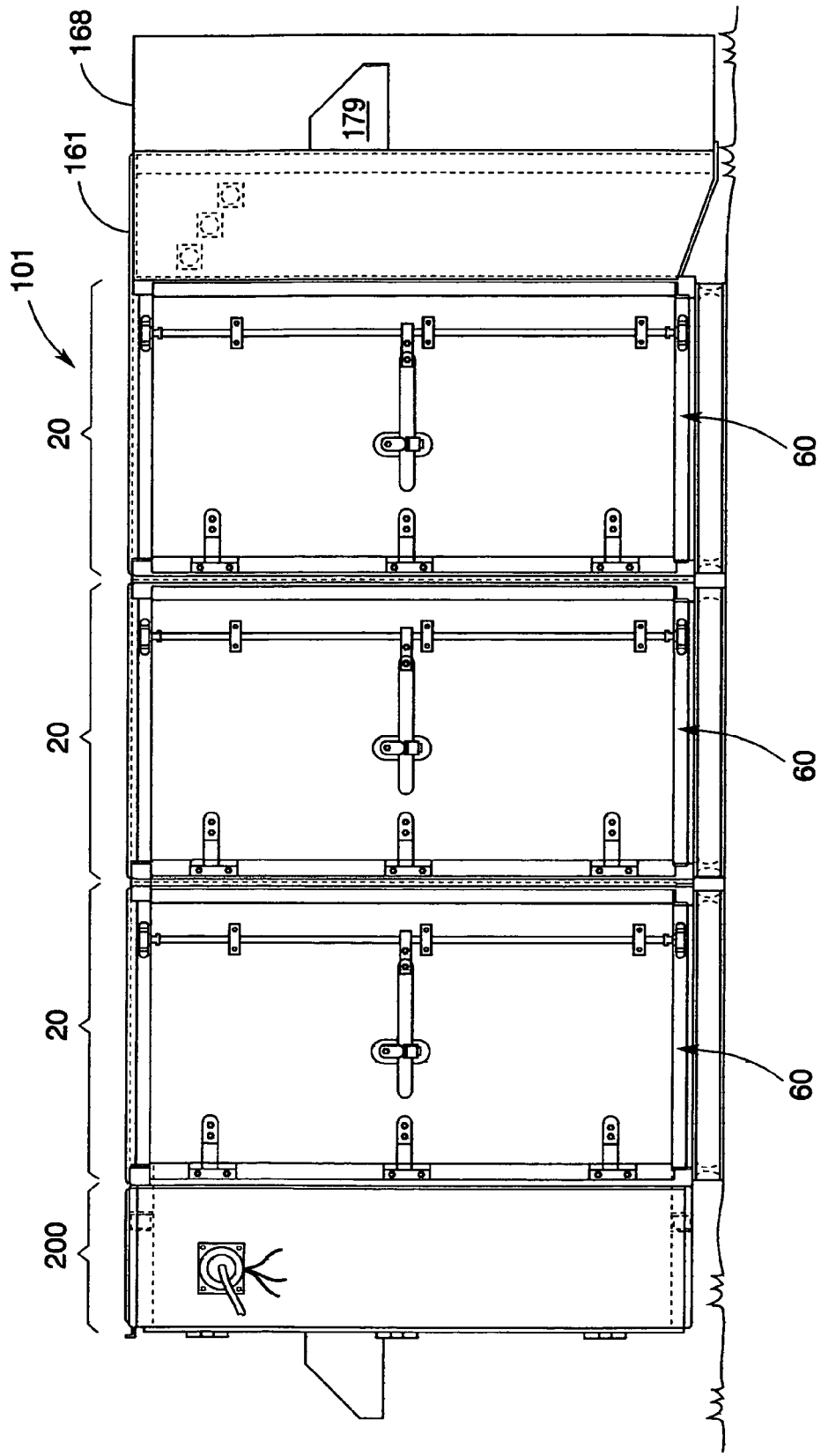
FIG. 27 is a side elevational view of another enclosure embodiment of the present invention.

Those of ordinary skill in the art will readily appreciate that the size and shape of the enclosure 10 may be varied without departing from the spirit and scope of the present invention. For example, FIG. 27 illustrates an enclosure 10' that may be fabricated in the above described manners and be provided with three interconnected equipment modules 20 and a power module 200 that may be constructed with the components and methods described above. FIG. 27A illustrates one embodiment with one power module 200 and one equipment module 20. FIG. 27B illustrates an embodiment that has one power module 200 and two equipment modules 20. FIG. 27C illustrates an embodiment with one power module 200 and three equipment modules 20. FIG. 27D illustrates an embodiment with one power module 200 and four equipment modules 20. Other numbers of equipment modules, door enclosures, fan and vent arrangements may be employed without departing from the sprit and scope of the present invention.

Figure 28:
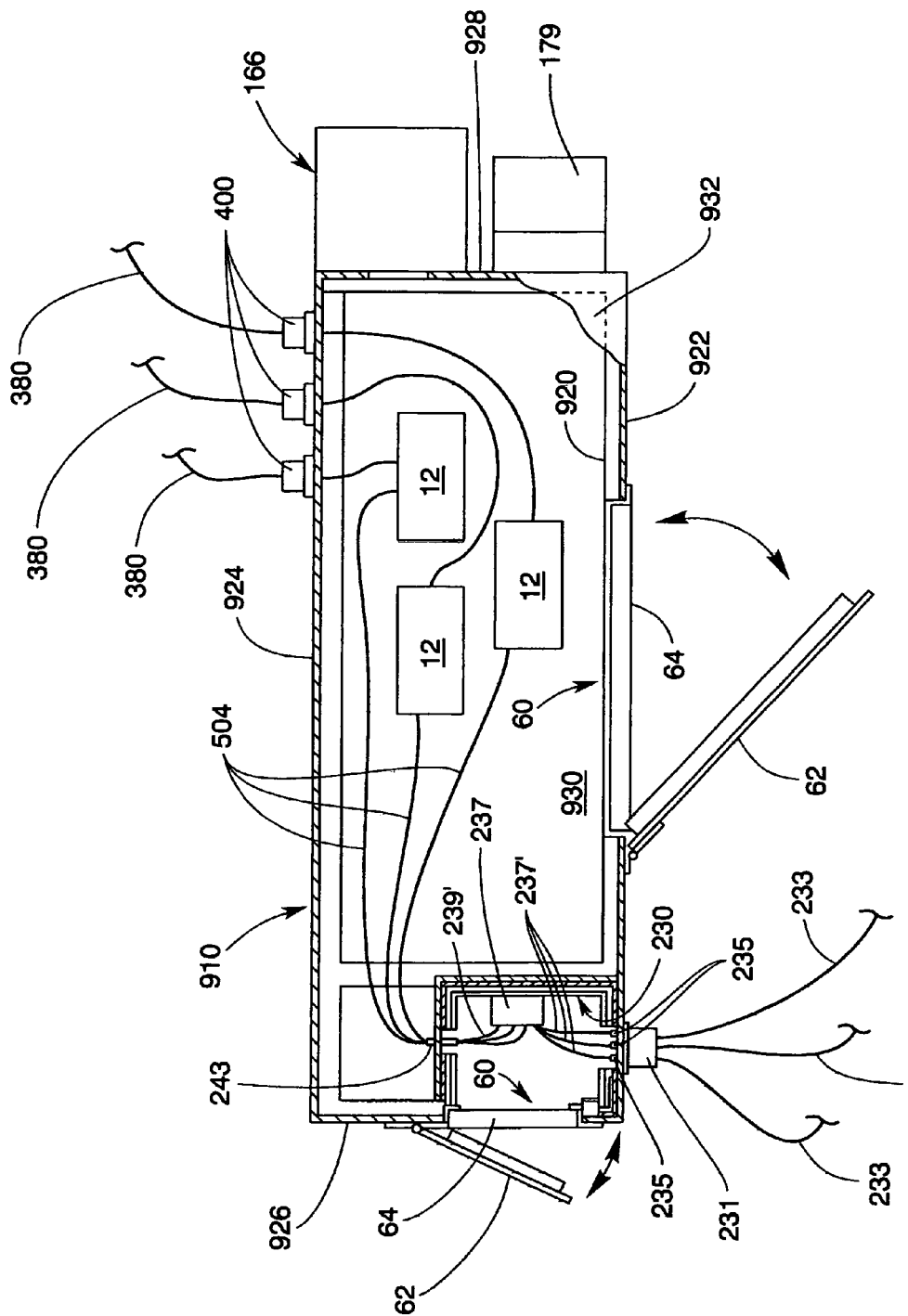
FIG. 28 is a top cross-sectional view of another enclosure embodiment of the present invention.

The skilled artisan will further appreciate that the enclosure 10 may have a common frame assembly as an alternative to the modular frame arrangements of the enclosures described above. More particularly and with reference to FIG. 28, an enclosure 910 is shown that has a frame assembly 920 that may be fabricated from tubular material such as tubular aluminum pieces that are welded together. Attached to the frame assembly 920 is a front wall 922, a rear wall 924, two end walls 926, 928, a floor 930 and a roof 932 which may all comprise aluminum plate or plate material fabricated from the same or similar material from which the frame assembly is fabricated. The floor 930 may be mounted on aluminum or similar I-beams and channels (not shown) as was described above. Door entries 60 may be provided in the front wall 922 and end wall 926 and other walls as desired. The doors 62 and doorframes 64 may be fabricated in the manners described above.

In this embodiment, a magnetic field enclosure 230 which may be fabricated in the manners described above, shares the front wall 922. Power is brought into the magnetic field enclosure 230 in the manners described above. That is the power cable(s) 233 may enter a junction box 231 attached to the exterior wall 922 and be attached to corresponding power filters 235 mounted in the exterior wall 922 as described above. The power filters 235 are then attached to a main load center panel 237 that may contain circuit breakers (not shown). The main load center panel may then be coupled to one or more filters 243 mounted in a terminal block 239 through cables 239'. Cables 504 then transport the power from the filters 239 to the components 12 housed within the enclosure 910. If the components 12 communicate with equipment located external to the enclosure 910 through cables 380, the cables 380 may exit the enclosure 920 through ports 400 or, for example, ports 600 of the type described above. In this embodiment, anyone of the door embodiments depicted in FIGS. 5, 13, 13A, and 13B could conceivably be employed in connection with the magnetic shield enclosure 230. The shielding action of the enclosure 910 operates in the same manner as was described above for enclosures 10 and 10'.

Figure 29:
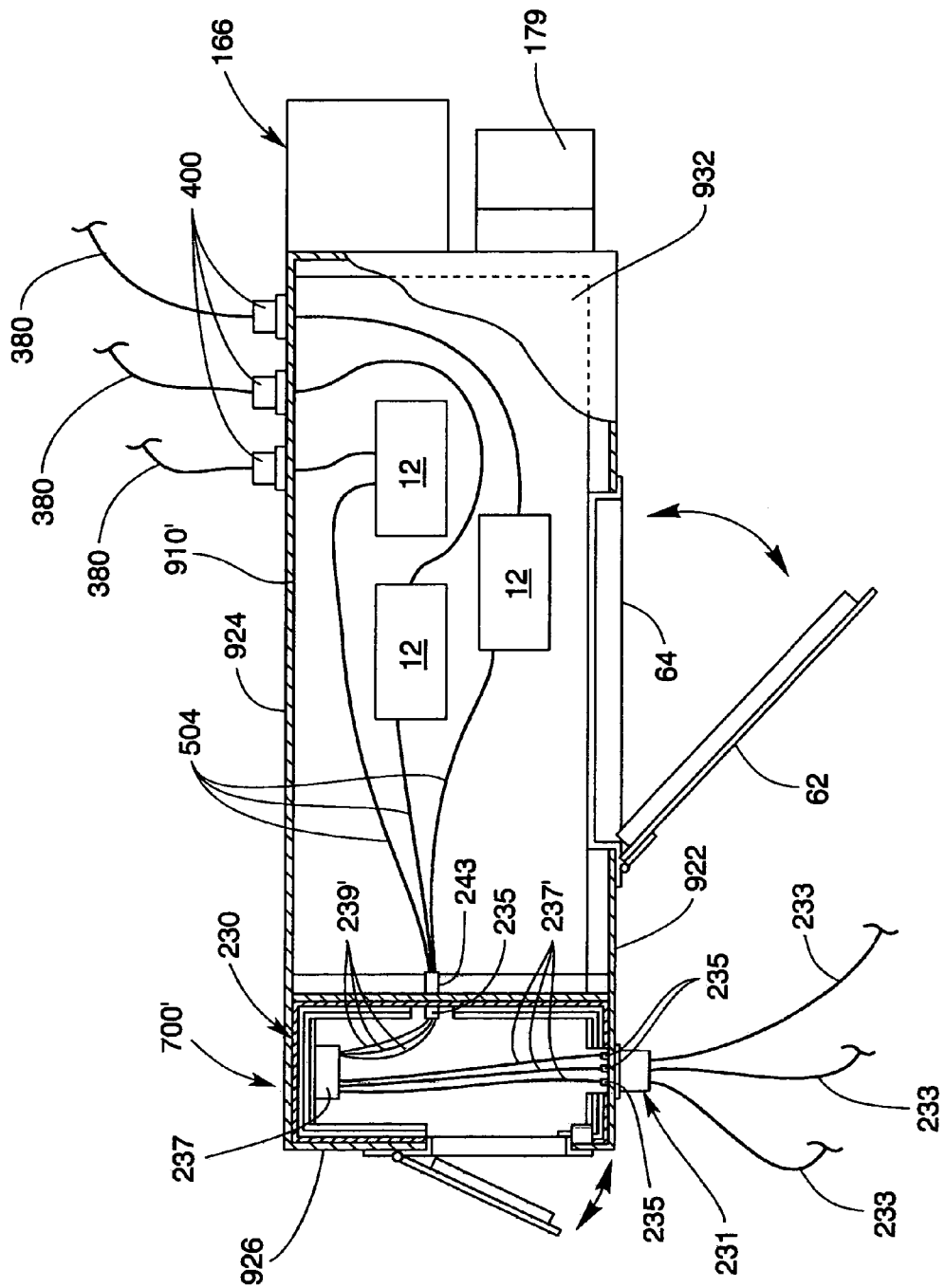
FIG. 29 is a top cross-sectional view of another enclosure embodiment of the present invention.

FIG. 29 illustrates another enclosure embodiment 910' which may be identical in construction to enclosure 910 described above. However, in this embodiment, the magnetic field enclosure 230 shares front wall 922, rear wall 924 and end wall 926 of the shell 700'. The reader will also appreciate that the enclosure 910 operates in the manners described above with respect to enclosure 10.

Figure 30:
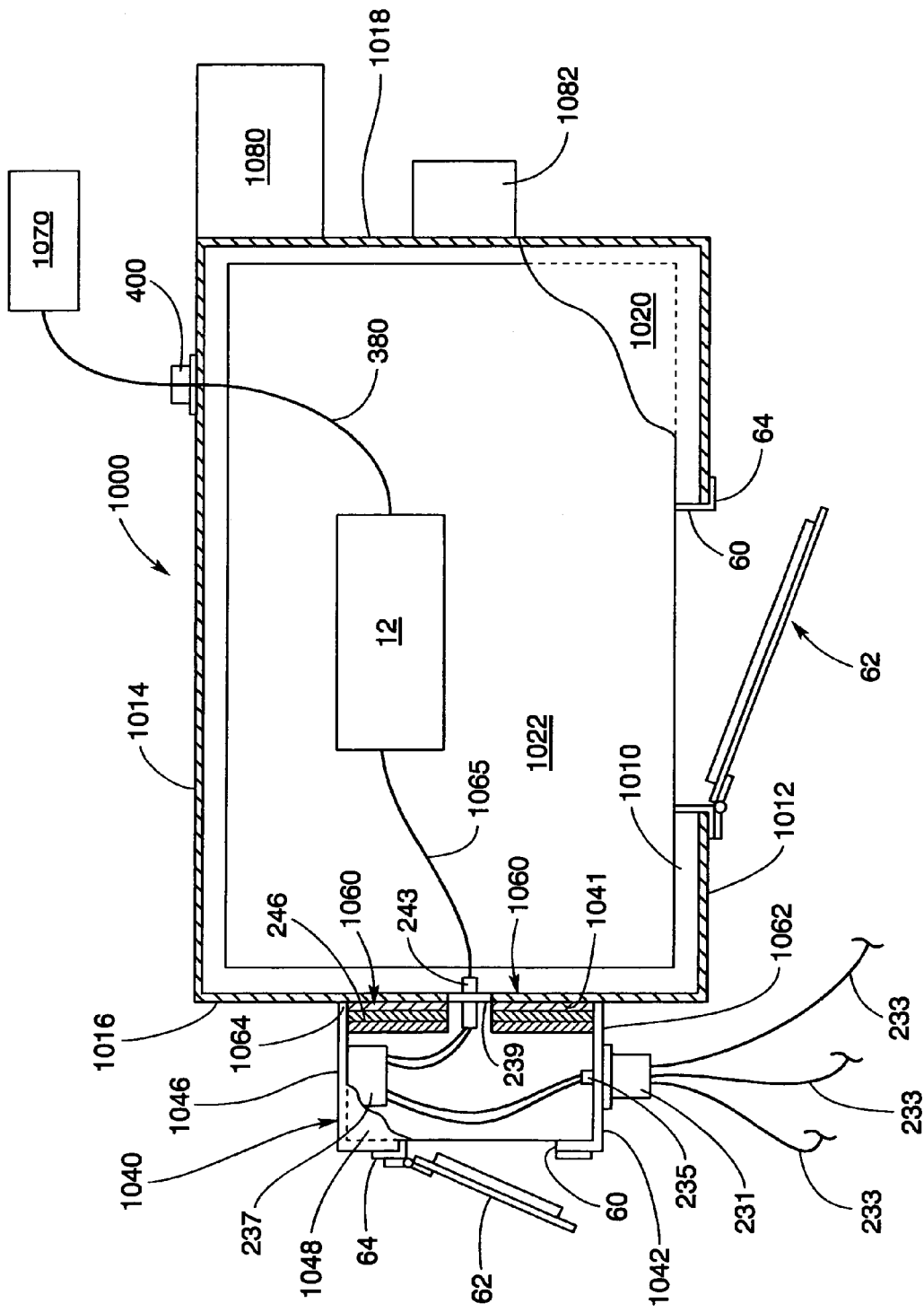
FIG. 30 is a top cross-sectional view of another enclosure embodiment of the present invention.

FIG. 30 illustrates another enclosure 1000 of the present invention. In this embodiment, the enclosure 1000 may have a frame assembly 1010 that is fabricated from electrically conductive material. A front wall 1012, a rear wall 1014, and two end walls 1016 and 1018 may be attached to the frame assembly 1010. The walls 1012, 1014, 1016, 1018 may be fabricated from electrically conductive material such as, for example, aluminum and be attached to the frame assembly by welding.

One or more door entries 60, which include the doorframes 64 and door 62 of the types described above may be provided in one or more of the walls 1012, 1014, and 1018. In addition, a roof 1020 and a floor 1022 may also comprise electrically conductive material such as aluminum and be attached to the frame assembly 1010 by welding. The above-mentioned components, i.e., frame assembly 1010, walls 1012, 1014, 1016, 1018, roof 1020, floor 1022 and doorframe 64 and door 62 serve to comprise a shell designated as 1030. The shell 1030 may be grounded in the manners described above.

Also in this embodiment, a magnetic shield enclosure 1040 is attached to the end wall 1016 such that wall 1016 forms a common exterior wall portion 1041 therebetween. In this embodiment, the magnetic shield enclosure 1040 may be fabricated from electrically conductive material such as aluminum plate to form walls 1042, 1044 and 1046, a roof 1048 and a floor 1050. A door entry 60, including door 62 and a doorframe 64, may be provided in wall 1046. Magnetic shield material 246 may be attached directly to one or all of the wall portions by adhesive or, if desired, a filler material 1060, such as plywood 1062 and/or insulation 1064 may be provided between the magnetic shield material 246 and the wall portions. It will be understood, however, that the plywood may or may not be used. The magnetic shield material 246 may be attached to the plywood 1062 which may be attached to the insulation 1064 which may be attached to the common exterior wall portion 1041. Power cables 233 may enter through a junction box 231 attached to the wall 1042. The cables 233 may then be coupled to power filters 235 mounted in the wall 1042. The power filters 235 may then be coupled to a main load center panel 237 that may contain circuit breakers. The circuit breaker are then coupled to filters 243 mounted in a terminal block 239 mounted in the wall 1060 through cables 239'. The filters 243 may be connected to the equipment 12 housed within the shell 1030 through cables 1065. If desired, ports 400 or 600 may be provided in wall 1014 to permit the passage of cables 1067 from equipment 12 to equipment 1070 located external to the enclosure 1000. Also if desired, an air conditioner 1080 and shutter and fan assembly 1082 of the types described above may be mounted to the end wall 1018. Those of ordinary skill in the art will appreciate that enclosure 1000 operates in the same manners as described above with respect to enclosures 10 and 10'.

FIGS. 31-39 illustrate various embodiments of cable entry port assemblies of the present invention that may be attached to an exterior wall of a building, enclosure, shelter, etc. for facilitating entry of a power or other cable into the building while significantly reducing the amount of electrical current resulting from a lightning strike occurring in the vicinity of the building or structure from passing into the structure on the cable. As the present Detailed Description continues, it will be understood that various cable entry port assemblies of the present invention may be effectively used on buildings, enclosures, shelters, etc. regardless of the types of materials that comprise the structure's exterior walls. For example, the structure's walls may be made from metal, wood, brick, masonry, etc. or a combination of two or more of these materials.

Figure 31:
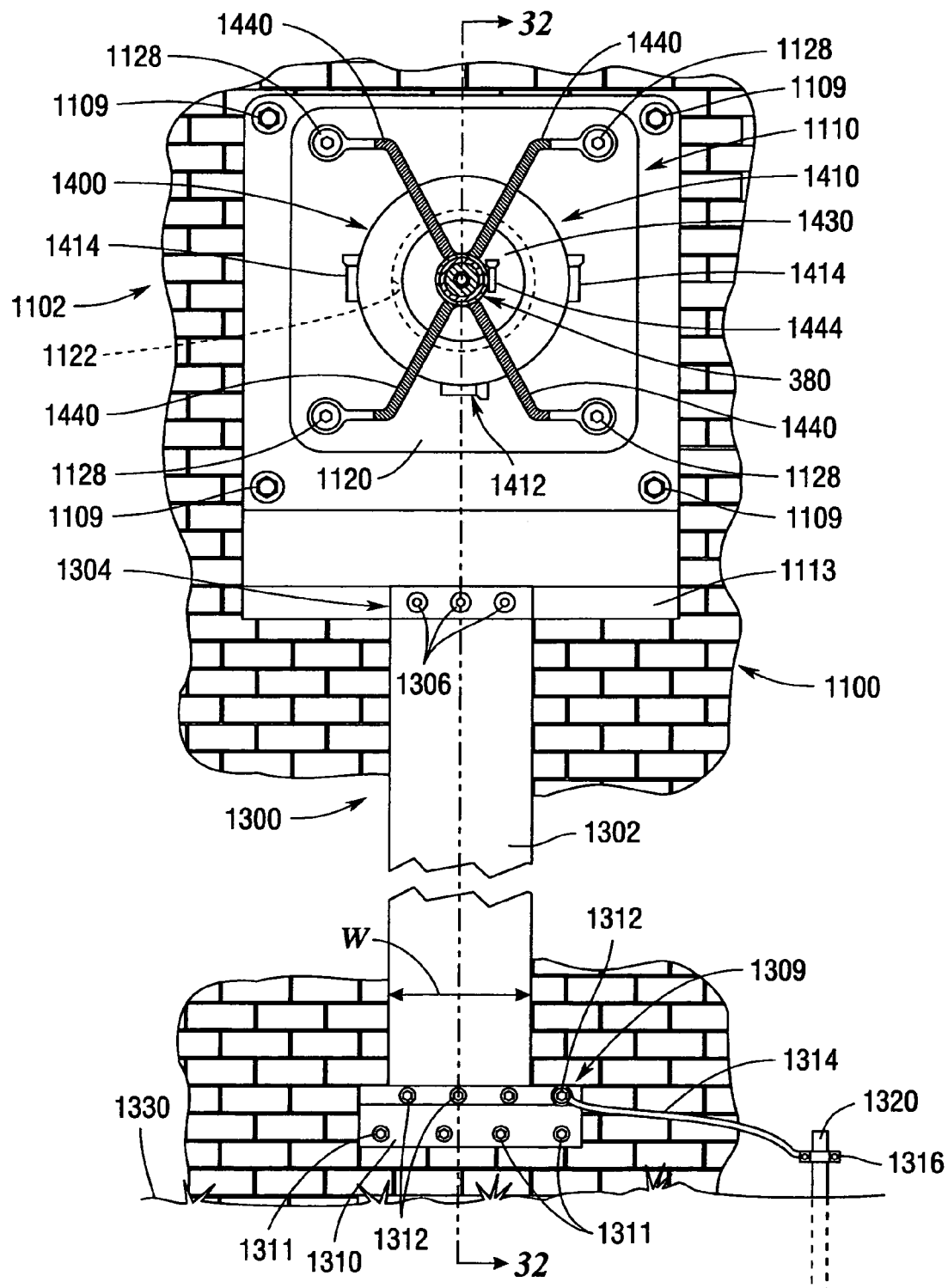
FIG. 31 is a front elevational view of a cable entry port assembly of one embodiment of the present invention attached to a building.
Figures 32, 33:
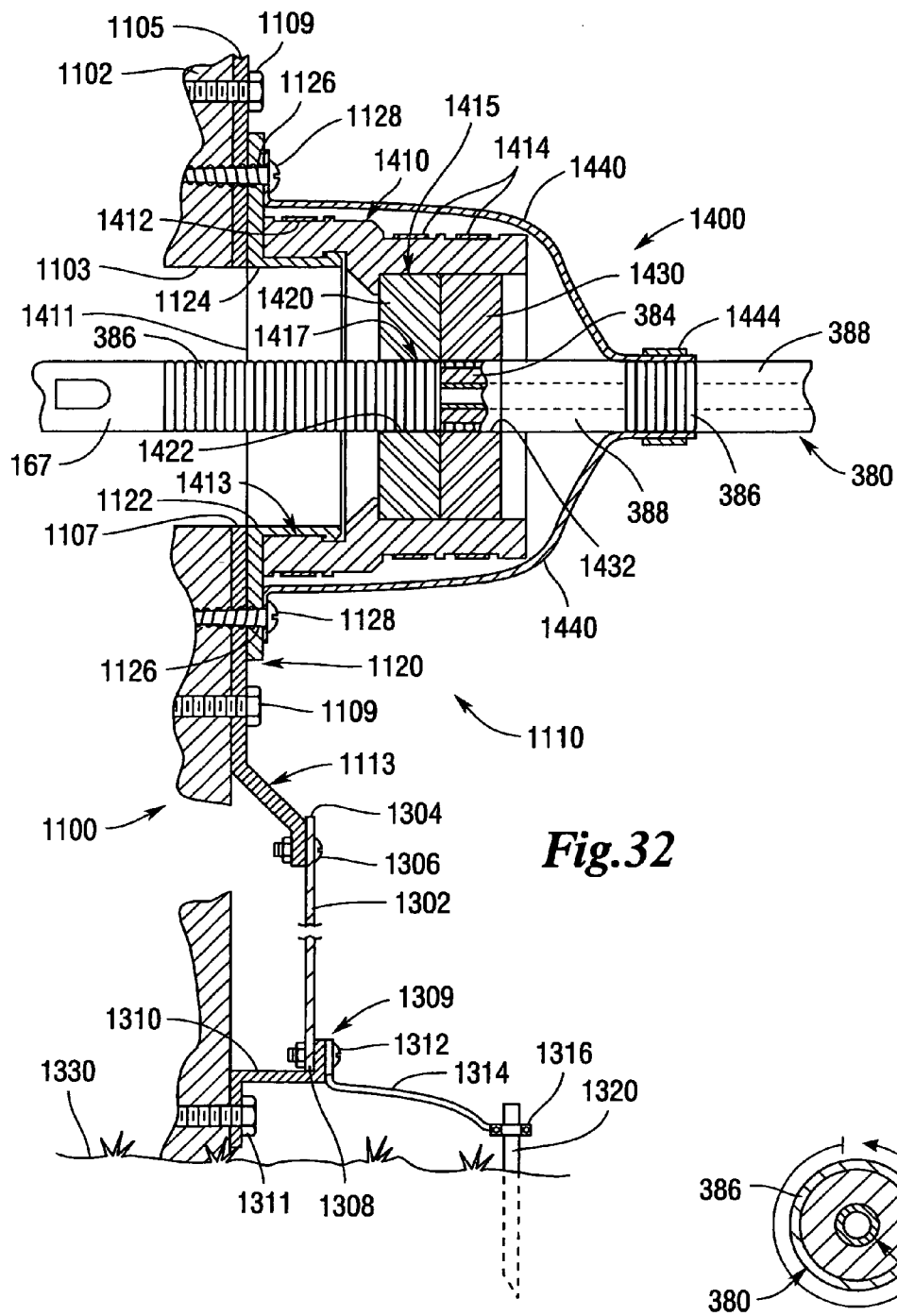
FIG. 32 is a partial cross-sectional view of the cable entry port assembly of FIG. 31.
FIG. 33 is a cross-sectional end view of a piece of cable supported by the boot assembly of the cable entry port assembly of FIGS. 31 and 32.

More particularly and with reference to FIGS. 31 and 32, there is shown a cable entry port assembly 1110 that may be attached to an exterior wall 1102 of a structure 1100 for facilitating entry of a power cable 380 through a cable-receiving opening 1103 in the wall 1102. In one embodiment, a mounting plate 1105 may be attached to the exterior wall 1102 of the structure 1100 by conventional fasteners 1109, such as screws, bolts, masonry fasteners, etc. The mounting plate 1105 also has a cable-receiving hole 1107 through which the cable 380 extends and may be fabricated from aluminum, copper or other electrically conductive material.

This embodiment of the cable entry port assembly 1110 includes an entry plate 1120 that has a cable entry hole 1122 therethrough and a mounting flange 1124 protruding therefrom. The entry plate 1120 may be fabricated from aluminum, copper, and other electrically conductive materials and be provided with a series of mounting holes 1126 therethrough for attaching the entry plate 1120 to the mounting plate 1105 by bolts, screws, or other suitable fasteners 1128. See FIG. 32. It is also conceivable that the entry plate 1120 could be welded to the mounting plate 1105 when the mounting plate materials could accommodate such method of attachment. The mounting holes 1126 could be preformed in the mounting plate 1120 or they may be formed during installation using power tools. If self tapping screws are used, the self tapping screws might also form the holes. In instances wherein an entry plate arrangement already exists, the mounting holes may be predrilled to match the existing mounting holes so that the installer may simply remove the existing entry plate and replace it with the entry plate 1120 utilizing the same mounting holes and possibly the same fasteners.

In this embodiment, an entry port 1400 that is substantially identical in construction as entry port 400 described above is attached to the mounting flange 1124 to facilitate entry of a power cable 380 into the building 1100. As can be seen in FIG. 32, a boot assembly 1410 is coaxially received on the mounting flange 1124 and is coupled thereto by a conventional adjustable strap clamp 1412. In one embodiment, the boot assembly 1410 is fabricated from material that is electrically compatible with the material from which the entry plate 1120 and mounting flange 1124 are fabricated. In one embodiment, for example, the boot assembly 1410 may be fabricated from a highly electrically conductive material that is molded or otherwise formed from a flexible material such as silicone, neoprene or other synthetic flexible material with electrically conductive particles dispersed throughout interstices in the material. Such electrically conductive particles are electrically compatible with the material from which the mounting flange 1124 or other components mating therewith are fabricated from. Such particles make the boot assembly electrically conductive. One preferred boot assembly is manufactured by Pioneer Energy Products LLC (PEPRO) having an address of P.O. Box 1061, Franklin, Pa. 16323.

Also in this embodiment, a first retainer shield or donut 1420 is supported within the interior of the boot assembly 1410. Such first retainer shield 1420 has a hole 1422 therethrough sized to receive a portion of the cable 380 therethrough. As can be seen in FIG. 32, a portion of the cable sheath 388 is removed to permit the outer shield conductor 386 to be in contact with the first retainer shield 1420. To facilitate easy installation of the first retainer shield 1420 onto the outer shield conductor 386 of the cable, a slit (not shown) may be provided through the first retainer shield 1420 to enable it to flex open slightly during installation.

In one embodiment, the first retainer shield 1420 may be fabricated from the same material from which the boot assembly 1410 is fabricated from. Those of ordinary skill in the art will appreciate that the first retainer shield 1420 may be compatible with copper and with the boot assembly 1410 which may be compatible with aluminum. Such elements may be fabricated from appropriate types of metal filings embedded in a silicone core. To prevent the metal filings from possibly deteriorating, it may be desirable for them to be compatible with each other.

As can be seen in FIG. 32, different areas of compatibility may be provided between the various elements of the entry port 1400. For example, a first annular area of compatibility 1411 may be provided between the entry plate 1120 and the exterior wall 1102. A second annular compatibility area 1413 may be provided between the mounting flange 1124 and the boot assembly 1410. In addition, a third annular compatibility area 1415 may be provided between the exterior of the first retainer shield 1420 and a portion of the boot assembly 1410. The first retainer shield 1420 may also define a fourth annular compatibility area 1417 between the first retainer shield 1420 and the exposed outer shield conductor 386 of the cable 380.

Also in this embodiment, a second retainer donut or shield 1430 may be employed and positioned within the boot assembly 1410 adjacent to the first retainer shield 1420. The second retainer shield 1430 has a hole 1432 therethrough that is sized to receive the cable 380 therein such that the exterior sheath 388 of the cable 380 sealingly contacts the second retainer shield 1430. In one embodiment, the second retainer shield 1430 is fabricated from silicone which serves to substantially weatherproof the penetration into the enclosure.

To facilitate easy installation of the second retainer shield 1430 onto the cable 380, a slit (not shown) may be provided in the second retainer shield 1430 to enable it to flex open during installation. In another embodiment, the installer may create a small slit (not shown) in the boot assembly 1410 to permit a portion of the outer perimeter of the boot assembly 1410 to be peeled apart and flexed to a position wherein the first and second retainer shields 1420, 1430 may be seated therein. In both embodiments, a pair of adjustable strap clamps 1414 may be used to clamp the boot assembly 1410 and the first and second retainer shields 1420, 1430 to the cable 380.

In other embodiments, the second retainer shield 1430 may be substituted with another first retainer shield 1420 to increase conductivity and EMI & RFI to a higher level. The outermost first retainer shield 1420 would perform the weatherproofing function of the second retainer shield 1430 employed in the embodiment described above.

In one embodiment of the present invention, if desired to further enhance the effectiveness of the entry port 1400, a plurality of auxiliary shield straps 1440 may be affixed to the entry port assembly 1400 to enhance its shielding capabilities. In one embodiment, the shield straps 1440 may be fabricated from electrically conductive silver plated copper mesh or tinned braided copper or similar material. In one embodiment, the shield straps 1440 are attached to the entry plate 1120 by the mounting fasteners 1128 as shown in FIGS. 31 and 32. In other embodiments, separate fasteners may be employed to affix the ends of the shield straps 1440 to the entry plate 1120. The other end of each of the shield straps 1440 may be clamped to the outer shield conductor 386 of the cable 380 with a conventional adjustable conduit clamp 1444 as shown in FIGS. 31 and 32. In alternate embodiments, an auxiliary shield 440 as described above may is used in place of shield straps 1440.

As can also be seen in FIGS. 31 and 32, this embodiment employs a grounding strap assembly 1300 that is attached to a bottom portion 1113 of the mounting plate 1105. In one embodiment, to space the grounding strap assembly 1300 from the wall 1102 of the structure 1100, the bottom portion 1113 of the mounting plate 1105 angles outwardly from the wall 1102 as can be seen in FIG. 32.

In this embodiment, the grounding strap assembly 1300 includes at least one metal grounding strap 1302 that is, in one embodiment, approximately $\frac{1}{32}$ inch thick and five inches wide. The grounding strap 1302 may be fabricated from aluminum or copper or other material that is highly electrically conductive and that has a thickness of at least 0.020 inches. In one embodiment, the width "W" of grounding strap is greater than or equal to the circumference "C" of the outer shield conductor 386 of the cable 380. See FIGS. 31 and 33. However, other widths and sizes could conceivably be employed. For example, in an alternative embodiment, two or more grounding straps 1302 could be employed such that the sum of the widths "W" of the grounding straps is substantially greater than or equal to the circumference "C" of the outer shield conductor 386.

As can be seen in FIGS. 31 and 32, one end 1304 of the grounding strap 1302 is attached to the bottom portion 1113 of the mounting plate 1105 by appropriate bolts or screws or other suitable fasteners 1306. The other end 1308 of the grounding strap 1302 is attached to a grounding assembly 1309. In one embodiment, the grounding assembly 1309 comprises a mounting member 1310 that is also attached to the wall 1102 of the structure 110 by appropriate fasteners 1311 and may be configured to space the end 1308 of the grounding strap 1302 from the wall 1102 of the structure 1100 as shown in FIG. 32. The mounting member 1310 may be manufactured from aluminum, copper or other suitable material that is highly electrically conductive. The grounding strap 1302 may be attached to the mounting member 1310 by bolts, screws or other appropriate fasteners 1312. In one embodiment, one or more conventional grounding rods 1320 may be directly attached to the mounting member 1310, by nuts, clamps, etc. or a conventional grounding cable 1314 may be employed to attach the mounting member 1310 to the ground rod(s) 1320 as shown in FIGS. 31 and 32. Thus, the mounting members electrically communicate with the grounding rod(s) 1320. As used herein, the term "electrically communicates" means that electricity may flow from one member (the mounting member) to the other member or members (the grounding rods) either through direct attachment or contact therebetween or by cables, conductors, etc. that are attached to and extend between such members.

The skilled artisan will appreciate that the entry port 1400 of the present invention serves to substantially reduce the amount of RFI/EMI entering into the building 1100 (or other form of enclosure) from the cable 380 by channeling the interference from the cable's outer shield conductor 386 to the first retainer shield 1420, to the boot assembly 1410, to the mounting flange 1124 and the entry plate 1120, into the mounting plate 1105, through the grounding strap 1302, and into the ground 1330 through grounding rod 1320.

Figure 34:
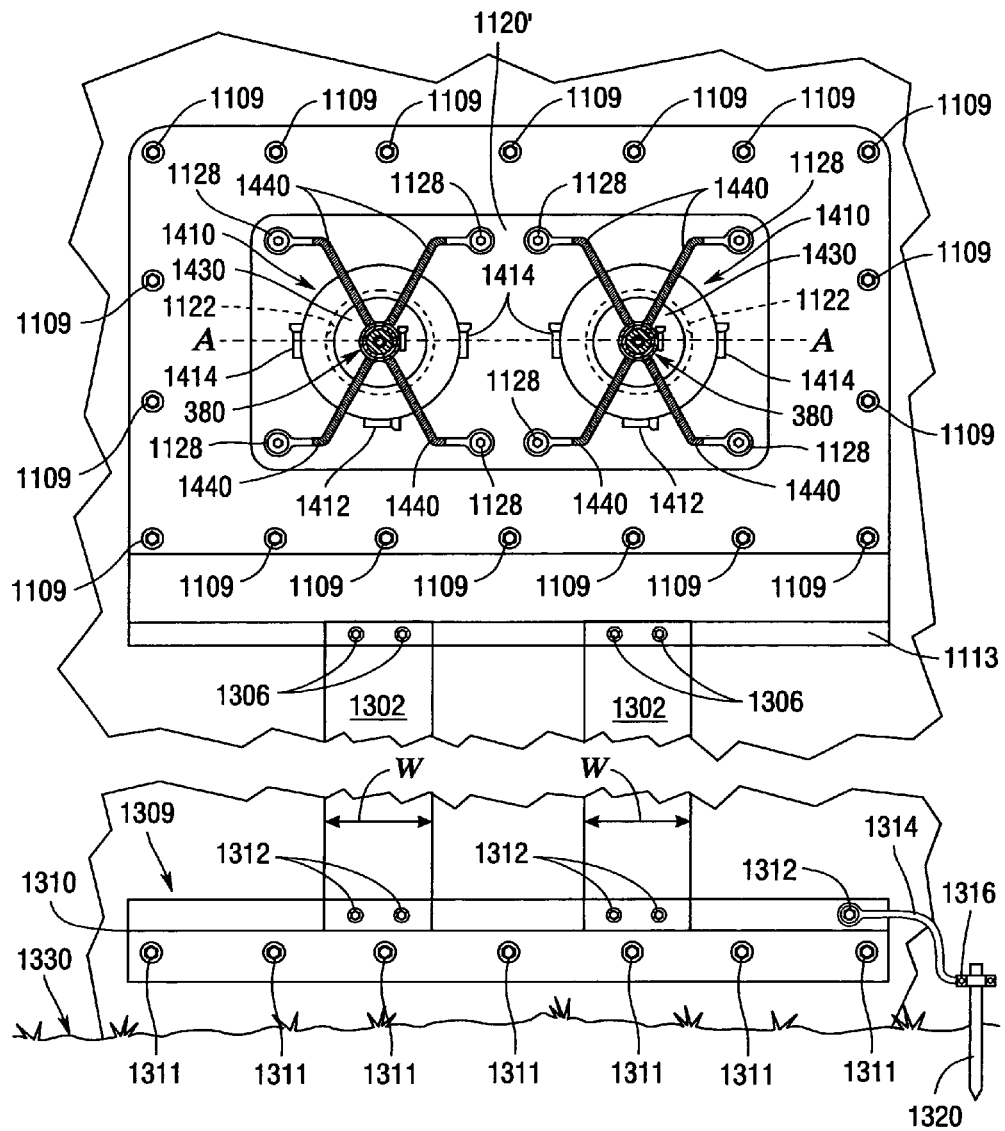
FIG. 34 is a front elevational view of another cable entry port assembly of the present invention attached to a building.
Figure 35:
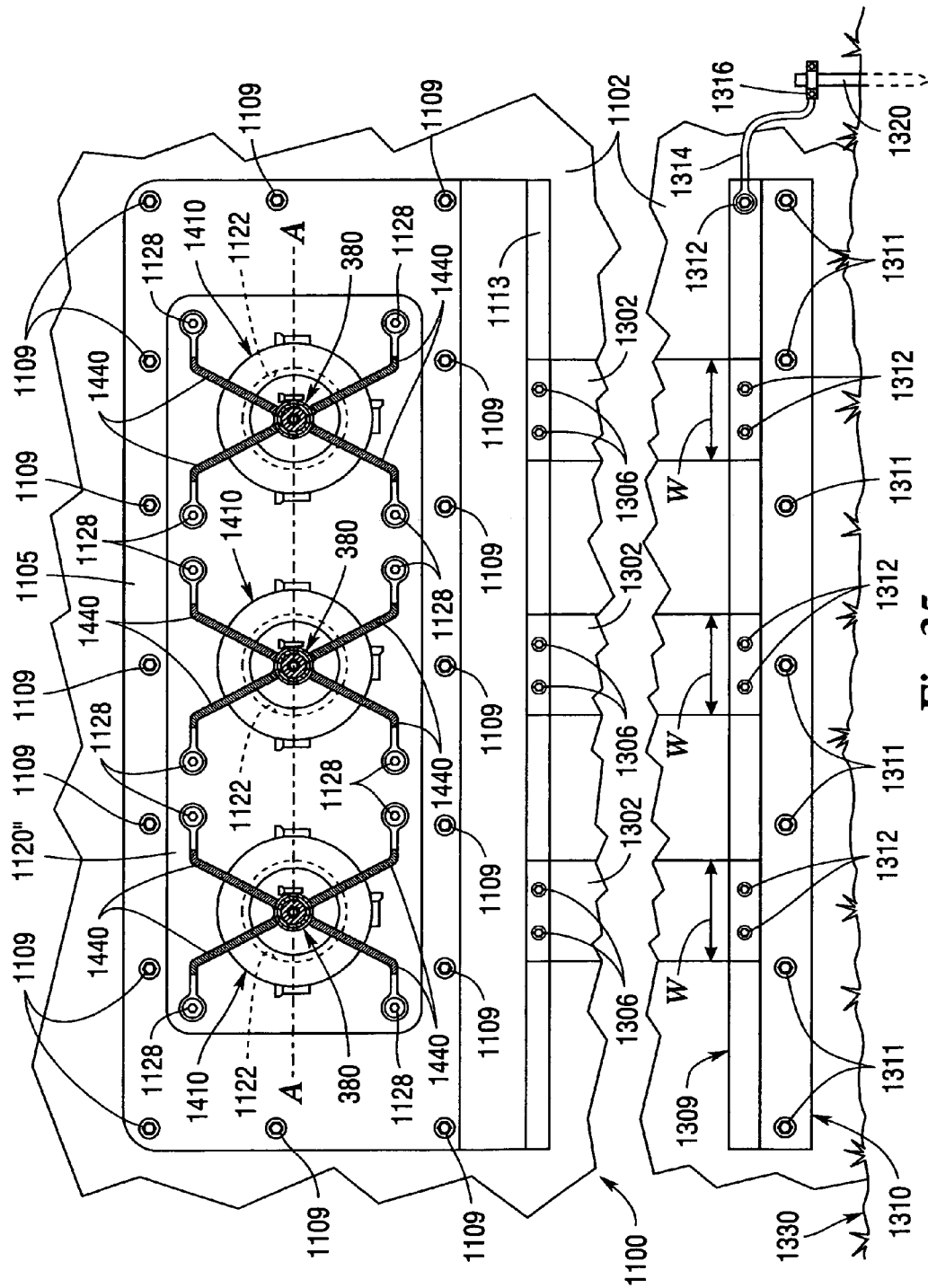
FIG. 35 is a front elevational view of another embodiment of a cable entry port assembly of the present invention.
Figure 36:
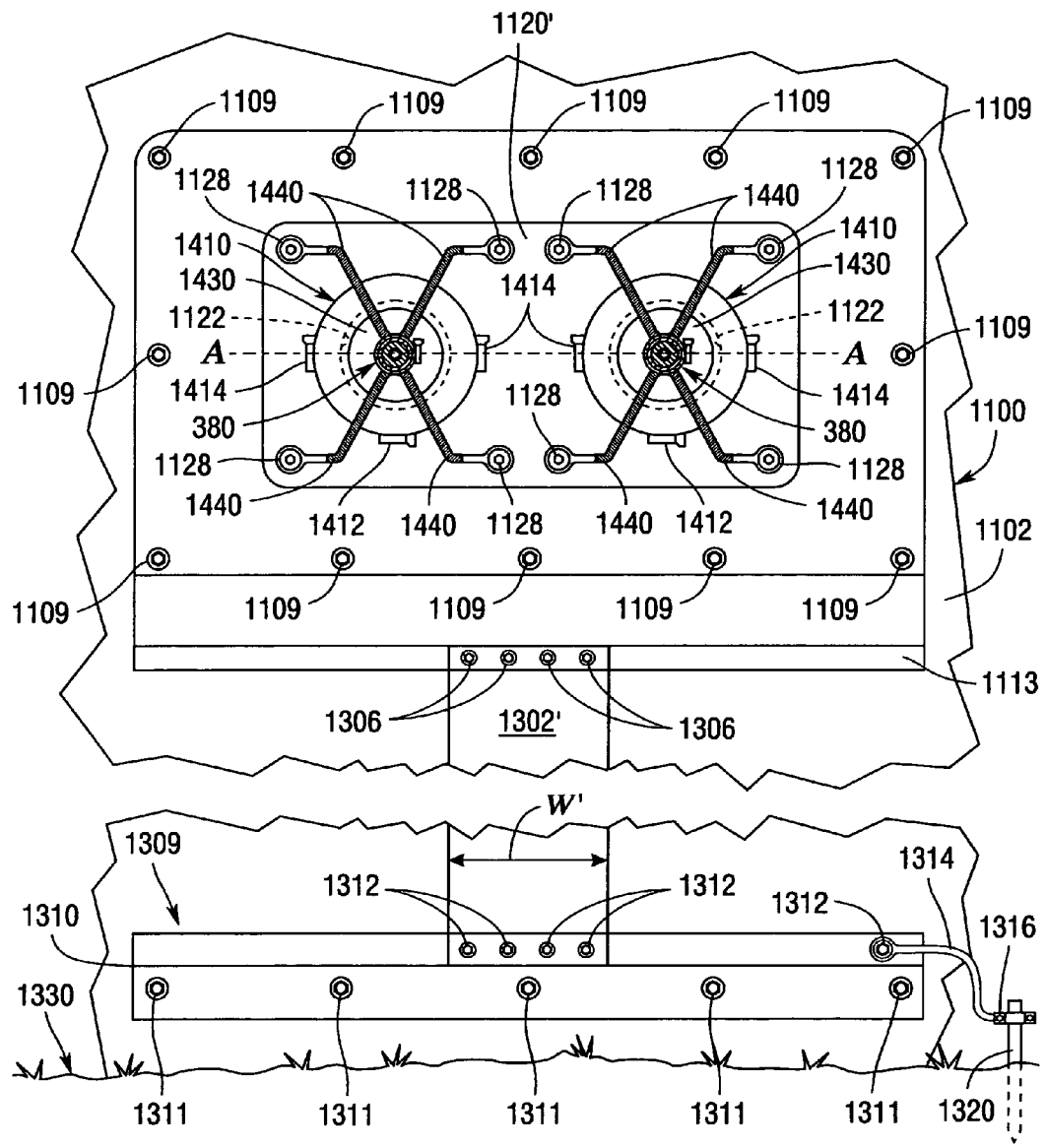
FIG. 36 is a front elevational view of another embodiment of a cable entry port assembly of the present invention.
Figure 37:
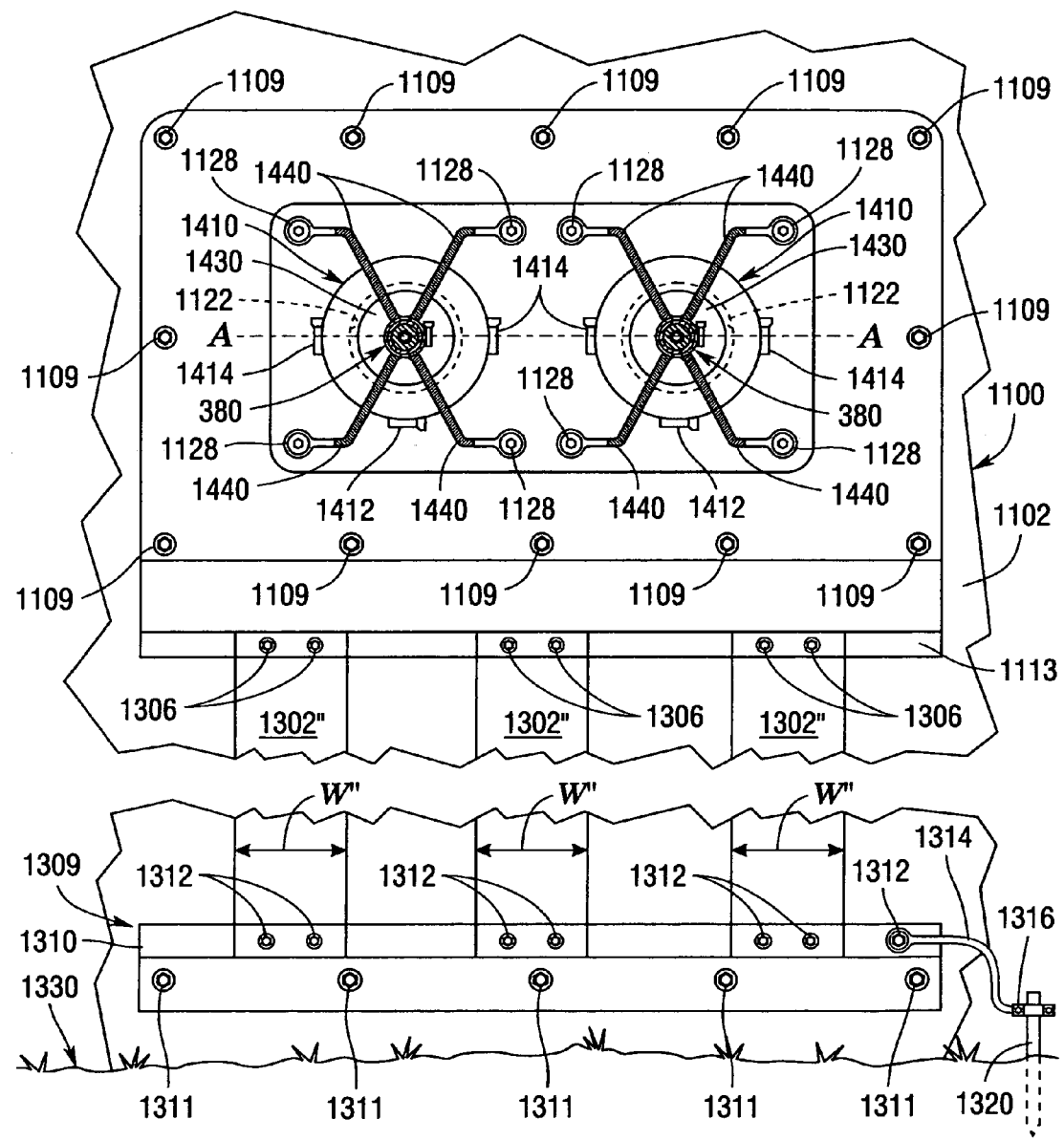
FIG. 37 is a front elevational view of another embodiment of a cable entry port assembly of the present invention.
Figure 38:
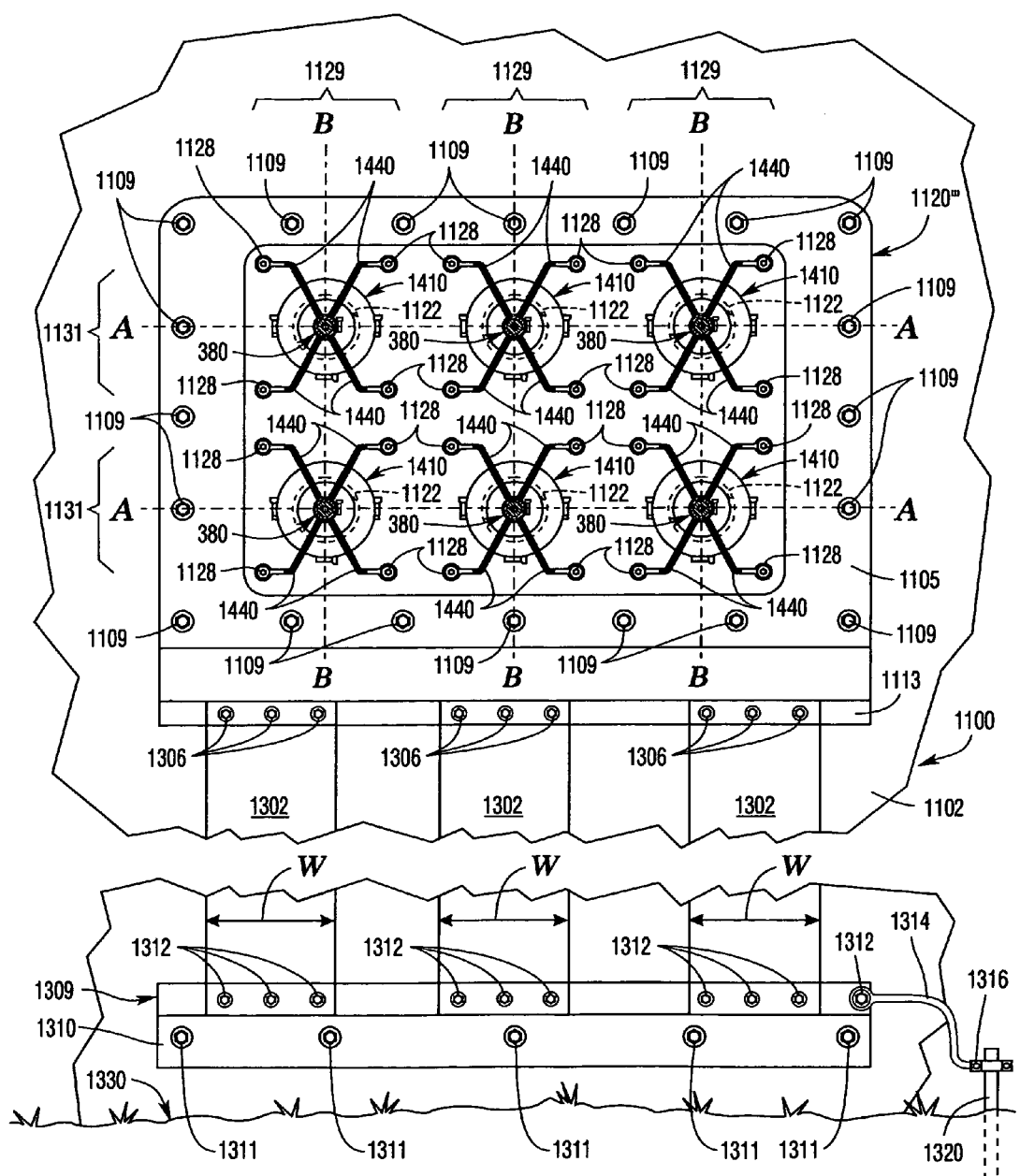
FIG. 38 is a front elevational view of another embodiment of a cable entry port assembly of the present invention.

The reader will appreciate that the cable entry plates of the subject invention may be fabricated to support one or more boot assemblies 1410 of the subject invention. For example, FIG. 34 illustrates an entry plate 1120' that has at least two cable entry holes 1122 therethrough that are substantially aligned along a horizontally extending axis A-A. As can be seen in FIG. 34, a boot assembly 1410 corresponds to each of the cable entry holes 1122. FIG. 35 illustrates an entry plate 1120" that is constructed to support three boot assemblies 1410 substantially aligned along horizontally extending axis A-A. The entry plates of the subject invention may be fabricated to support more than three aligned boot assemblies 1410 along horizontally extending axis A-A. In addition, the cable entry holes 1122 and corresponding boot assemblies 1410 do not necessarily have to be aligned on a common horizontal axis. They can be oriented in a variety of different orientations relative to each other without departing from the spirit and scope of the present invention.

In alternative embodiments, a plurality of grounding strap assemblies 1300 may be replaced by a single grounding strap that has a width that is approximately greater than or equal to the sum of the widths of the individual grounding straps normally employed. For example, each of the grounding straps 1302 depicted in FIG. 35 has a width "W". They could be replaced with a single grounding strap 1302' that has a width W' that is greater than or equal to two times "W" (W'≧(W+W)—see FIG. 36) or they could be replaced by more than two grounding straps 1302", with the sum of their widths W" being greater than or equal to two times W ((W"+W"+W")≧(W+W)—see FIG. 37) with out adversely affecting the entry port's grounding ability.

Figure 32A:
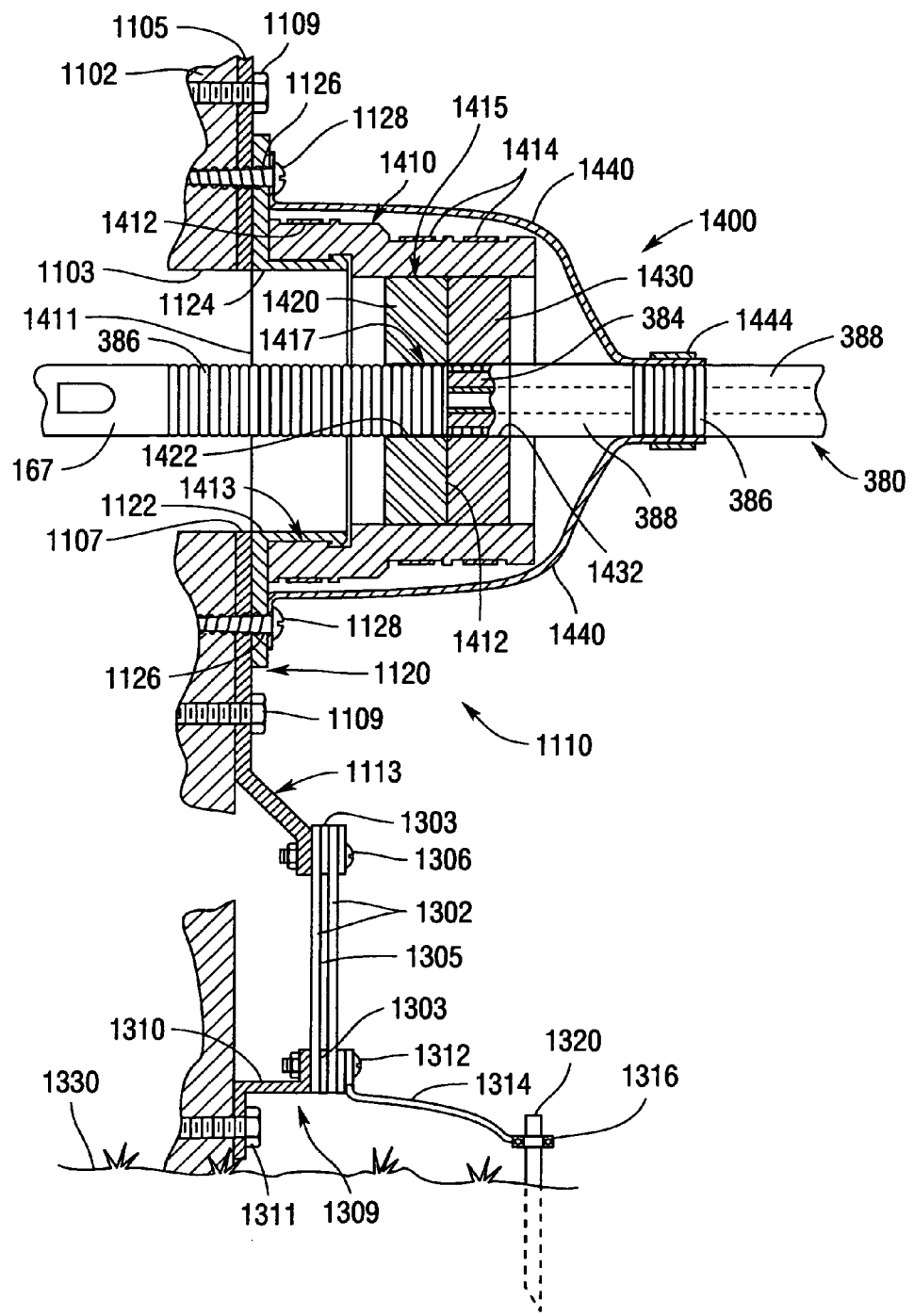
FIG. 32A is a partial cross-sectional view of another cable entry port assembly of the subject invention.
Figure 39:
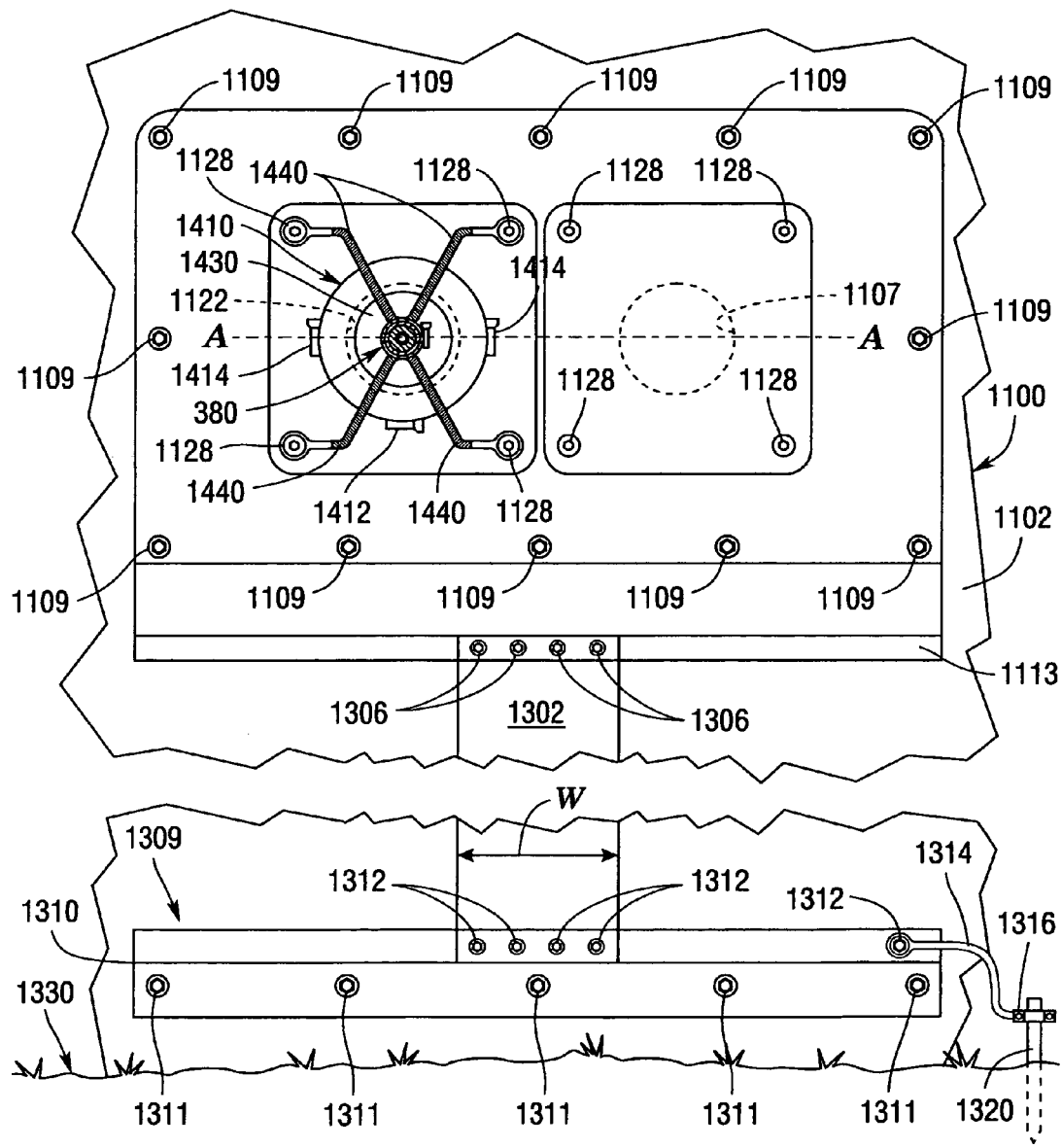
FIG. 39 is a front elevational view of another embodiment of a cable entry port assembly of the present invention.

In yet another alternative embodiment, an entry plate 1120''' may be provided with two or more cable entry holes 1122 that are substantially aligned along a vertically extending axis B-B to form a column 1129 of aligned cable entry holes and corresponding boot assemblies 1410. For example, FIG. 39 illustrates a collection of three columns 1129 of boot assemblies 1410 and two rows 1131 of boot assemblies 1410. In one preferred variation of this embodiment, the width W of one of the grounding straps 1302 located below two vertically aligned boot assemblies 1410 in a single column 1129 is greater than or equal to the sum of the circumferences C of each of the cables 380 supported by those two boot assemblies 1410. Thus, if the outer shield conductors 386 of the cables 380 supported by the two vertically aligned boot assemblies 1410 have the same circumference then, in this embodiment, W≧2C. However, other grounding strap arrangements and/or grounding cables could be employed without departing from the spirit or scope of the present invention. For example, in an application wherein three grounding straps 1302 are employed, those groundings straps 1302 may be oriented in a stacked fashion as shown in FIG. 32A. As can be seen in that Figure, the grounding straps 1302 may be separated from each other by electrically conductive spacers 1303 which serve to provide an air space 1305 between the grounding straps 1302. In one embodiment, the spacers 1303 comprise pieces of aluminum material. However, other electrically conductive materials could also be used.

FIG. 39 illustrates the use of a mounting plate 1105 that is capable of supporting two port assemblies 1400; however only one port assembly 1400 is employed. Thus, a cover plate 1490 is placed over the hole 1107 in the mounting plate (and the cable entry holes 1103 in the wall 1102) and may be retained in position by mounting fasteners 1128. When it becomes necessary to install another port assembly 1400, the mounting fasteners 1128 are removed to permit the cover plate 1490 to be replaced with a second port assembly 1400.

Figure 40:
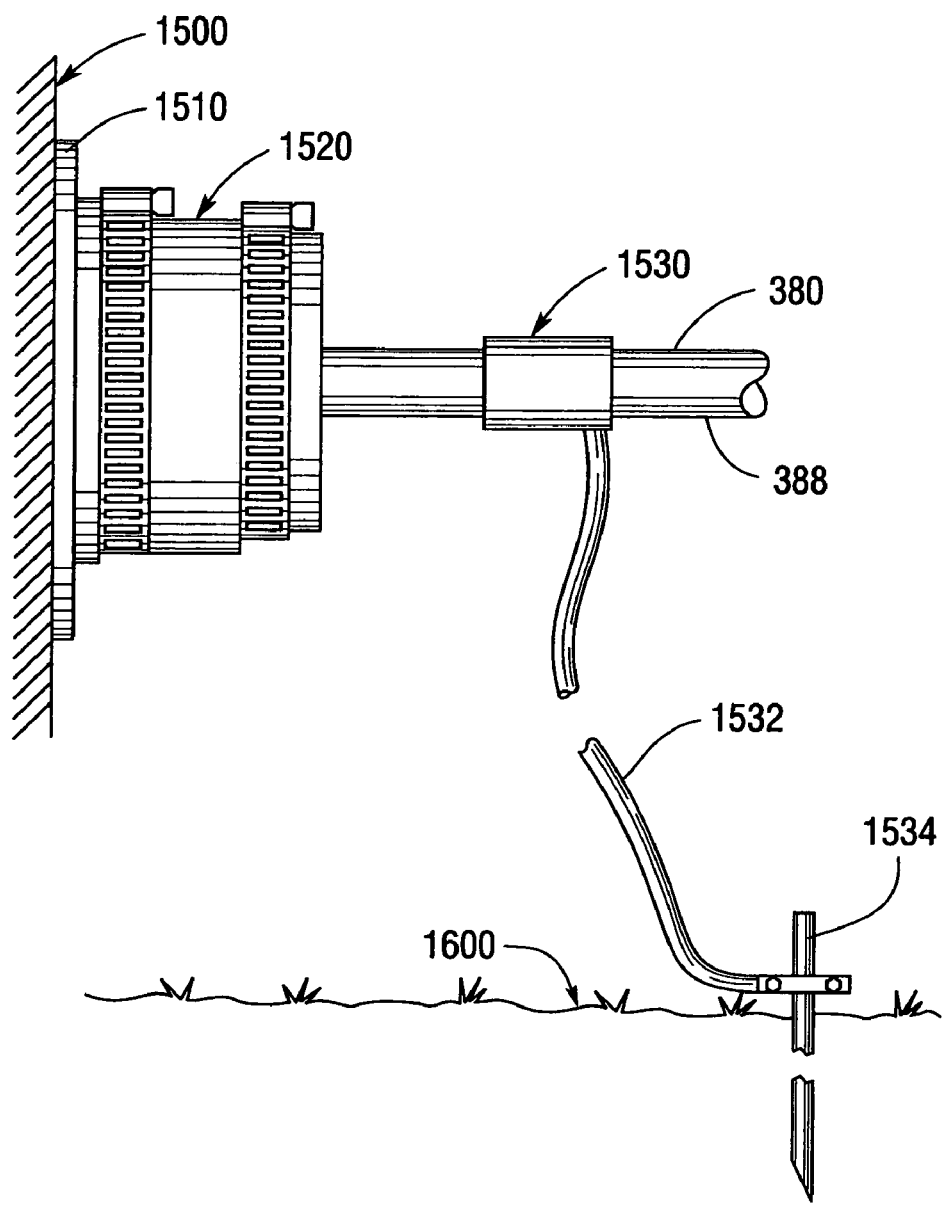
FIG. 40 is a partial side elevational view showing a prior art boot assembly attached to a building.

As reflected by tests conducted by an independent laboratory, the cable entry port assembly embodiments of the present invention represent a vast improvement over prior grounding assemblies and methods. For example, one method employed in the past involved passing the power cable 380 through a mounting plate 1510 attached to a building 1500 or other structure and is depicted in FIG. 40. In this arrangement, the cable 380 extends through a conventional weatherproof entry boot 1520 that is commonly made from EDPM rubber. The entry boot 1510 simply acts as a seal between the cable 380 and the mounting plate 1510. In an effort to provide a means for permitting some of the electrical current on the cable 380 resulting from an adjacent lighting strike to flow to ground 1600, a grounding clamp arrangement 1530 was used. To attach the grounding clamp 1530 to the cable 380, the exterior insulation sheath 388 is removed from a portion of the power cable 380 to enable the grounding clamp 1530 to be directly clamped to the outer shield conductor (not shown) of cable 380. Attached to the grounding clamp 1530 is a grounding cable 1532 that is attached to a grounding rod 1534.

Based on tests conducted by an independent laboratory, the features of the various embodiments of the present invention resulted in a vast improvement in the reduction of extraneous current (from lightning strikes, etc.) from passing into the building or structure on the cable 380 when compared to prior entry ports and grounding systems. For example, tests of three mockups simulating prior art arrangements similar to the arrangement depicted in FIG. 40 revealed that the ratio of the amount of current let through into the building over the amount of current diverted to ground was 0.49 for one arrangement, 0.43 for another arrangement and 0.42 for the other arrangement. Thus, the first arrangement let through almost one half (forty-nine percent) of the current. The second arrangement let through 43 percent of the current and the last arrangement let through forty-two percent of the applied current. However, when the independent laboratory tested three mocked-up embodiments of the subject invention simulating variations in the embodiment depicted in FIG. 34, the ratios of the amount of current let through over the amount of current diverted to ground was 0.29, 0.28, 0.28. Thus, this embodiment of the present invention represented a significant improvement over the prior grounding methods. When the independent laboratory tested a mockup simulating the embodiment of the invention depicted in FIGS. 31 and 32, the ratio of current let through to the amount diverted was only 0.13.

Still other tests of various embodiments of the entry ports of the present invention revealed that these embodiments resulted in a vast reduction of RF interference known as Passive Intermodulation ("PIM") which is often experienced in applications wherein several antennas are situated in close proximity to each other. In particular, such interference is caused when the RF from one or more antennas travels on the cable or cables that are attached to other antennas. Such tests revealed that various embodiments of the entry ports of the present invention caused a reduction of at least 70 db in such RF interference. Thus, the various embodiments of the entry ports of the subject invention represent vast improvements over prior art entry port arrangements and grounding systems.

Accordingly, the present invention provides solutions to the aforementioned problems associated with protecting electrical components from damage caused by lightning strikes or externally generated magnetic field EMI and RFI resulting from adjacent equipment or sabotage. The present invention also provides a means for protecting a plurality of electrical components located at a remote site from lightning damage, corrosion, insect and vermin damage, etc. It will be understood, however, that various changes in the details, materials and arrangements of parts which have been herein described and illustrated in order to explain the nature of the invention may be made by those skilled in the art within the principle and scope of the invention as expressed in the appended claims.

Whereas particular embodiments of the invention have been described herein for the purpose of illustrating the invention and not for the purpose of limiting the same, it will be appreciated by those of ordinary skill in the art that numerous variations of the details, materials and arrangement of parts may be made within the principle and scope of the invention without departing from the spirit invention. The preceding description, therefore, is not meant to limit the scope of the invention. Rather the scope of the invention is to be determined only by the appended claims and their equivalents.

What is claimed is:

1. An entry port for a supporting a cable having an outer shield conductor covered by a sheath, comprising:
   an attachment flange;
   an electrically conductive boot assembly coupled to said attachment flange;
   a first electrically conductive retainer shield supported within said boot assembly to contact an exposed portion of the outer shield conductor of the cable; and
   a second electrically conductive retainer shield supported within said boot assembly, said second retainer shield establishing a seal with a portion of the cable sheath.

2. The entry port of claim 1 wherein said electrically conductive boot assembly is fabricated from an electrically conductive material and wherein said first electrically conductive retainer shield is fabricated from said electrically conductive material.

3. The entry port of claim 2 wherein said attachment flange is fabricated from a metal and wherein said electrically conductive material is fabricated from non-metal material having filings of said metal embedded therein.

4. The entry port of claim 3 wherein said metal comprises aluminum.

5. The entry port of claim 1 wherein said boot assembly is removably coupled to said attachment flange.

6. The entry port of claim 5 wherein the boot assembly is removably clamped to said attachment flange.

7. The entry port of claim 1 wherein said second retainer shield is fabricated from a second material that differs from a first material from which said first retainer shield is fabricated from.

8. The entry port of claim 1 wherein said first and second retainer shields are removably retained within said boot assembly.

9. The entry port of claim 8 wherein said first and second retainer shields are retained within said boot assembly by at least one clamp.

10. The entry port of claim 1 further comprising an auxiliary shield member attached to said attachment flange and a portion of the outer shield conductor of the cable external to said boot assembly.

11. The entry port of claim 10 wherein said auxiliary shield member is flexible and extends around a perimeter of said attachment flange and a perimeter of the outer shield conductor of the cable external to said boot assembly.

12. The entry port of claim 1 wherein said attachment flange protrudes from an entry plate and wherein said entry port further comprises at least one shield strap attached to another exposed portion of the outer shield conductor of the cable and said entry plate.

13. The entry port of claim 1 wherein said attachment flange is fabricated from a material that comprises a wall to which said attachment flange is to be attached.

14. The entry port of claim 13 further comprising:
    a first annular compatibility area between said attachment flange and said wall to which said attachment flange is to be attached;
    a second annular compatibility area between said attachment flange and said boot assembly; and
    a third annular compatibility area between said first retainer shield and said boot assembly.

15. The entry port of claim 14 further comprising a fourth annular area of compatibility between said first retainer shield and a portion of said cable.

16. An entry port for a supporting a cable through a wall, the cable having an outer shield conductor fabricated from a core material and being covered by a sheath, the entry port comprising:
    an attachment flange for attachment to the wall and being fabricated from a first material that comprises the wall;
    an electrically conductive boot assembly fabricated from a second non-metal material having portions of said first material embedded therein and removably affixed to said attachment flange;
    a first annular retainer shield fabricated from said second material having portions of the core material therein and being retained within said boot assembly to contact an exposed portion of the outer shield conductor of the cable; and
    a second annular retainer shield fabricated from said second material and being supported within said boot assembly to sealingly contact a portion of the sheath of the cable; and
    at least one clamp member extending around the perimeter of said boot assembly for clampingly retaining said first and second retainer shields within said boot assembly.

17. A method for reducing an amount of interference traveling on a cable from one component located outside of a structure to another component located within the structure, wherein the cable has an outer shield conductor covered by a sheath, said method comprising:
    forming a cable-receiving opening in an exterior wall of the structure;
    affixing an attachment flange to the exterior wall portion in registration with the cable-receiving opening therein;
    affixing a conductive boot assembly to the attachment flange, the conductive boot assembly containing an electrically conductive first retainer shield therein;
    removing a portion of the cable sheath to expose a portion of the outer shield conductor of the cable;
    passing the cable through the conductive boot assembly, attachment flange and cable receiving opening, such that the first retainer shield contacts exposed portion of the outer shield conductor of the cable; and
    grounding the attachment flange.

* * * * *